(12) United States Patent
Mauck et al.

(10) Patent No.: US 9,604,245 B2
(45) Date of Patent: Mar. 28, 2017

(54) GAS ENCLOSURE SYSTEMS AND METHODS UTILIZING AN AUXILIARY ENCLOSURE

(71) Applicant: Kateeva, Inc., Menlo Park, CA (US)

(72) Inventors: Justin Mauck, Belmont, CA (US); Alexander Sou-Kang Ko, Santa Clara, CA (US); Eliyahu Vronsky, Los Altos, CA (US); Shandon Alderson, San Carlos, CA (US)

(73) Assignee: Kateeva, Inc., Newark, CA (US)

(*) Notice: Subject to any disclaimer, the term of this patent is extended or adjusted under 35 U.S.C. 154(b) by 316 days.

(21) Appl. No.: 14/205,340

(22) Filed: Mar. 11, 2014

(65) Prior Publication Data
US 2014/0311405 A1   Oct. 23, 2014

Related U.S. Application Data

(63) Continuation-in-part of application No. 13/802,304, filed on Mar. 13, 2013, now Pat. No. 9,048,344, (Continued)

(51) Int. Cl.
*B05C 13/02* (2006.01)
*C23C 14/00* (2006.01)
(Continued)

(52) U.S. Cl.
CPC ............ *B05C 15/00* (2013.01); *B23P 6/00* (2013.01); *F24F 3/1607* (2013.01); *H01L 21/6719* (2013.01); *Y10T 29/49721* (2015.01)

(58) Field of Classification Search
USPC .............. 118/50, 300, 313–315, 305; 427/66
See application file for complete search history.

(56) References Cited

U.S. PATENT DOCUMENTS

| | | | |
|---|---|---|---|
| 3,216,858 A | 11/1965 | Bogdanowski | |
| 3,498,343 A | 3/1970 | Sperberg | |

(Continued)

FOREIGN PATENT DOCUMENTS

| | | |
|---|---|---|
| CN | 1445089 | 10/2003 |
| CN | 101088141 | 12/2007 |

(Continued)

OTHER PUBLICATIONS

Non-Final Office Action issued on Apr. 28, 2014 to U.S. Appl. No. 13/720,830, filed Dec. 19, 2012.
(Continued)

*Primary Examiner* — Yewebdar Tadesse

(57) ABSTRACT

The present teachings disclose various embodiments of a gas enclosure system can have a gas enclosure that can include a printing system enclosure and an auxiliary enclosure. In various embodiments of a gas enclosure system of the present teachings, a printing system enclosure can be isolated from an auxiliary enclosure. Various systems and methods of the present teachings can provide for the ongoing management of a printing system by utilizing various embodiments of isolatable enclosures. For example, various measurement and maintenance process steps for the management of a printhead assembly can be performed in an auxiliary enclosure, which can be isolated from a printing system enclosure of a gas enclosure system, thereby preventing or minimizing interruption of a printing process.

21 Claims, 45 Drawing Sheets

Related U.S. Application Data which is a continuation-in-part of application No. 13/720,830, filed on Dec. 19, 2012, now Pat. No. 8,899,171, and a continuation-in-part of application No. 12/652,040, filed on Jan. 5, 2010, now Pat. No. 8,383,202, which is a continuation-in-part of application No. 12/139,391, filed on Jun. 13, 2008, now abandoned.

(60) Provisional application No. 61/579,233, filed on Dec. 22, 2011, provisional application No. 61/142,575, filed on Jan. 5, 2009.

(51) Int. Cl.
  *B05C 15/00*     (2006.01)
  *B23P 6/00*      (2006.01)
  *F24F 3/16*      (2006.01)
  *H01L 21/67*     (2006.01)

(56) References Cited

U.S. PATENT DOCUMENTS

| | | | |
|---|---|---|---|
| 3,670,466 A | 6/1972 | Lynch | |
| 3,885,362 A | 5/1975 | Pollock | |
| 4,226,897 A | 10/1980 | Coleman | |
| 4,238,807 A | 12/1980 | Bovio et al. | |
| 4,581,478 A | 4/1986 | Pugh et al. | |
| 4,751,531 A | 6/1988 | Saito et al. | |
| 5,029,518 A | 7/1991 | Austin | |
| 5,041,161 A | 8/1991 | Cooke et al. | |
| 5,065,169 A | 11/1991 | Vincent et al. | |
| 5,116,148 A | 5/1992 | Ohara et al. | |
| 5,155,502 A | 10/1992 | Kimura et al. | |
| 5,172,139 A | 12/1992 | Sekiya et al. | |
| 5,202,659 A | 4/1993 | DeBonte et al. | |
| 5,247,190 A | 9/1993 | Friend et al. | |
| 5,314,377 A | 5/1994 | Pelosi, III | |
| 5,344,365 A | 9/1994 | Scott et al. | |
| 5,405,710 A | 4/1995 | Dodabalapur et al. | |
| 5,574,485 A | 11/1996 | Anderson et al. | |
| 5,623,292 A | 4/1997 | Shrivasta | |
| 5,703,436 A | 12/1997 | Forrest et al. | |
| 5,707,745 A | 1/1998 | Forrest et al. | |
| 5,731,828 A | 3/1998 | Ishinaga et al. | |
| 5,781,210 A | 7/1998 | Hirano et al. | |
| 5,801,721 A | 9/1998 | Gandy et al. | |
| 5,834,893 A | 11/1998 | Bulovic et al. | |
| 5,844,363 A | 12/1998 | Gu et al. | |
| 5,865,860 A | 2/1999 | Delnick | |
| 5,896,154 A | 4/1999 | Mitani et al. | |
| 5,947,022 A | 9/1999 | Freeman et al. | |
| 5,956,051 A | 9/1999 | Davies et al. | |
| 6,013,982 A | 1/2000 | Thompson et al. | |
| 6,023,899 A | 2/2000 | Mecozzi | |
| 6,049,167 A | 4/2000 | Onitsuka et al. | |
| 6,065,825 A | 5/2000 | Anagnostopoulos et al. | |
| 6,086,195 A | 7/2000 | Bohorquez et al. | |
| 6,086,196 A | 7/2000 | Ando et al. | |
| 6,086,679 A | 7/2000 | Lee et al. | |
| 6,087,196 A | 7/2000 | Sturm et al. | |
| 6,089,282 A | 7/2000 | Spiegelmann et al. | |
| 6,091,195 A | 7/2000 | Forrest et al. | |
| 6,095,630 A | 8/2000 | Horii et al. | |
| 6,097,147 A | 8/2000 | Baldo et al. | |
| 6,189,989 B1 | 2/2001 | Hirabayashi et al. | |
| 6,250,747 B1 | 6/2001 | Hauck | |
| 6,257,706 B1 | 7/2001 | Ahn | |
| 6,294,398 B1 | 9/2001 | Kim et al. | |
| 6,303,238 B1 | 10/2001 | Thompson et al. | |
| 6,312,083 B1 | 11/2001 | Moore | |
| 6,326,224 B1 | 12/2001 | Xu et al. | |
| 6,337,102 B1 | 1/2002 | Forrest et al. | |
| 6,375,304 B1 | 4/2002 | Aldrich et al. | |
| 6,431,702 B2 | 8/2002 | Ruhe | |
| 6,437,351 B1 | 8/2002 | Smick et al. | |
| 6,444,400 B1 | 9/2002 | Cloots et al. | |
| 6,453,810 B1 | 9/2002 | Rossmeisl et al. | |
| 6,460,972 B1 | 10/2002 | Trauernicht et al. | |
| 6,468,819 B1 | 10/2002 | Kim et al. | |
| 6,472,962 B1 | 10/2002 | Guo et al. | |
| 6,498,802 B1 | 12/2002 | Chu et al. | |
| 6,513,903 B2 | 2/2003 | Sharma et al. | |
| 6,548,956 B2 | 4/2003 | Forrest et al. | |
| 6,562,405 B2 | 5/2003 | Eser et al. | |
| 6,576,134 B1 | 6/2003 | Agner | |
| 6,586,763 B2 | 7/2003 | Marks et al. | |
| 6,601,936 B2 | 8/2003 | McDonald | |
| 6,666,548 B1 | 12/2003 | Sadasivan et al. | |
| 6,811,896 B2 | 11/2004 | Aziz et al. | |
| 6,824,262 B2 | 11/2004 | Kubota et al. | |
| 6,861,800 B2 | 3/2005 | Tyan et al. | |
| 6,896,346 B2 | 5/2005 | Trauernicht et al. | |
| 6,911,671 B2 | 6/2005 | Marcus et al. | |
| 6,917,159 B2 | 7/2005 | Tyan et al. | |
| 6,939,212 B1 | 9/2005 | Pham | |
| 6,982,005 B2 | 1/2006 | Eser et al. | |
| 7,023,013 B2 | 4/2006 | Ricks et al. | |
| 7,077,513 B2 | 7/2006 | Kimura et al. | |
| 7,247,394 B2 | 7/2007 | Hatwar et al. | |
| 7,258,768 B2 | 8/2007 | Yamazaki | |
| 7,326,300 B2 | 2/2008 | Sun et al. | |
| 7,374,984 B2 | 5/2008 | Hoffman | |
| 7,377,616 B2 | 5/2008 | Sakurai | |
| 7,404,862 B2 | 7/2008 | Shtein et al. | |
| 7,406,761 B2 | 8/2008 | Jafri et al. | |
| 7,410,240 B2 | 8/2008 | Kadomatsu et al. | |
| 7,431,435 B2 | 10/2008 | Lopez et al. | |
| 7,431,968 B1 | 10/2008 | Shtein et al. | |
| 7,530,778 B2 | 5/2009 | Yassour et al. | |
| 7,603,028 B2 | 10/2009 | Yassour et al. | |
| 7,604,439 B2 | 10/2009 | Yassour et al. | |
| 7,648,230 B2 | 1/2010 | Kachi | |
| 7,677,690 B2 | 3/2010 | Takatsuka | |
| 7,703,911 B2 | 4/2010 | Chung et al. | |
| 7,802,537 B2 | 9/2010 | Kang et al. | |
| 7,857,121 B2 | 12/2010 | Yassour | |
| 7,883,832 B2 | 2/2011 | Colburn et al. | |
| 7,908,885 B2 | 3/2011 | Devitt | |
| 8,128,753 B2 | 3/2012 | Bulovic et al. | |
| 8,383,202 B2 | 2/2013 | Somekh et al. | |
| 8,414,688 B1 | 4/2013 | Delgado et al. | |
| 8,720,366 B2 | 5/2014 | Somekh et al. | |
| 8,802,186 B2 | 8/2014 | Somekh et al. | |
| 8,899,171 B2 * | 12/2014 | Mauck | B41J 29/393 118/300 |
| 2001/0045973 A1 | 11/2001 | Sharma et al. | |
| 2002/0008732 A1 | 1/2002 | Moon et al. | |
| 2002/0033860 A1 | 3/2002 | Kubota et al. | |
| 2002/0053589 A1 | 5/2002 | Owen et al. | |
| 2002/0079057 A1 | 6/2002 | Yoshioka et al. | |
| 2002/0084464 A1 | 7/2002 | Yamazaki et al. | |
| 2002/0124906 A1 | 9/2002 | Suzuki et al. | |
| 2002/0191063 A1 | 12/2002 | Gelbart et al. | |
| 2003/0000476 A1 | 1/2003 | Matsunaga et al. | |
| 2003/0097929 A1 | 5/2003 | Watanabe et al. | |
| 2003/0175414 A1 | 9/2003 | Hayashi | |
| 2003/0230980 A1 | 12/2003 | Forrest et al. | |
| 2004/0009304 A1 | 1/2004 | Pichler | |
| 2004/0021762 A1 | 2/2004 | Seki et al. | |
| 2004/0048183 A1 | 3/2004 | Teshima | |
| 2004/0050325 A1 | 3/2004 | Samilov et al. | |
| 2004/0054774 A1 | 3/2004 | Barber et al. | |
| 2004/0056244 A1 | 3/2004 | Marcus et al. | |
| 2004/0075112 A1 | 4/2004 | Yamazaki et al. | |
| 2004/0086631 A1 | 5/2004 | Han | |
| 2004/0115339 A1 | 6/2004 | Ito | |
| 2004/0123804 A1 | 7/2004 | Yamakazi et al. | |
| 2004/0202794 A1 | 10/2004 | Yoshida | |
| 2005/0005850 A1 | 1/2005 | Yamazaki | |
| 2005/0062773 A1 | 3/2005 | Fouet | |
| 2005/0140764 A1 | 6/2005 | Chang et al. | |
| 2005/0153468 A1 | 7/2005 | Gupta et al. | |
| 2005/0175861 A1 | 8/2005 | Elschner et al. | |

(56) References Cited

U.S. PATENT DOCUMENTS

| | | |
|---|---|---|
| 2005/0184653 A1 | 8/2005 | Suh et al. |
| 2005/0190220 A1 | 9/2005 | Lim et al. |
| 2005/0223994 A1 | 10/2005 | Blomiley et al. |
| 2005/0255249 A1 | 11/2005 | Schlatterbeck |
| 2006/0008591 A1 | 1/2006 | Sun et al. |
| 2006/0012290 A1 | 1/2006 | Kang |
| 2006/0038852 A1 | 2/2006 | Cornell |
| 2006/0063027 A1 | 3/2006 | Vestweber et al. |
| 2006/0096395 A1 | 5/2006 | Weiss et al. |
| 2006/0099328 A1 | 5/2006 | Waite et al. |
| 2006/0115585 A1 | 6/2006 | Bulovic et al. |
| 2006/0119669 A1 | 6/2006 | Sharma et al. |
| 2006/0219605 A1 | 10/2006 | Devitt |
| 2006/0236938 A1 | 10/2006 | Powell et al. |
| 2007/0026151 A1* | 2/2007 | Higginson ........ H01L 21/67161 427/255.5 |
| 2007/0040877 A1 | 2/2007 | Kachi |
| 2007/0044713 A1 | 3/2007 | Yasui et al. |
| 2007/0058010 A1 | 3/2007 | Nagashima |
| 2007/0098891 A1 | 5/2007 | Tyan et al. |
| 2007/0134512 A1 | 6/2007 | Klubek et al. |
| 2007/0195653 A1 | 8/2007 | Yassour et al. |
| 2007/0234952 A1 | 10/2007 | Kojima |
| 2007/0257033 A1 | 11/2007 | Yamada |
| 2007/0286944 A1 | 12/2007 | Yokoyama et al. |
| 2008/0085652 A1 | 4/2008 | Winters |
| 2008/0174235 A1 | 7/2008 | Kim et al. |
| 2008/0238310 A1 | 10/2008 | Forrest et al. |
| 2008/0241587 A1 | 10/2008 | Ohmi et al. |
| 2008/0259101 A1 | 10/2008 | Kurita et al. |
| 2008/0260938 A1* | 10/2008 | Ikeda ................... C23C 14/042 427/66 |
| 2008/0299311 A1 | 12/2008 | Shtein et al. |
| 2008/0308037 A1 | 12/2008 | Bulovic et al. |
| 2008/0311289 A1 | 12/2008 | Bulovic et al. |
| 2008/0311296 A1 | 12/2008 | Shtein et al. |
| 2008/0311307 A1 | 12/2008 | Bulovic et al. |
| 2009/0031579 A1 | 2/2009 | Piatt et al. |
| 2009/0045739 A1 | 2/2009 | Kho et al. |
| 2009/0058915 A1 | 3/2009 | Hayashi et al. |
| 2009/0078204 A1 | 3/2009 | Kerr et al. |
| 2009/0081885 A1 | 3/2009 | Levy et al. |
| 2009/0115706 A1 | 5/2009 | Hwang et al. |
| 2009/0167162 A1 | 7/2009 | Lin et al. |
| 2009/0220680 A1 | 9/2009 | Winters |
| 2009/0244510 A1 | 10/2009 | Domanowski |
| 2010/0055810 A1 | 3/2010 | Sung et al. |
| 2010/0079513 A1 | 4/2010 | Taira et al. |
| 2010/0171780 A1 | 7/2010 | Madigan et al. |
| 2010/0182359 A1 | 7/2010 | Kim et al. |
| 2010/0188457 A1 | 7/2010 | Madigan et al. |
| 2010/0201749 A1 | 8/2010 | Somekh et al. |
| 2010/0282271 A1 | 11/2010 | Devitt |
| 2010/0310424 A1 | 12/2010 | Rose et al. |
| 2011/0008541 A1 | 1/2011 | Madigan et al. |
| 2011/0043554 A1 | 2/2011 | Silverbrook et al. |
| 2011/0057171 A1 | 3/2011 | Adamovich et al. |
| 2011/0096124 A1 | 4/2011 | North et al. |
| 2011/0181644 A1 | 7/2011 | Bulovic et al. |
| 2011/0267390 A1 | 11/2011 | Bulovic et al. |
| 2011/0293818 A1 | 12/2011 | Madigan et al. |
| 2011/0318503 A1 | 12/2011 | Adams et al. |
| 2012/0056923 A1 | 3/2012 | Vronsky et al. |
| 2012/0089180 A1 | 4/2012 | Fathi et al. |
| 2012/0128890 A1 | 5/2012 | Mirchev |
| 2012/0306951 A1 | 12/2012 | Somekh et al. |
| 2013/0004656 A1 | 1/2013 | Chen et al. |
| 2013/0038649 A1 | 2/2013 | Lowrance et al. |
| 2013/0040061 A1 | 2/2013 | Lowrance et al. |
| 2013/0164438 A1 | 6/2013 | Somekh et al. |
| 2013/0164439 A1 | 6/2013 | Somekh et al. |
| 2013/0206058 A1 | 8/2013 | Mauck et al. |
| 2013/0209669 A1 | 8/2013 | Somekh et al. |
| 2013/0209670 A1 | 8/2013 | Somekh et al. |
| 2013/0209671 A1 | 8/2013 | Somekh et al. |
| 2013/0252533 A1 | 9/2013 | Mauck et al. |
| 2013/0258709 A1 | 10/2013 | Thompson et al. |
| 2013/0307898 A1 | 11/2013 | Somekh et al. |

FOREIGN PATENT DOCUMENTS

| | | |
|---|---|---|
| EP | 1 626 103 | 2/2006 |
| JP | 06-122201 | 5/1994 |
| JP | 08-216401 | 8/1996 |
| JP | 09-248918 | 9/1997 |
| JP | 2002-069650 | 3/2002 |
| JP | 2004-535956 | 12/2004 |
| JP | 2005-286069 | 10/2005 |
| JP | 2006-123551 | 5/2006 |
| JP | 2006-150900 | 6/2006 |
| JP | 2007-076168 | 3/2007 |
| JP | 2007-095343 | 4/2007 |
| JP | 2007-299616 | 11/2007 |
| JP | 2008511146 | 4/2008 |
| JP | 05-255630 | 10/2009 |
| KR | 100232852 | 12/1999 |
| KR | 10-2008-0060111 | 7/2007 |
| TW | 200618308 | 11/2013 |
| WO | WO 01/60623 | 8/2001 |
| WO | WO 2005/090085 | 9/2005 |
| WO | WO 2006/021568 | 3/2006 |
| WO | WO 2012/003440 | 1/2012 |

OTHER PUBLICATIONS

Applicant-Initiated Interview Summary dated Aug. 15, 2013 for U.S. Appl. No. 13/551,209.
Notice of Allowance issued on Feb. 20, 2014, to U.S. Appl. No. 13/551,209.
Notice of Allowance issued on Jun. 30, 2014, to U.S. Appl. No. 13/773,643.
Notice of Allowance issued on Jul. 1, 2014, to U.S. Appl. No. 13/773,649.
Notice of Allowance mailed on Sep. 29, 2014, to U.S. Appl. No. 13/773,654.
Notice of Allowance issued on Jul. 2, 2014, to U.S. Appl. No. 13/774,577.
Non-Final Office Action issued on Oct. 8, 2014 to U.S. Appl. No. 13/571,166.
Applicant-Initiated Interview Summary dated Aug. 20, 2014 for U.S. Appl. No. 13/802,304.
Notice of Allowance issued on Dec. 9, 2014 for U.S. Appl. No. 13/802,304.
International Search Report and Written Opinion issued on Oct. 8, 2015 to PCT Application PCT/US14/037722.
International Search Report and Written Opinion issued on Jan. 17, 2013 to PCT Application PCT/US12/050207.
International Search Report and Written Opinion issued on Mar. 14, 2014, to PCT Application PCT/US13/063128.
International Search Report and Written Opinion issued on Dec. 22, 2014, to PCT Application PCT/US14/023820.
International Search Report and Written Opinion issued on Apr. 17, 2015, to PCT Application PCT/US15/11854.
International Search Report and Written Opinion for PCT Application No. PCT/US15/27835, issued on Aug. 4, 2015.
Notice of Allowance issued on Sep. 9, 2015, to U.S. Appl. No. 13/774,693.
Notice of Allowance issued to U.S. Appl. No. 13/570,154 on Jul. 17, 2015.
Non-Final Office Action issue on Aug. 3, 2015 to U.S. Appl. No. 14/727,602.
Non-Final Office Action issued on Apr. 24, 2013 to U.S. Appl. No. 13/551,209.
Non-Final Office Action issued on Apr. 17, 2015 to U.S. Appl. No. 13/774,693.
Non-Final Office Action issued on Apr. 15, 2015 to U.S. Appl. No. 13/774,601.
Notice of Allowance issued on Oct. 6, 2014 for U.S. Appl. No. 13/720,830.

(56) References Cited

OTHER PUBLICATIONS

Corrected Notice of Allowability issued on Oct. 31, 2014 for U.S. Appl. No. 13/720,830.
Corrected Notice of Allowability issued on Feb. 3, 2015 for U.S. Appl. No. 13/802,304.
Office Action issued to CN Patent Application 201210595672 on Mar. 23, 2015.
Notice of Allowance issued on Mar. 2, 2015 for U.S. Appl. No. 13/571,166.
Chen et al., "Evaporative Deposition of Molecular Organics in Ambient with a Molecular Jet Printer," Digital Fabrication, Sep. 2006, pp. 63-65.
Notice of Allowance issued on Nov. 19, 2015, to U.S. Appl. No. 13/776,602.
Notice of Allowance issued on Dec. 16, 2015, to U.S. Appl. No. 14/727,602.
Non-Final Office Action issued on Nov. 20, 2015, to U.S. Appl. No. 14/637,301.
Second Office Action issued to CN Patent Application 201210596572 on Oct. 8, 2015.
Third Office Action issued to CN Patent Application 201210596572 on Jan. 26, 2016.
Office Action Issued to CN Patent Application 201310704315.X on Aug. 13, 2015.
Office Action issued to Japanese Patent Application No. 2015-544055, on Oct. 26, 2015.
Notification of Provisional Rejection issued on Dec. 9, 2015, for Korean Patent Application No. 10-2015-7014277.
Examination Report issued on Oct. 8, 2015, to TW Patent Application No. 10243142.
Final Office Action mailed on Nov. 8, 2013, for U.S. Appl. No. 13/551,209.
Final Office Action mailed on Jun. 12, 2014, for U.S. Appl. No. 13/773,643.
Final Office Action mailed on Jun. 10, 2014, for U.S. Appl. No. 13/773,649.
Non-Final Office Action mailed on Jul. 1, 2014, for U.S. Appl. No. 13/773,654.
Final Office Action mailed on Jun. 18, 2014, for U.S. Appl. No. 13/774,577.
Applicant-Initiated Interview Summary dated Jun. 30, 2014 for U.S. Appl. No. 13/720,830.
Non-Final Office Action issued on May 16, 2014, to U.S. Appl. No. 13/802,304.
Street et al., "Jet Printing of Active-Matrix TFT Backplanes for Displays and Sensors", IS&T Archiving, Dec. 2005, vol. 20, No. 5, 16 pages.
Chin, Byung Doo, "Effective Hole Transport Layer Structure for Top Emitting Devices Based on Laser Transfer Patterning," Journal of Physics D: Applied Physics, 2007, vol. 40, pp. 5541-5546.
Elwenspoek et al., "Silicon Micromachining," Aug. 2004, Cambridge University, Cambridge, U.K. ISBN 0521607671. [Abstract only].
Forrest, Stephen R., "The Path to Ubiquitous and Low-cost Organic Electronic Appliances on Plastic," Nature, Apr. 29, 2004, vol. 428, 8 pages.
C. Ducso, et al. "Porous Silicon Bulk Micromachining for Thermally Isolated Membrane Formation," Sensors and Actuators A, 1997, vol. 60, pp. 235-239.
C. Tsamis, et al. "Thermal Properties of Suspended Porous Microhotplates for Sensor Applications," Sensor and Actuators B, 2003, vol. 95, pp. 78-82.
J. Lee, et al. "Differential Scanning Calorimeter Based on Suspended Membrane Single Crystal Silicon Microhotplate," Journal of Microelectromechanical Systems, Dec. 2008, vol. 17, No. 6, pp. 1513-1525.
J. C. Belmonte, et al. "High-temperature Low-power Performing Micromachined Suspended Micro-hotplate for Gas Sensing Applications<" Sensors and Actuators B, 2006, vol. 114, pp. 826-835.
G.S. Chung, "Fabrication and Characterization of Micro-heaters with Low-power Consumption using SOI membrane and Trench Structures," Sensors and Actuators A, 2004, vol. 112, pp. 55-60.
Geffroy et al., "Organic Light-emitting Diode (OLED) Technology: Material Devices and Display Technologies," Polymer International, Jun. 2006, vol. 55, pp. 572-582. (Abstract only).
Huang et al., "Reducing Blueshift of Viewing Angle for Top-Emitting Organic Light-Emitting Devices," Dec. 6, 2008, 3 pages.
J. Lee, et al. "Cavity Effects on Light Extraction in Organic Light emitting Devices," Applied Physics Letters, Jan. 24, 2008, vol. 92, No. 3, 5 pages.
Leblanc et al., "Micromachined Printheads for the Evaporative Patterning of Organic Materials and Metals," Journal of Microelectromechanical Systems, Apr. 2007, vol. 16, No. 2, 7 pp. 1-139.
Lindermann et al., "Thermal Bubble Jet Printhead with Integrated Nozzle Plate," NIP20: International Conference on Digital Printing Technologies, Oct. 2004, pp. 834-839.
S.H. Kim et al. "Fabrication and Characterization of co-planar type MEMS Structures on SiO2/sl3n4 Membrane for Gas Sensrors with Dispensing Method Guided by Micromachined Wells," Journal of Electroceramicx, 2006, vol. 17, No. 2-4, pp. 995-998.
Chen, Jianglong, "Novel Patterning Techniques for Manufacturing Organic and Nanostructured Electronics," M.S. Materials Science and Engineering, Massachusetts Institute of Technology, 2003, pp. 1-206.
Chen, Jingkuang et al., "A High-Resolution Silicon Monolithic Nozzle Array for Inkjet Printing," IEEE Transactions on Electron Devices, vol. 44, No. 9, Sep. 1997, pp. 1401-1409.
Chen et al., "Ambient Environment Patterning of Organic Thin Films by a Second Generation Molecular Jet (MoJet) Printer," Progress Report 2006-2007, Oct. 2007, pp. 26-6; 26-7.
International Search Report issued on Dec. 15, 2010 for PCT Application No. PCT/US10/020144.
International Search Report issued on Sep. 2, 2010 for PCT Application No. PCT/US10/033315.
International Search Report and Written Opinion issued on Mar. 24, 2011 for PCT Application No. PCT/US10/058145.
International Preliminary Report on Patentability issued on Dec. 17, 2009 for PCT Application No. PCT/US08/66975.
International Preliminary Report on Patentability issued on Dec. 7, 2009 for PCT Application No. PCT/US08/066991.
International Preliminary Report on Patentability issued on Dec. 17, 2009 for PCT Application No. PCT/US08/67002.
International Search Report and Written Opinion issued on Feb. 26, 2013 for PCT Application No. PCT/US12/70717.
International Search Report and Written Opinion issued on Jun. 18, 2013 for PCT Application No. PCT/US13/031083.
Non-Final Office Action issued on Jun. 14, 2012, to U.S. Appl. No. 12/652,040.
Applicant-Initiated Interview Summary dated Oct. 19, 2012 for U.S. Appl. No. 12/652,040.
Notice of Allowance issued on Dec. 7, 2012 to U.S. Appl. No. 12/652,040.
EP Examination Report dated Jul. 30, 2010 issued to EP Patent Application 08771068.7.
CN Office Action dated Oct. 12, 2010 issued for CN Patent Application 200880020197.8.
CN Second Office Action dated Jun. 22, 2011 issued for CN Patent Application 200880020197.8.
EP Examination Report dated Jul. 13, 2010 issued to Ep Patent Application 08771094.3.
CN Second Office Action dated Jan. 12, 2011 issued for CN Patent Application 200880019990.6.
EP Examination Report dated Jul. 13, 2010 issued to EP Patent Application 08771084,4.

* cited by examiner

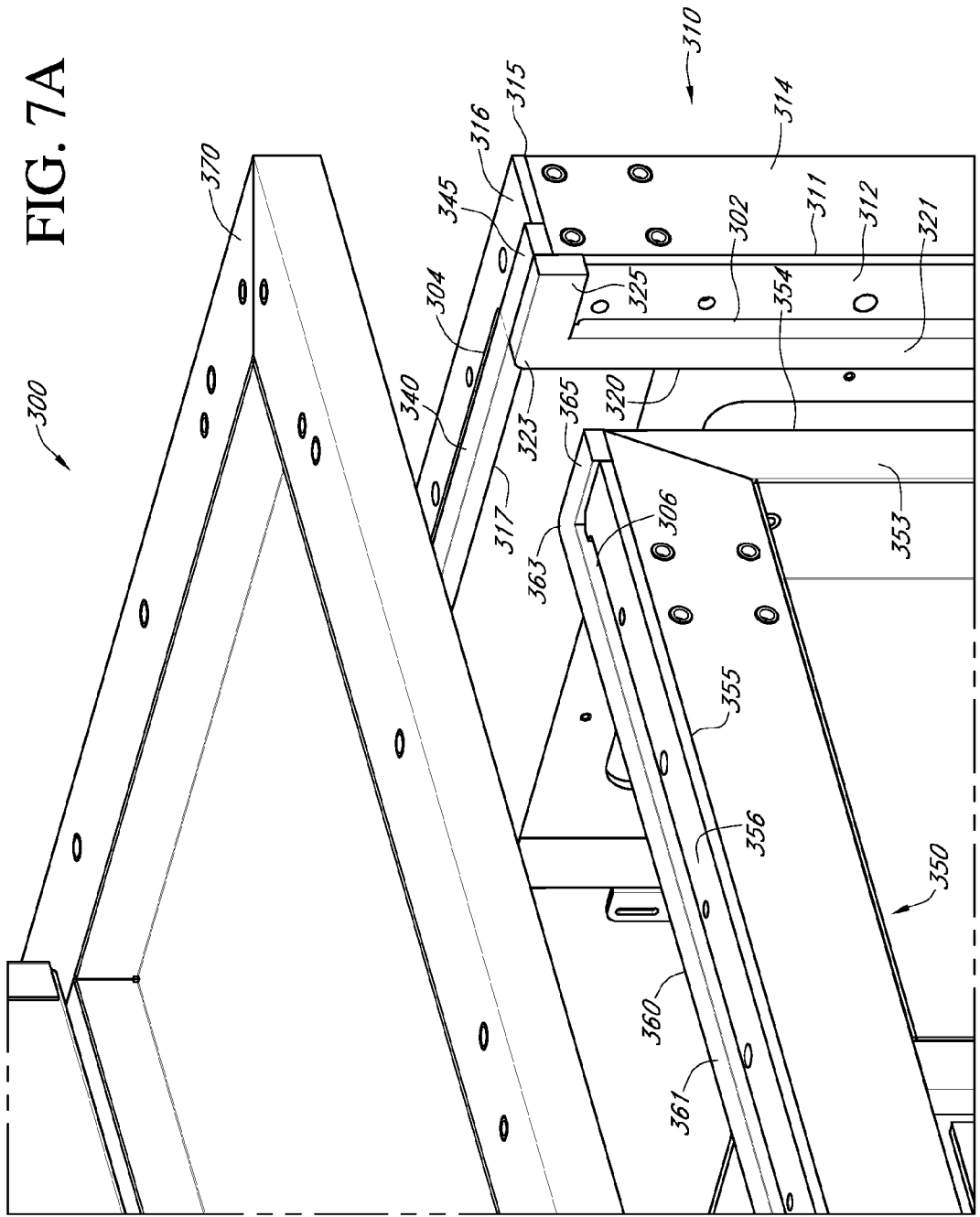

GAS ENCLOSURE SYSTEMS AND METHODS UTILIZING AN AUXILIARY ENCLOSURE

CROSS REFERENCE TO RELATED APPLICATIONS

This application is a continuation-in-part of U.S. application Ser. No. 13/802,304, filed Mar. 13, 2013, and published Aug. 15, 2013, as US 2013/0206058. U.S. application Ser. No. 13/802,304 is a continuation-in-part of U.S. application Ser. No. 13/720,830, filed Dec. 19, 2012; and published Sep. 26, 2013, as US 2013/0252533. U.S. application Ser. No. 13/720,830 claims the benefit of U.S. Provisional Application No. 61/579,233, filed Dec. 22, 2011. U.S. application Ser. No. 13/720,830, filed Dec. 19, 2012; is a continuation-in-part of U.S. application Ser. No. 12/652,040, filed Jan. 5, 2010 and issued Feb. 26, 2013 as U.S. Pat. No. 8,383,202, which is a continuation-in-part to U.S. application Ser. No. 12/139,391, filed on Jun. 13, 2008, and published Dec. 18, 2008, as US 2008/0311307. U.S. application Ser. No. 12/652,040 also claims the benefit of U.S. Provisional Application No. 61/142,575, filed Jan. 5, 2009. All cross-referenced applications listed herein are incorporated by reference in their entirety.

FIELD

The present teachings relate to various embodiments of a gas enclosure system that have an inert, substantially particle-free environment for fabrication of OLED panels on a variety of substrates sizes and substrate materials.

OVERVIEW

Interest in the potential of OLED display technology has been driven by OLED display technology attributes that include demonstration of display panels that have highly saturated colors, are high-contrast, ultrathin, fast-responding, and energy efficient. Additionally, a variety of substrate materials, including flexible polymeric materials, can be used in the fabrication of OLED display technology. Though the demonstration of displays for small screen applications, primarily for cell phones, has served to emphasize the potential of the technology, challenges remain in scaling the fabrication to larger formats. For example, high-volume manufacture of OLED displays on substrates larger than Gen 5.5 substrates, which have dimensions of about 130 cm×150 cm, has proven challenging.

An organic light-emitting diode (OLED) device may be manufactured by the printing of various organic thin films, as well as other materials, on a substrate using an OLED printing system. Such organic materials can be susceptible to damage by oxidation and other chemical processes. Housing an OLED printing system in a fashion that can be scaled for various substrate sizes and can be done in an inert, substantially particle-free printing environment can present a variety of challenges. Manufacturing tools for large-format substrate printing require substantially large facilities for housing. Accordingly, maintaining a large facility under an inert atmosphere, which can require gas purification to remove reactive atmospheric species, such as water vapor and oxygen, as well as organic solvent vapors, as well as maintaining a substantially particle-free printing environment, presents significant engineering challenges. For example, providing a large facility that is essentially hermetically sealed can present engineering challenges. Additionally, various bundles of cabling, wiring, and tubing feeding into and out of an OLED printing system for operating the printing system can create significant dead volume in which reactive gaseous species can be occluded. Such bundles of cabling, wiring, and tubing can therefore present challenges for effectively bringing a gas enclosure into specification with respect to levels of reactive atmospheric constituents, such as oxygen and water vapor, as well as organic vapors. Moreover, such bundles of cabling, wiring, and tubing used in the operation of a printing system can be an ongoing source of particulate matter. As such, providing and maintaining a substantially inert and particle-free environment in an entire enclosed gas enclosure system provides additional challenges not presented for processes that can be done, for example, in atmospheric conditions under open air, high flow laminar flow filtration hoods.

In that regard, challenges exist in scaling OLED printing from Gen 3.5 to Gen 8.5 and greater, while at the same time providing for a robust enclosure system that can contain an OLED printing system in an inert, substantially particle-free gas enclosure environment with minimal downtime. Accordingly, there exists a need for various embodiments of a gas enclosure system that can house an OLED printing system, in an inert, substantially particle-free environment, and that can be readily scaled to provide for fabrication of OLED panels on a variety of substrates sizes and substrate materials, while also providing for conducting various measurement and maintenance procedures with minimal downtime.

BRIEF DESCRIPTION OF THE DRAWINGS

A better understanding of the features and advantages of the present disclosure will be obtained by reference to the accompanying drawings, which are intended to illustrate, not limit, the present teachings.

FIG. 7A and FIG. 7B are various perspective views that depict sealing of frame members according to various embodiments of a gas enclosure assembly of the present teachings.

DETAILED DESCRIPTION OF THE DISCLOSURE

Figure 1:
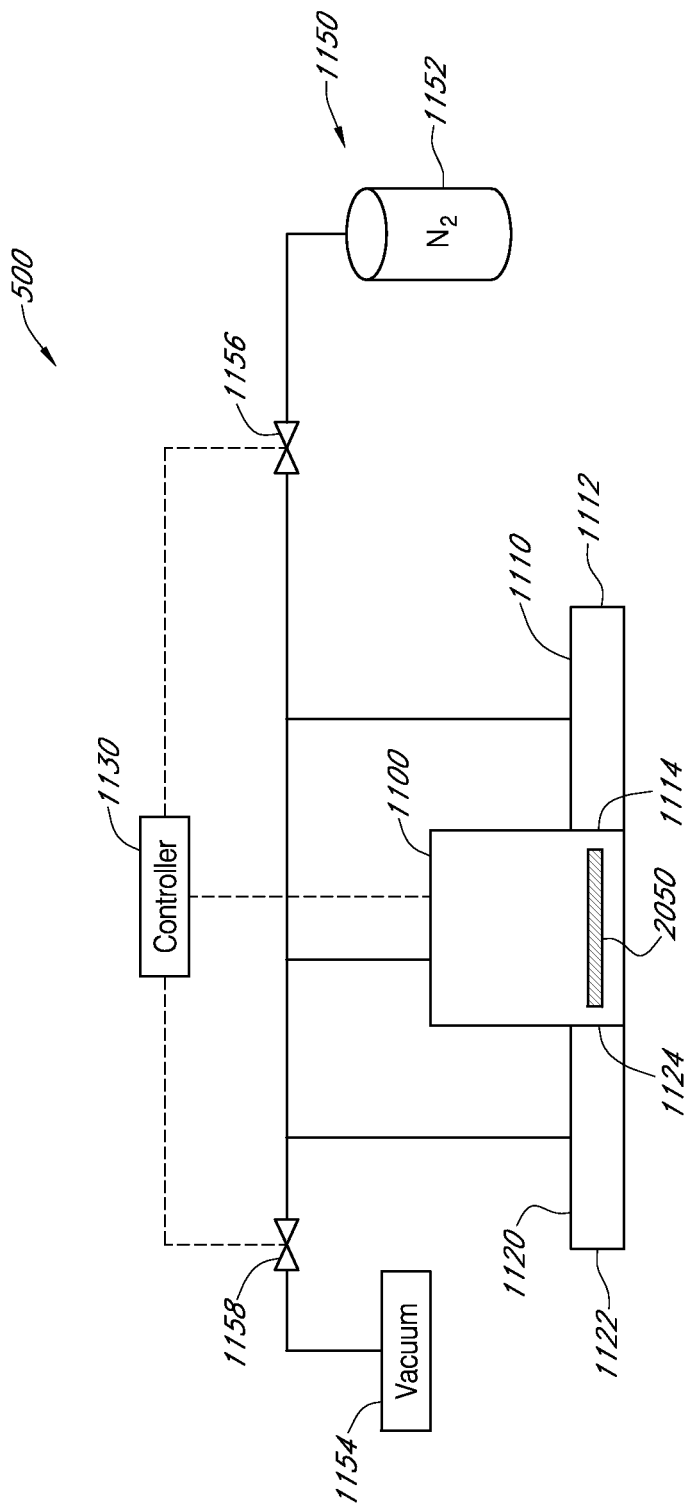
FIG. 1 is a schematic of a gas enclosure system in accordance with various embodiments of the present teachings.

The present teachings disclose various embodiments of systems and methods that can have a gas enclosure that can include a gas enclosure assembly for housing a printing system, i.e. a printing system enclosure, which can define a first volume or working volume and an auxiliary enclosure defining a second volume. According to the present teachings, various embodiments of a gas enclosure can have an opening allowing access between a printing system enclosure and an auxiliary enclosure and an opening allowing access between an auxiliary enclosure and the exterior of a gas enclosure. In various embodiments of a gas enclosure, an opening can be sealably closed. Various embodiments of a gas enclosure of the present teaching can have an opening and an opening that can be sealably closed. According to the present teachings, an auxiliary enclosure can be isolated from a printing system enclosure, for example, by sealably closing an opening allowing access between the printing system enclosure and the auxiliary enclosure.

Isolating an auxiliary enclosure from a printing system enclosure can allow various procedures related to the management of various components of a printhead assembly to be done with minimal or no interruption of a printing process. A printing system can include various embodiments of a printhead management system, which can be used for conducting various measurement and maintenance procedures associated with a printhead assembly. A printhead management system can be comprised of several subsystems which allow for such measurement tasks, such as the checking for nozzle firing, as well as the measurement of drop volume, velocity and trajectory from every nozzle in a printhead, and maintenance tasks, such as wiping or blotting a nozzle surface of excess ink, priming and purging a printhead by ejecting ink from an ink supply through the printhead and into a waste basin, and replacement of a printhead or a printhead device.

Accordingly, each subsystem can have various parts that are consumable by nature, and require replacement, such as replacing blotter paper, ink, and waste reservoirs. Various consumable parts can be packaged for ready insertion, for example, in a fully automated mode using a handler. As a non-limiting example, blotter paper can be packaged in a cartridge format, which can be readily inserted for use into a blotting module. By way of another non-limiting example ink can be packaged in a replaceable reservoir, as well as a cartridge format for use in a printing system. Various embodiments of a waste reservoir can be packaged in a cartridge format, which can be readily inserted for use into a purge basin module. Additionally, parts of various components of a printing system subject to ongoing use can require periodic replacement. For example, each printhead assembly can include between about 1 to about 60 printhead devices, where each printhead device can have between about 1 to about 30 printheads in each printhead device. As such, various embodiments of a printing system of the present teachings can have between about 1 to about 1800 printheads. During a printing process, expedient management of a printhead assembly, for example, but not limited by, an exchange of a printhead device or printhead, can be desirable. A printhead replacement module can have parts, such as a printhead device or printhead, which can be readily inserted for use into a printhead assembly. A measurement system used for checking for nozzle firing, as well as the measurement based on optical detection of drop volume, velocity and trajectory from every nozzle can have a source and a detector, which can require periodic replacement after use. Various high-usage parts can be packaged for ready insertion, for example, in a fully automated mode using a handler. In that regard, various process steps related to the ongoing management of a printing system can be performed in an auxiliary enclosure, which can be separated from a printing system enclosure. All steps associated with a printhead management procedure can be done to eliminate or minimize the exposure of a printing system enclosure to contamination, such as air and water vapor and various organic vapors, as well as particulate contamination. According to various systems and methods of the present teachings, a printing system enclosure may be introduced to a level of contamination that is sufficiently low that a purification system can remove the contamination before it can affect a printing process.

Furthermore, given the relatively small volume of an auxiliary enclosure, recovery of an auxiliary enclosure can take significantly less time than recovery of an entire printing system enclosure. For various embodiments of systems and methods of the present teachings, an auxiliary enclosure can be less than or equal to about 1% of the enclosure volume of a gas enclosure system. In various embodiments of systems and methods of the present teachings, an auxiliary enclosure can be can be less than or equal to about 2% of the enclosure volume of a gas enclosure system. For various embodiments of systems and methods of the present teachings, an auxiliary enclosure can be less than or equal to about 5% of the enclosure volume of a gas enclosure system. In various embodiments of systems and methods of the present teachings, an auxiliary enclosure can be less than or equal to about 10% of the enclosure volume of a gas enclosure system. In various embodiments of systems and methods of the present teachings, an auxiliary enclosure can be less than or equal to about 20% of the enclosure volume of a gas enclosure system.

Various embodiments of a gas enclosure system including a first volume defined by a printing system enclosure and a second volume defined by an auxiliary enclosure can include environmental control of various environmental parameters, such as lighting, gas circulation and filtration, gas purification, and thermal control of the environment maintained in a gas enclosure system. Various embodiments of a gas enclosure system can have a uniform controlled environment for both a printing system enclosure defining a first volume and an auxiliary enclosure defining a second volume. Such a uniform controlled environment for a gas enclosure system can provide, for example, an inert gas environment, as well as a substantially particle-free environment for processes requiring such an environment. Alternatively, various embodiments of a gas enclosure system can provide for a controlled environment in a printing system enclosure of a gas enclosure system that can be maintained under conditions that are different than the controlled environment maintained for an auxiliary enclosure.

As previously mentioned, various embodiments of a gas enclosure can have a sealable opening or passageway allowing access between a printing system enclosure and an auxiliary enclosure, as well as an opening allowing access between an auxiliary enclosure and the exterior of a gas enclosure. Accordingly, various embodiments of an auxiliary enclosure can be isolated from a printing system enclosure of a gas enclosure system, so that each volume is a separately-functioning section. Furthermore, while a printing system enclosure is isolated from an auxiliary enclosure, an opening between an auxiliary enclosure and the exterior of a gas enclosure can be opened to ambient or non-inert air without contaminating a printing system enclosure.

For various embodiments of a gas enclosure system, a sealable opening or passageway can include, by way of non-limiting examples, an enclosure panel opening or passageway, a door or a window. According to systems and methods of the present teachings, a sealable opening or passageway can allow access between two volumes or compartments, such as two enclosures or an enclosure and the exterior environment of a gas enclosure. According to the present teachings, when a sealable opening is sealably closed, isolation of at least one volume or compartment can result. For example, in various embodiments of the present teachings, a printing system enclosure can be isolated from an auxiliary enclosure by using a structural closure to sealably close an opening or passageway allowing access between a printing system enclosure and an auxiliary enclosure. Similarly, an auxiliary enclosure can be isolated from the exterior of a gas enclosure assembly by using a structural closure to sealably close an opening or passageway allowing access between an auxiliary enclosure and the environment external to an auxiliary enclosure. As will be discussed in more detail subsequently, a structural closure can include a variety of sealable coverings for an opening or passageway; such opening or passageway including non-limiting examples of an enclosure panel opening or passageway, a door or a window. According to systems and methods of the present teachings, a gate can be any structural closure that can be used to reversibly cover or reversibly sealably close any opening or passageway using pneumatic, hydraulic, electrical, or manual actuation.

Moreover, the use of dynamic closure can effectively sealably close an opening or passageway and thereby effectively prevent an enclosure from contamination by reactive gases, such as oxygen, water vapor, as well as organic vapors. For example, in various embodiments of the present teachings, a printing system enclosure can be isolated from an auxiliary enclosure by using a dynamic closure to effectively sealably close an opening or passageway allowing access between a printing system enclosure and an auxiliary enclosure. Similarly, an auxiliary enclosure can be isolated from the exterior of a gas enclosure assembly by using a dynamic closure to effectively sealably close an opening or passageway allowing access between an auxiliary enclosure and the environment external to an auxiliary enclosure. According to the present teachings, a dynamic closure can include a pressure difference or a gas curtain used between volumes or compartments for example, at an opening or passageway between a printing system enclosure and an auxiliary enclosure or an auxiliary enclosure and the exterior of a gas enclosure system. By way of a non-limiting example, a printing system enclosure can be dynamically isolated from an auxiliary enclosure by using a pressure differential at an opening or passageway between a printing system enclosure and an auxiliary enclosure to prevent the back diffusion of non-inert gas into the printing system enclosure. Similarly, an auxiliary enclosure can be dynamically isolated from the exterior of a gas enclosure by using a pressure differential at an opening or passageway between an auxiliary enclosure and the exterior of a gas enclosure to prevent the back diffusion of non-inert gas into the auxiliary enclosure. By way of an additional non-limiting example, a printing system enclosure can be dynamically isolated from an auxiliary enclosure using a gas curtain, which can effectively act as a diffusion barrier between the printing system enclosure and the auxiliary enclosure. Similarly, an auxiliary enclosure can be dynamically isolated from of the exterior of a gas enclosure using a gas curtain, which can effectively act as a diffusion barrier between the auxiliary enclosure and the exterior of a gas enclosure.

For various embodiments of a gas enclosure system, an opening or passageway can be sealably closed using combinations of various embodiments of a dynamic closure and a structural closure. By way of a non-limiting example, a printing system enclosure can be isolated from an auxiliary enclosure using a sealable covering in combination with a dynamic closure such as a pressure difference or a gas curtain between an opening or passageway that allows access between the printing system enclosure and the auxiliary enclosure. Similarly, an auxiliary enclosure can be isolated from the exterior of a gas enclosure using a sealable covering in combination with a dynamic closure such as a pressure difference or a gas curtain between an opening or passageway that allows access between the auxiliary enclosure and the exterior of a gas enclosure. By way of an additional non-limiting example, a printing system enclosure can be isolated from an auxiliary enclosure using a sealable covering between an opening or passageway that allows access between the printing system enclosure and the auxiliary enclosure, while an auxiliary enclosure can be isolated from the exterior of a gas enclosure using a dynamic closure such as a pressure difference or a gas curtain between an opening or passageway that allows access between the auxiliary enclosure and the exterior of a gas enclosure.

According to various embodiments of the present teachings, a gas enclosure can have an auxiliary enclosure that can be a variety of housings. Various embodiments of an auxiliary enclosure can be constructed as a section of a gas enclosure assembly for housing a printing system. Various embodiments of an auxiliary enclosure can be for example, but not limited by, an adaptable controlled-environment enclosure, a transfer chamber, and a load lock chamber. Various embodiments of an auxiliary enclosure such as an adaptable controlled-environment enclosure, a transfer chamber, and a load lock chamber, can be readily moved from one position to another position. In various embodiments, an auxiliary enclosure can define a second volume that can be maintained as an inert environment. For embodiments of a gas enclosure system of the present teachings, a gas enclosure assembly for housing a printing system defining a first volume can have a gas volume that can be maintained at 100 ppm or lower, for example, at 10 ppm or lower, at 1.0 ppm or lower, or at 0.1 ppm or lower for each species of various reactive species, including various reactive atmospheric gases, such as water vapor and oxygen, as well as organic solvent vapors. Additionally, a gas enclosure system of the present teachings, an auxiliary enclosure defining a second volume can have a gas volume that can be maintained at 100 ppm or lower, for example, at 10 ppm or lower, at 1.0 ppm or lower, or at 0.1 ppm or lower for each species of various reactive species, including various reactive atmospheric gases, such as water vapor and oxygen, as well as organic solvent vapors. Further, various embodiments of a gas enclosure system can provide a low particle printing environment meeting the standards of International Standards Organization Standard (ISO) 14644-1:1999, "Cleanrooms and associated controlled environments—Part 1: Classification of air cleanliness," as specified by Class 1 through Class 5.

As previously mentioned, fabrication of OLED displays on substrates larger than Gen 5.5 substrates, a Gen 5.5 substrate having dimensions of about 130 cm×150 cm, presents significant engineering challenges. Generations of mother glass substrate sizes have been undergoing evolution for flat panel displays fabricated by other-than OLED printing since about the early 1990's. The first generation of mother glass substrates, designated as Gen 1, is approximately 30 cm×40 cm, and therefore could produce a 15" panel. Around the mid-1990's, the existing technology for producing flat panel displays had evolved to a mother glass substrate size of Gen 3.5, which has dimensions of about 60 cm×72 cm.

As generations have advanced, mother glass sizes for Gen 7.5 and Gen 8.5 are in production for other-than OLED printing fabrication processes. A Gen 7.5 mother glass has dimensions of about 195 cm×225 cm, and can be cut into eight 42" or six 47" flat panels per substrate. The mother glass used in Gen 8.5 is approximately 220 cm×250 cm, and can be cut to six 55" or eight 46" flat panels per substrate. The promise of OLED flat panel display for qualities such as truer color, higher contrast, thinness, flexibility, transparency, and energy efficiency have been realized, at the same time that OLED manufacturing is practically limited to Gen 3.5 and smaller. Currently, OLED printing is believed to be the optimal manufacturing technology to break this limitation and enable OLED panel manufacturing for not only mother glass sizes of Gen 3.5 and smaller, but at the largest mother glass sizes, such as Gen 5.5, Gen 7.5, and Gen 8.5. One of the features of OLED panel printing includes that a variety of substrate materials can be used, for example, but not limited by, a variety of glass substrate materials, as well as a variety of polymeric substrate materials. In that regard, sizes recited from the terminology arising from the use of glass-based substrates can be applied to substrates of any material suitable for use in OLED printing.

It is contemplated that a wide variety of ink formulations can be printed within the inert, substantially particle-free environment of various embodiments of a gas enclosure system of the present teachings. In addition to various ink formulations for the printing of an emissive layer (EL) of an OLED substrate, various ink formulations can include inks comprising one or more components useful in forming at least one of a hole transport layer (HTL), a hole injection layer (HIL), an electron transport layer (ETL), and an electron injection layer (EIL) of an OLED device.

It is further contemplated that an organic encapsulation layer can be printed on an OLED panel using inkjet printing. It is contemplated that an organic encapsulation layer can be printed using inkjet printing, as inkjet printing can provide several advantages. First, a range of vacuum processing operations can be eliminated because such inkjet-based fabrication can be performed at atmospheric pressure. Additionally, during an inkjet printing process, an organic encapsulation layer can be localized to cover portions of an OLED substrate over and proximal to an active region, to effectively encapsulate an active region, including lateral edges of the active region. The targeted patterning using inkjet printing results in eliminating material waste, as well as eliminating additional processing typically required to achieve patterning of an organic layer. An encapsulation ink can comprise a polymer including, for example, but not limited by, an acrylate, methacrylate, urethane, or other material, as well as copolymers and mixtures thereof, which can be cured using thermal processing (e.g. bake), UV exposure, and combinations thereof.

With respect to OLED printing, according to the present teachings, maintaining substantially low levels of reactive species, for example, but not limited by, atmospheric constituents such as oxygen and water vapor, as well as various organic solvent vapors used in OLED inks, has been found to correlate to providing OLED flat panel displays meeting the requisite lifetime specifications. The lifetime specification is of particular significance for OLED panel technology, as this correlates directly to display product longevity; a product specification for all panel technologies, which is currently challenging for OLED panel technology to meet. In order to provide panels meeting requisite lifetime specifications, levels of each of a reactive species, such as water vapor, oxygen, as well as organic solvent vapors, can be maintained at 100 ppm or lower, for example, at 10 ppm or lower, at 1.0 ppm or lower, or at 0.1 ppm or lower with various embodiments of a gas enclosure system of the present teachings. Additionally, OLED printing requires a substantially particle-free environment. Maintaining a substantially particle-free environment for OLED printing is of particular importance, as even very small particles can lead to a visible defect on an OLED panel. Maintaining a substantially particle-free environment in an entire enclosed system provides additional challenges not presented by particle reduction for processes that can be done in atmospheric conditions, such as under open air, high flow laminar flow filtration hoods. As such, maintaining the requisite specifications for an inert, particle-free environment in a large facility can present a variety of challenges.

The need for printing an OLED panel in a facility in which the levels of each of a reactive species, such as water vapor, oxygen, as well as organic solvent vapors, can be maintained at 100 ppm or lower, for example, at 10 ppm or lower, at 1.0 ppm or lower, or at 0.1 ppm or lower, can be illustrated in reviewing the information summarized in Table 1. The data summarized on Table 1 resulted from the testing of each of a test coupon comprising organic thin film compositions for each of red, green, and blue, fabricated in a large-pixel, spin-coated device format. Such test coupons are substantially easier to fabricate and test for the purpose of rapid evaluation of various formulations and processes. Though test coupon testing should not be confused with lifetime testing of a printed panel, it can be indicative of the impact of various formulations and processes on lifetime.

The results shown in the table below represent variation in the process step in the fabrication of test coupons in which only the spin-coating environment varied for test coupons fabricated in a nitrogen environment where reactive species were less than 1 ppm compared to test coupons similarly fabricated but in air instead of a nitrogen environment.

It is evident through the inspection of the data in Table 1 for test coupons fabricated under different processing environments, particularly in the case of red and blue, that printing in an environment that effectively reduces exposure of organic thin film compositions to reactive species may have a substantial impact on the stability of various EMLs, and hence on lifetime.

TABLE 1

Impact of inert gas processing on lifetime for OLED panels

| Color | Process Environment | V @ 10 mA/cm$^2$ | Cd/A | CIE (x, y) @ 1000 Cd/m$^2$ | T95 | T80 | T50 |
|---|---|---|---|---|---|---|---|
| Red | Nitrogen | 6 | 9 | (0.61, 0.38) | 200 | 1750 | 10400 |
|  | Air | 6 | 8 | (0.60, 0.39) | 30 | 700 | 5600 |
| Green | Nitrogen | 7 | 66 | (0.32, 0.63) | 250 | 3700 | 32000 |
|  | Air | 7 | 61 | (0.32, 0.62) | 250 | 2450 | 19700 |
| Blue | Nitrogen | 4 | 5 | (0.14, 0.10) | 150 | 750 | 3200 |
|  | Air | 4 | 5 | (0.14, 0.10) | 15 | 250 | 1800 |

Additionally, as previously discussed, maintaining a substantially particle-free environment for OLED printing is of particular importance, as even very small particles can lead to a visible defect on an OLED panel. Currently, it is a challenge for facilities to produce OLED displays that meet the required low defect levels for commercialization for either maintaining low levels of each of a reactive species, such as water vapor, oxygen, as well as organic solvent vapors, as well as for maintaining a sufficiently low-particle environment. Additionally, it is contemplated that a gas enclosure system would have attributes that include, for example, but are not limited by, a gas enclosure assembly that can be readily scaled to provide an optimized working volume for an OLED printing system, while providing minimized inert gas volume, and additionally providing ready access to an OLED printing system from the exterior during processing, while providing access to the interior for maintenance with minimal downtime. In that regard, according to various embodiments of the present teachings, a gas enclosure assembly for various air-sensitive processes that require an inert environment is provided that can include a plurality of wall frame and ceiling frame members that can be sealed together. In some embodiments, a plurality of wall frame and ceiling frame members can be fastened together using reusable fasteners, for example, bolts and threaded holes. For various embodiments of a gas enclosure assembly according to the present teachings, a plurality of frame members, each frame member comprising a plurality of panel frame sections, can be constructed to define a gas enclosure frame assembly.

A gas enclosure assembly of the present teachings can be designed to accommodate a printing system, such as an OLED printing system, in a fashion that can minimize the volume of the enclosure around a system. Various embodiments of such a printing system enclosure can be constructed in a fashion that minimizes the internal volume of a printing system enclosure and at the same time optimizes a working volume to accommodate various footprints of various OLED printing systems. For example, an OLED printing system according to various embodiments of a gas enclosure system of the present teachings, can comprise, for example, a granite base, a moveable bridge that can support an OLED printing device, one or more devices and apparatuses running from various embodiments of a pressurized inert gas recirculation system, such as a substrate floatation table, air bearings, tracks, rails, an ink-jet printer system for depositing OLED film-forming material onto substrates, including an OLED ink supply subsystem and an inkjet printhead, one or more robots, and the like. Given the variety of components that can comprise OLED printing system, various embodiments of OLED printing system can have a variety of footprints and form factors. Various embodiments of a gas enclosure assembly so constructed additionally provide ready access to the interior of a gas enclosure assembly from the exterior during processing, in order to readily access a printing system for maintenance, while minimizing downtime. In that regard, various embodiments of a gas enclosure assembly according to the present teachings can be contoured with respect to various footprints of various OLED printing systems. According to various embodiments, once the contoured frame members are constructed to form a gas enclosure frame assembly, various types of panels may be sealably installed in a plurality of panel sections comprising a frame member to complete the installation of a gas enclosure assembly. In various embodiments of a gas enclosure assembly, a plurality of frame members including, for example, but not limited by, a plurality of wall frame members and at least one ceiling frame member, as well as a plurality of panels for installation in panel frame sections, may be fabricated at one location or locations, and then constructed at another location. Moreover, given the transportable nature of components used to construct a gas enclosure assembly of the present teachings, various embodiments of a gas enclosure assembly can be repeatedly installed and removed through cycles of construction and deconstruction.

Moreover, various embodiments of an auxiliary enclosure can be isolated from the working volume of a printing system enclosure of a gas enclosure system, from the exterior of a gas enclosure or from both by using a structural closure for a sealable opening, which can be used to allow access, for example, between an auxiliary enclosure and a printing system enclosure or an auxiliary enclosure and the exterior of a gas enclosure. For various embodiments of systems and methods of the present teachings, a structural closure can include a variety of sealable coverings for an opening or passageway; such opening or passageway including non-limiting examples of an enclosure panel opening or passageway, a door or a window. According to systems and methods of the present teachings, a gate can be any structural closure that can be used to reversibly cover or reversibly sealably close any opening or passageway using pneumatic, hydraulic, electrical, or manual actuation. Various embodiments of an auxiliary enclosure can be isolated from the working volume of a printing system enclosure, from the exterior of a gas enclosure or from both by using a dynamic closure such as a pressure difference or a gas curtain at an opening between a working volume of a gas enclosure system and an auxiliary enclosure or at an opening between an auxiliary enclosure and the exterior of a gas enclosure. For various embodiments of a gas enclosure system, an auxiliary enclosure can be isolated from the working volume of a printing system enclosure, from the exterior of a gas enclosure or from both using combinations various embodiments of a structural closure and a dynamic closure.

For various embodiments of systems and methods of the present teachings, an auxiliary enclosure can be less than or equal to about 1% of the enclosure volume of a gas enclosure system. In various embodiments of systems and methods of the present teachings, an auxiliary enclosure can be less than or equal to about 2% of the enclosure volume of a gas enclosure system. For various embodiments of systems and methods of the present teachings, an auxiliary enclosure can be less than or equal to about 5% of the enclosure volume of a gas enclosure system. In various embodiments of systems and methods of the present teachings, an auxiliary enclosure can be less than or equal to about 10% of the enclosure volume of a gas enclosure system. In various embodiments of systems and methods of the present teachings, an auxiliary enclosure can be less than or equal to about 20% of the enclosure volume of a gas enclosure system. As such, given the relatively small volume of an auxiliary enclosure, recovery of an auxiliary enclosure can take significantly less time than recovery of an entire printing system enclosure. Therefore, the utilization of an auxiliary enclosure while performing various printhead management procedures can minimize or eliminate gas enclosure system downtime.

In order to ensure that a gas enclosure is hermetically sealed, various embodiments of a gas enclosure assembly of the present teaching provide for joining each frame member to provide frame sealing. The interior can be sufficiently sealed, for example, hermetically sealed, by tight-fitting intersections between the various frame members, which include gaskets or other seals. Once fully constructed, a sealed gas enclosure assembly can comprise an interior and a plurality of interior corner edges, at least one interior corner edge provided at the intersection of each frame member with an adjacent frame member. One or more of the frame members, for example, at least half of the frame members, can comprise one or more compressible gaskets fixed along one or more respective edges thereof. The one or more compressible gaskets can be configured to create an hermetically sealed gas enclosure assembly once a plurality of frame members are joined together, and gas-tight panels installed. A sealed gas enclosure assembly can be formed having corner edges of frame members sealed by a plurality of compressible gaskets. For each frame member, for example, but not limited by, an interior wall frame surface, a top wall frame surface, a vertical side wall frame surface, a bottom wall frame surface, and a combination thereof can be provided with one or more compressible gaskets.

For various embodiments of a gas enclosure assembly, each frame member can comprise a plurality of sections framed and fabricated to receive any of a variety of panel types that can be sealably installed in each section to provide a gas-tight panel seal for each panel. In various embodiments of a gas enclosure assembly of the present teachings, each section frame can have a section frame gasket that, with selected fasteners, ensures each panel installed in each section frame can provide a gas-tight seal for each panel, and therefore for a fully-constructed gas enclosure. In various embodiments, a gas enclosure assembly can have one or more of a window panel or service window in each of a wall panel; where each window panel or service window can have at least one gloveport. During assembly of a gas enclosure assembly, each gloveport can have a glove attached, so that the glove can extend into the interior. According to various embodiments, each gloveport can have hardware for mounting a glove, wherein such hardware utilizes gasket seals around each gloveport that provide a gas-tight seal to minimize leakage or molecular diffusion through the gloveport. For various embodiments of a gas enclosure assembly of the present teachings, the hardware is further designed for providing ease of capping and uncapping a gloveport to an end-user.

Various embodiments of a gas enclosure system according to the present teachings can include a gas enclosure assembly formed from a plurality of frame members and panel sections, as well as gas circulation, filtration and purification components. For various embodiments of a gas enclosure system, ductwork may be installed during the assembly process. According to various embodiments of the present teachings, ductwork can be installed within a gas enclosure frame assembly, which has been constructed from a plurality of frame members. In various embodiments, ductwork can be installed on a plurality of frame members before they are joined to form a gas enclosure frame assembly. Ductwork for various embodiments of a gas enclosure system can be configured such that substantially all gas drawn into the ductwork from one or more ductwork inlets is moved through various embodiments of a gas circulation and filtration loop for removing particulate matter internal to a gas enclosure system. Additionally, ductwork of various embodiments of a gas enclosure system can be configured to separate the inlets and outlets of a gas purification loop that is external to a gas enclosure assembly from a gas circulation and filtration loop that is internal to a gas enclosure assembly. According to various embodiments of a gas enclosure system of the present teachings, a gas circulation and filtration system can be in fluid communication with, for example, but not limited by, components of a particle control assembly. For various embodiments of a gas enclosure assembly, a gas circulation and filtration system can be in fluid communication with a cable tray assembly exhaust system. For various embodiments of a gas enclosure assembly, a gas circulation and filtration system can be in fluid communication with a printhead assembly exhaust system. In various embodiments of a gas enclosure system, various components of a particle control system in fluid communication with a gas circulation and filtration system can provide a low particle zone proximal to a substrate positioned in a printing system.

For example, a gas enclosure system can have a gas circulation and filtration system internal a gas enclosure assembly. Such an internal filtration system can have a plurality of fan filter units within the interior, and can be configured to provide a laminar flow of gas within the interior. The laminar flow can be in a direction from a top of the interior to a bottom of the interior, or in any other direction. Although a flow of gas generated by a circulating system need not be laminar, a laminar flow of gas can be used to ensure thorough and complete turnover of gas in the interior. A laminar flow of gas can also be used to minimize turbulence, such turbulence being undesirable as it can cause particles in the environment to collect in such areas of turbulence, preventing the filtration system from removing those particles from the environment. Further, to maintain a desired temperature in the interior, a thermal regulation system utilizing a plurality of heat exchangers can be provided, for example, operating with, adjacent to, or used in conjunction with, a fan or another gas circulating device. A gas purification loop can be configured to circulate gas from within the interior of a gas enclosure assembly through at least one gas purification component exterior the enclosure. In that regard, a circulation and filtration system internal to a gas enclosure assembly in conjunction with a gas purification loop external to a gas enclosure assembly can provide continuous circulation of a substantially low-particulate inert gas having substantially low levels of reactive species throughout a gas enclosure system.

Various embodiments of a gas enclosure system that include a gas enclosure assembly having a gas enclosure defining a first volume and an auxiliary enclosure defining a second volume having a gas purification system can be configured to maintain very low levels of undesired components, for example, organic solvents and vapors thereof, as well as water, water vapor, oxygen, and the like. Recalling, various embodiments of an auxiliary enclosure can be readily integrated with environmental regulation system components, such as lighting, gas circulation and filtration, gas purification, and thermostating components of a gas enclosure system. As such, various embodiments of a gas enclosure system including an auxiliary enclosure can have a uniform controlled environment for a gas enclosure defining a first volume and an auxiliary enclosure defining a second volume. Such a controlled environment can provide, for example, an inert, thermally controlled, and substantially particle-free environment for processes requiring such an environment. In various embodiments of gas enclosure systems of the present teachings, a controlled environment can provide, for example, a thermally controlled and substantially particle-free environment for processes requiring such an environment.

Further, various embodiments of a gas enclosure system including an auxiliary enclosure can provide for a controlled environment in a working portion of a gas enclosure system that can be maintained under conditions that are different than the controlled environment maintained for an auxiliary enclosure. Accordingly, various embodiments of an auxiliary enclosure can be isolated from the working volume of a gas enclosure system, so that each volume is a separately-functioning section. For various embodiments of a gas enclosure system, an auxiliary enclosure can be isolated from the working volume of a gas enclosure system using a structural closure for an opening, such as an enclosure panel opening or passageway, door or window. For various embodiments of systems and methods of the present teachings, a structural closure can include a variety of sealable coverings for an opening or passageway; such opening or passageway including non-limiting examples of an enclosure panel opening or passageway, a door or a window. According to systems and methods of the present teachings, a gate can be any structural closure that can be used to reversibly cover or reversibly sealably close any opening or passageway using pneumatic, hydraulic, electrical, or manual actuation. Various embodiments of an auxiliary enclosure can be isolated from the working volume of a gas enclosure system using a dynamic closure, such as a pressure difference or a gas curtain, between a working volume of a gas enclosure system and an auxiliary enclosure, and combinations of various embodiments of a dynamic closure and a structural closure. Additionally, each of a working volume of a gas enclosure and an auxiliary enclosure can have separately controlled environments, providing the capability of independent regulation of, for example, but not limited by, temperature, lighting, particle control, and gas purification. As such, the specification for the thermal control, lighting control, particle control and inert gas environment control for an auxiliary enclosure volume and a working volume of a gas enclosure can be set to be the same or to be different for each volume.

In addition to providing for the gas circulation, filtration and purification components, the ductwork can be sized and shaped to accommodate therein at least one of an electrical wire, a wire bundle, as well as various fluid-containing tubings, which when bundled can have a considerable dead volume in which atmospheric constituents, such as water, water vapor, oxygen, and the like, can be trapped and difficult to remove by the purification system. Additionally, such bundles are an identified source of particulate matter. In some embodiments, a combination of cables; electrical and optical, as well as electrical wires and wire bundles, and fluid-containing tubing can be disposed substantially within the ductwork and can be operatively associated with at least one of an optical system, an electrical system, an optical system, a mechanical system, and a fluidic system, respectively, disposed within the interior. As the gas circulation, filtration and purification components can be configured such that substantially all circulated inert gas is drawn through the ductwork, both particulate matter arising from such bundles, as well as atmospheric constituents trapped in the dead volume of variously bundled materials can be effectively removed by having such bundled materials contained within the ductwork.

Various embodiments of systems and methods of the present teachings can include various embodiments of a gas enclosure having a first volume and a second volume, as well as gas circulation, filtration and purification components, and additionally various embodiments of a pressurized inert gas recirculation system. Such a pressurized inert gas recirculation system can be utilized in the operation of an OLED printing system for various pneumatically-driven devices and apparatuses, as will be discussed in more detail subsequently.

According to the present teachings, several engineering challenges were addressed in order to provide for various embodiments of a pressurized inert gas recirculation system in a gas enclosure system. First, under typical operation of a gas enclosure system without a pressurized inert gas recirculation system, a gas enclosure system can be maintained at a slightly positive internal pressure relative to an external pressure in order to safeguard against outside gas or air from entering the interior should any leaks develop in a gas enclosure system. For example, under typical operation, for various embodiments of a gas enclosure system of the present teachings, the interior of a gas enclosure system can be maintained at a pressure relative to the surrounding atmosphere external to the enclosure system, for example, of at least 2 mbarg, for example, at a pressure of at least 4 mbarg, at a pressure of at least 6 mbarg, at a pressure of at least 8 mbarg, or at a higher pressure. Maintaining a pressurized inert gas recirculation system within a gas enclosure system can be challenging, as it presents a dynamic and ongoing balancing act regarding maintaining a slight positive internal pressure of a gas enclosure system, while at the same time introducing pressurized gas into a gas enclosure system. Further, variable demand of various devices and apparatuses can create an irregular pressure profile for various gas enclosure assemblies and systems of the present teachings. Maintaining a dynamic pressure balance for a gas enclosure system held at a slight positive pressure relative to the external environment under such conditions can provide for the integrity of an ongoing OLED printing process.

For various embodiments of a gas enclosure system, a pressurized inert gas recirculation system according to the present teachings can include various embodiments of a pressurized inert gas loop that can utilize at least one of a compressor, an accumulator, and a blower, and combinations thereof. Various embodiments of a pressurized inert gas recirculation system that include various embodiments of a pressurized inert gas loop can have a specially designed pressure-controlled bypass loop that can provide internal pressure of an inert gas in a gas enclosure system of the present teachings at a stable, defined value. In various embodiments of a gas enclosure system, a pressurized inert gas recirculation system can be configured to recirculate pressurized inert gas via a pressure-controlled bypass loop when a pressure of an inert gas in an accumulator of a pressurized inert gas loop exceeds a pre-set threshold pressure. The threshold pressure can be, for example, within a range from between about 25 psig to about 200 psig, or more specifically within a range of between about 75 psig to about 125 psig, or more specifically within a range from between about 90 psig to about 95 psig. In that regard, a gas enclosure system of the present teachings having a pressurized inert gas recirculation system with various embodiments of a specially designed pressure-controlled bypass loop can maintain a balance of having a pressurized inert gas recirculation system in an hermetically sealed gas enclosure.

According to the present teachings, various devices and apparatuses can be disposed in the interior and in fluid communication with various embodiments of a pressurized inert gas recirculation system having various pressurized inert gas loops that can utilize a variety of pressurized gas sources, such as at least one of a compressor, a blower, and combinations thereof. For various embodiments of a gas enclosure and system of the present teachings, the use of various pneumatically operated devices and apparatuses can be provide low-particle generating performance, as well as being low maintenance. Exemplary devices and apparatuses that can be disposed in the interior of a gas enclosure system and in fluid communication with various pressurized inert gas loops can include, for example, but not limited by, one or more of a pneumatic robot, a substrate floatation table, an air bearing, an air bushing, a compressed gas tool, a pneumatic actuator, and combinations thereof. A substrate floatation table, as well as air bearings can be used for various aspects of operating an OLED printing system in accordance with various embodiments of a gas enclosure system of the present teachings. For example, a substrate floatation table utilizing air-bearing technology can be used to transport a substrate into position in a printhead chamber, as well as to support a substrate during an OLED printing process.

As previously discussed, various embodiments of a substrate floatation table, as well as air bearings can be useful for the operation of various embodiments of an OLED printing system housed in a gas enclosure system according to the present teachings. As shown schematically in FIG. 1 for gas enclosure system 500, a substrate floatation table utilizing air-bearing technology can be used to transport a substrate into position in a printhead chamber, as well support a substrate during an OLED printing process. In FIG. 1, a gas enclosure assembly 1100 for housing a printing system can be a load-locked system that can have an inlet chamber 1110 for receiving a substrate through inlet gate 1112 and first enclosure gate 1114 for moving a substrate from inlet chamber 1110 to gas enclosure assembly 1100 for printing. Various gates according to the present teachings can be used for isolating the chambers from each other and from the external surroundings. According to the present teachings, various gates can be a selected from a physical gate and a gas curtain.

During the substrate-receiving process, inlet gate 1112 can be open, while first enclosure gate 1114 can be in the closed position in order to prevent atmospheric gases from entering gas enclosure assembly 1100. Once a substrate is received in inlet chamber 1110, both inlet gate 1112 and first enclosure gate 1114 can be closed and inlet chamber 1110 can be purged with an inert gas, such as nitrogen, any of the noble gases, and any combination thereof, until reactive atmospheric gases are at a low of level of 100 ppm or lower, for example, at 10 ppm or lower, at 1.0 ppm or lower, or at 0.1 ppm or lower. After atmospheric gases have reached a sufficiently low level, gate first enclosure gate 1114 can be opened, while inlet gate 1112 remains closed, to allow substrate 2050, to be transported from inlet chamber 1110 to gas enclosure assembly 1100, as depicted in FIG. 1. The transport of the substrate from inlet chamber 1110 to gas enclosure assembly 1100 can be via, for example, but not limited by, a floatation table provided in gas enclosure assembly 1100 and inlet chamber 1110. The transport of the substrate from inlet chamber 1110 to gas enclosure assembly 1100 can also be via, for example, but not limited by, a substrate transport robot, which can place substrate 2050 onto a floatation table provided in gas enclosure assembly 1100. Substrate 2050 can remain supported on a substrate floatation table during the printing process.

Various embodiments of gas enclosure system 500 can have outlet chamber 1120 in fluid communication with gas enclosure assembly 1100 through second enclosure gate 1124. According to various embodiments of gas enclosure system 500, after the printing process is complete, substrate 2050 can be transported from gas enclosure assembly 1100 to outlet chamber 1120 through second enclosure gate 1124. The transport of the substrate from gas enclosure assembly 1100 to outlet chamber 1120 can be via, for example, but not limited by, a floatation table provided in gas enclosure assembly 1100 and outlet chamber 1120. The transport of the substrate from gas enclosure assembly 1100 to outlet chamber 1120 can also be via, for example, but not limited by, a substrate transport robot, which can pick up substrate 2050 from a floatation table provided in gas enclosure assembly 1100 and transport it into outlet chamber 1120. For various embodiments of gas enclosure system 500, substrate 2050 can be retrieved from outlet chamber 1120 via outlet gate 1122, when second enclosure gate 1124 is in a closed position in order to prevent reactive atmospheric gases from entering gas enclosure assembly 1100.

In addition to a load-locked system that includes an inlet chamber 1110 and an outlet chamber 1120, which are in fluid communication with gas enclosure assembly 1100 via first enclosure gate 1114 and second enclosure gate 1124 respectively, gas enclosure system 500 can include system controller 1130. System controller 1130 can include one or more processor circuits (not shown) in communication with one or more memory circuits (not shown). System controller 1130 can also communicate with a load-locked system that includes an inlet chamber 1110 and an outlet chamber 1120 and ultimately with a print nozzle of an OLED printing system. In this manner, system controller 1130 can coordinate opening and closing of gates 1112, 1114, 1122 and 1124. System controller 1130 can also control ink dispensing to a print nozzle of an OLED printing system. Substrate 2050 can be transported through various embodiments of a load-locked system of the present teachings that includes an inlet chamber 1110 and an outlet chamber 1120, which are in fluid communication with gas enclosure assembly 1100 via gates 1114 and 1124 respectively, via for example, but not limited by, a substrate floatation table utilizing air-bearing technology or a combination of floatation tables utilizing air-bearing technology and substrate transport robots.

Various embodiments of a load-locked system of FIG. 1 can also include pneumatic control system 1150, which can include a vacuum source and an inert gas source that can include nitrogen, any of the noble gases, and any combination thereof. A substrate floatation system housed within gas enclosure system 500 can include multiple vacuum ports and gas bearing ports, which are typically arranged on a flat surface. Substrate 2050 can be lifted and kept off of a hard surface by the pressure of an inert gas such as nitrogen, any of the noble gases, and any combination thereof. The flow out of the bearing volume is accomplished by means of multiple vacuum ports. The floating height of substrate 2050 over a substrate floatation table is typically a function of gas pressure and gas flow. Vacuum and pressure of pneumatic control system 1150 can be used to support substrate 2050 during handling inside the gas enclosure assembly 1100 in the load-locked system of FIG. 1, for example, during printing. Control system 1150 can also be used to support substrate 2050 during transport through load-locked system of FIG. 1 that includes an inlet chamber 1110 and an outlet chamber 1120, which are in fluid communication with gas enclosure assembly 1100 via gates 1114 and 1124 respectively. To control transporting substrate 2050 through gas enclosure system 500, system controller 1130 communicates with inert gas source 1152 and vacuum 1154 through valves 1156 and 1158, respectively. Additional vacuum and inert gas supply lines and valving, not shown, can be provided to the gas enclosure system 500, illustrated by the lock-locked system in FIG. 1, to further provide the various gas and vacuum facilities needed for controlling the enclosed environment.

Figure 2:
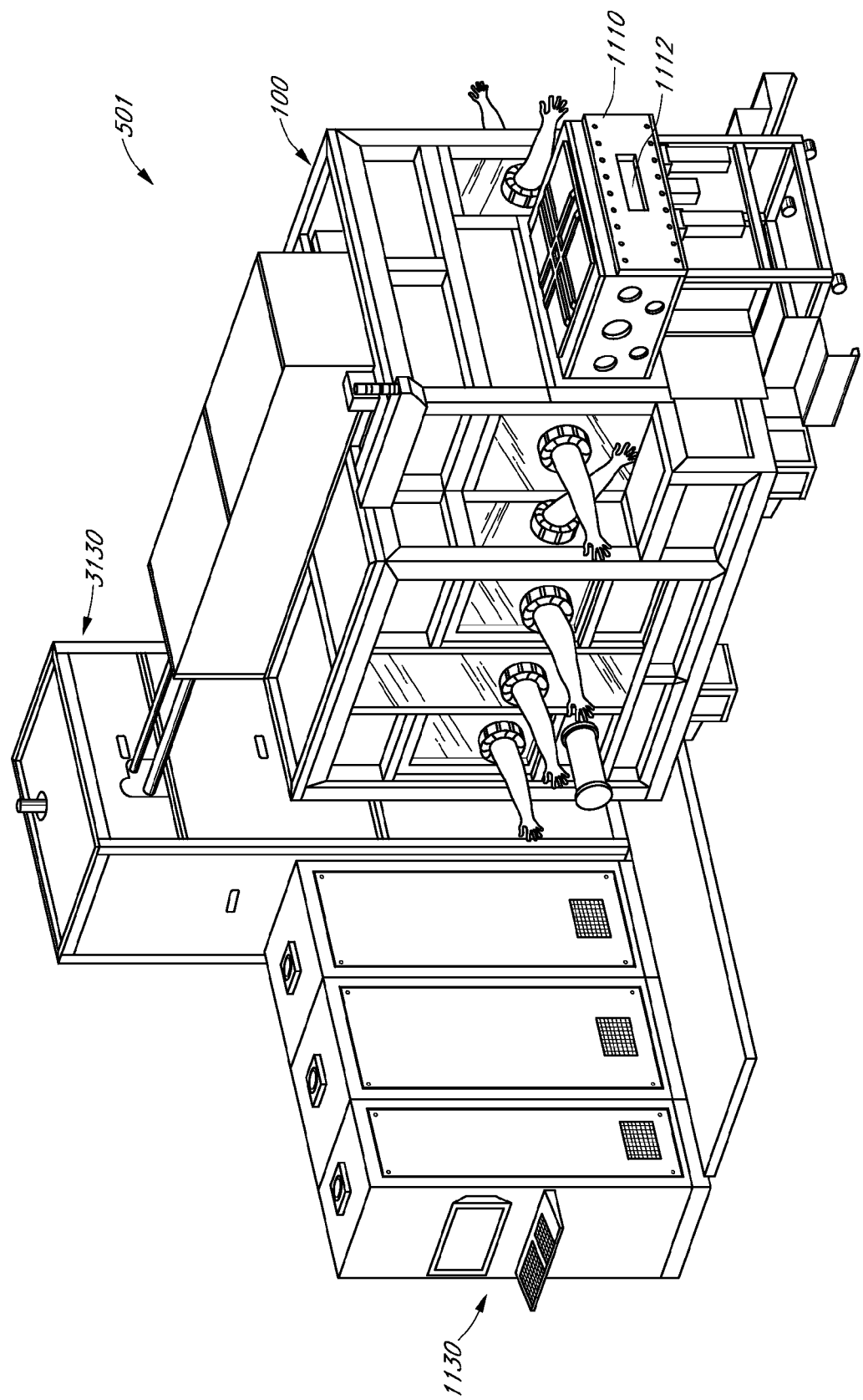
FIG. 2 is left, front perspective view of a gas enclosure system in accordance with various embodiments of the present teachings.

To lend a more dimensional perspective to various embodiments of a gas enclosure system according to the present teachings, FIG. 2 is a left front perspective view of various embodiments of gas enclosure system 501. FIG. 2 depicts a load-locked system including various embodiments of gas enclosure assembly 100, which will be discussed subsequently. Gas enclosure system 501 can have load-locked inlet chamber 1110, which can have inlet gate 1112. Gas enclosure system 501 of FIG. 2 can include a gas purification system 3130 for providing gas enclosure assembly 100 with a constant supply of inert gas having substantially low levels of reactive atmospheric species, such as water vapor and oxygen, as well as organic solvent vapors that result from an OLED printing process. Gas enclosure system 501 of FIG. 2 can also have controller system 1130 for system control functions, as previously discussed.

Figure 3:
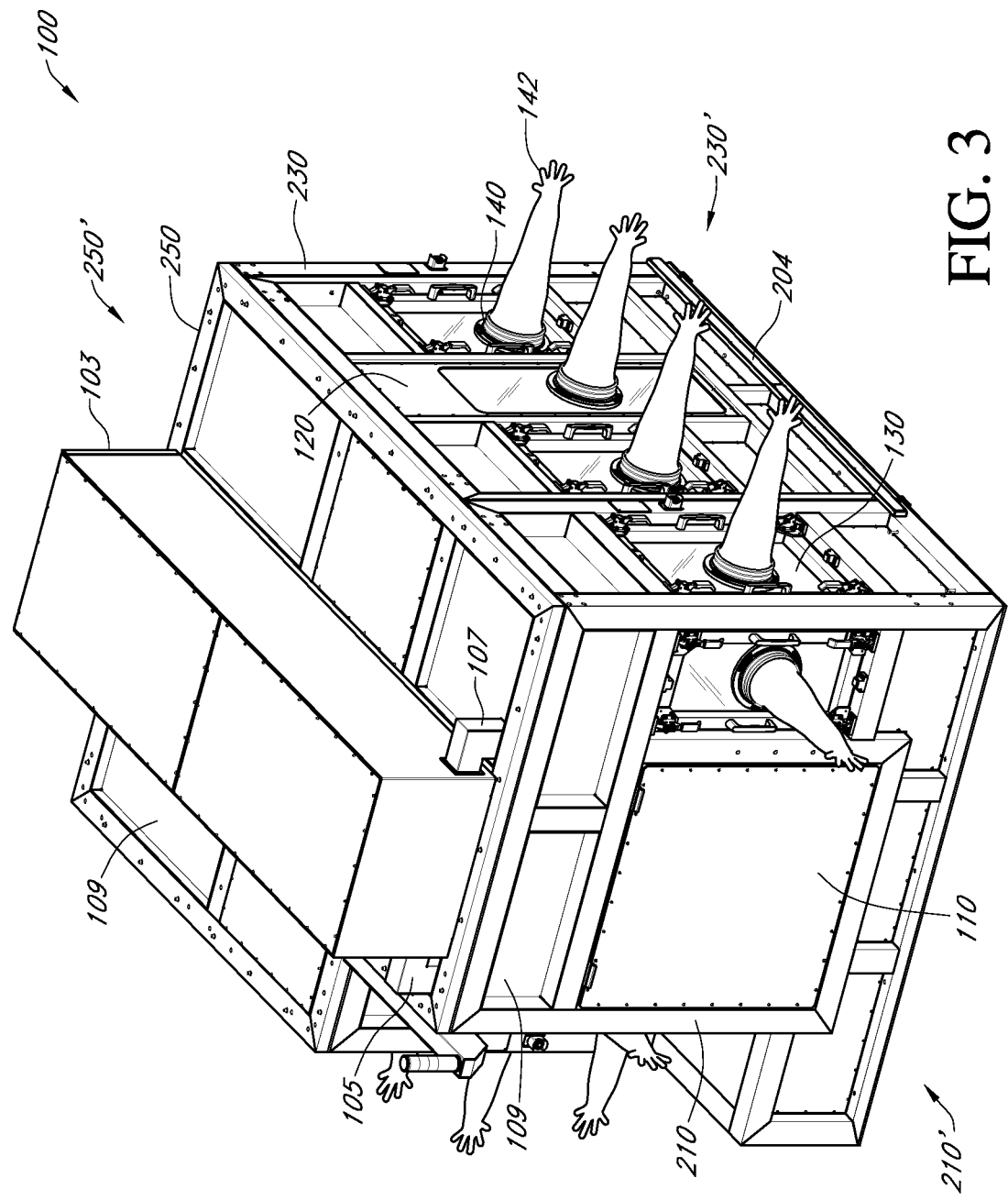
FIG. 3 is right, front perspective view of a gas enclosure assembly in accordance with various embodiments of the present teachings.

FIG. 3 is a right, front perspective view of a fully-constructed gas enclosure assembly 100 according to various embodiments of the present teachings. Gas enclosure assembly 100 can contain one or more gases for maintaining an inert environment in a gas enclosure assembly interior. A gas enclosure system of the present teachings can be useful in maintaining an inert gas atmosphere in the interior. An inert gas may be any gas that does not undergo a chemical reaction under a defined set of conditions. Some commonly used examples of an inert gas can include nitrogen, any of the noble gases, and any combination thereof. Gas enclosure assembly 100 is configured to encompass and protect an air-sensitive process, such as the printing of an organic light emitting diode (OLED) ink using an industrial printing system. Examples of atmospheric gases that are reactive to OLED inks include water vapor and oxygen. As previously discussed, gas enclosure assembly 100 can be configured to maintain a sealed atmosphere and allow the component or printing system to operate effectively while avoiding contamination, oxidation, and damage to otherwise reactive materials and substrates.

As depicted in FIG. 3, various embodiments of gas enclosure assembly 100 can comprise component parts including a front or first wall panel 210', a left, or second wall panel (not shown), a right or third wall panel 230', a back or forth wall panel (not shown), and ceiling panel 250', which gas enclosure assembly can be attached to pan 204, which rests on a base (not shown). As will be discussed in more detail subsequently, various embodiments of a gas enclosure assembly 100 of FIG. 3 can be constructed from a front or first wall frame 210, a left, or second wall frame (not shown), a right or third wall frame 230, a back or forth wall panel (not shown), and a ceiling frame 250. Various embodiments of a ceiling frame 250 can include a fan filter unit cover 103, as well as first ceiling frame duct 105, and first ceiling frame duct 107. According to embodiments of the present teachings, various types of section panels may be installed in any of a plurality of panel section comprising a frame member. In various embodiments of gas enclosure 100 of FIG. 1, sheet metal panel sections 109 can be welded into a frame member during the construction of a frame. For various embodiments of gas enclosure assembly 100, types of section panels can that can be repeatedly installed and removed through cycles of construction and deconstruction of a gas enclosure assembly can include an inset panel 110, as indicated for wall panel 210', as well as a window panel 120 and readily-removable service window 130, as indicated for wall panel 230'.

Though readily-removable service window 130 can provide ready access to the interior of enclosure 100, any panel that is removable can be used to provide access to the interior of a gas enclosure system for the purpose of repair and regular service. Such access for service or repair is differentiated from the access provided by panels such as window panel 120 and readily-removable service window 130, which can provide an end-user glove access to the interior of a gas enclosure assembly during use from the exterior of a gas enclosure assembly. For example, any of the gloves, such as glove 142, which is attached to gloveport 140, as shown in FIG. 3 for panel 230, can provide an end-user access to the interior during use of a gas enclosure system.

Figure 4:
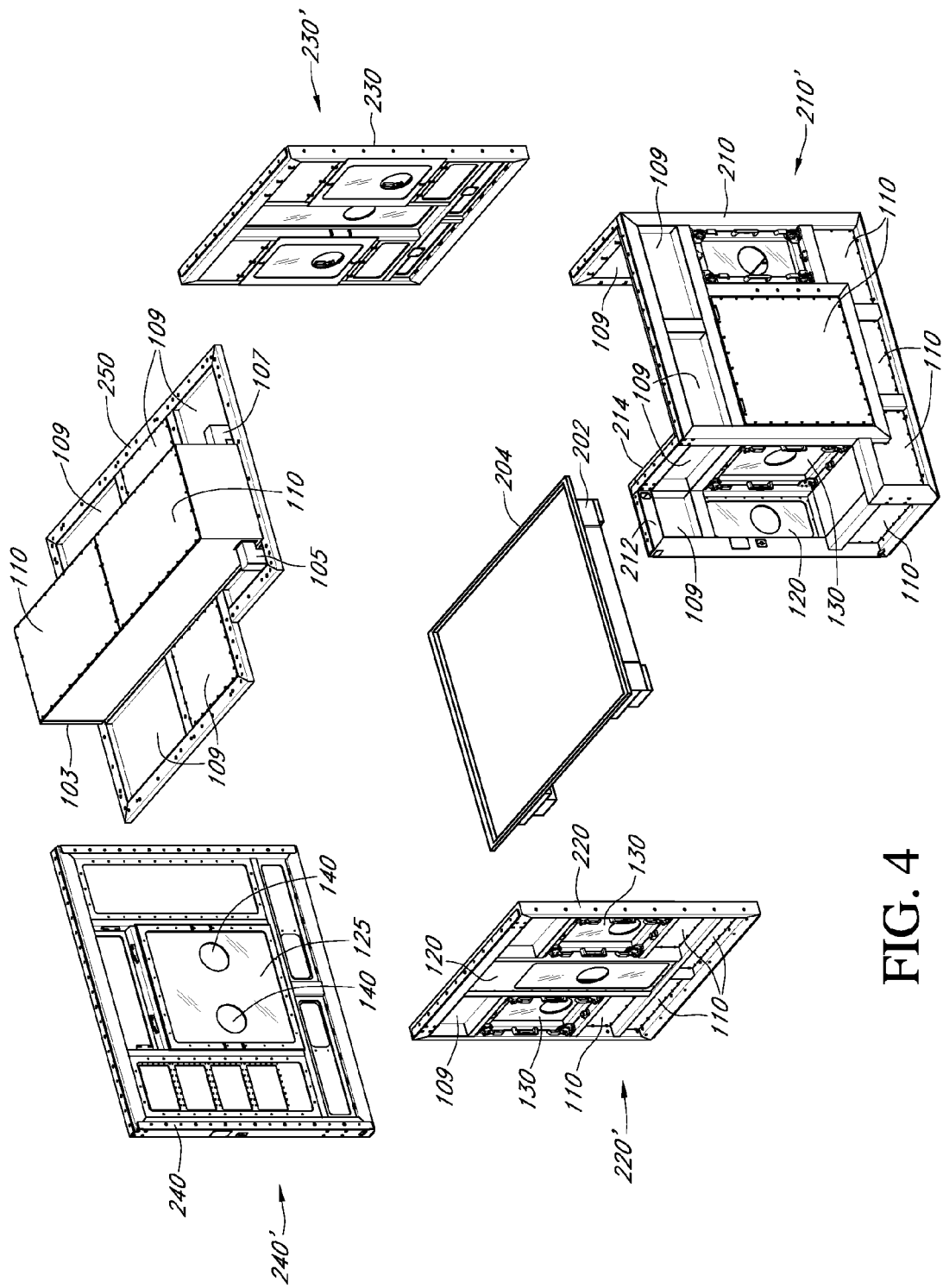
FIG. 4 depicts an exploded view of a gas enclosure assembly in accordance with various embodiments of the present teachings.

FIG. 4 depicts an exploded view of various embodiments of a gas enclosure assembly as depicted in FIG. 3. Various embodiments of a gas enclosure assembly can have a plurality of wall panels, including outside perspective view of front wall panel 210', outside perspective view of left wall panel 220', interior perspective view of a right wall panel 230', interior perspective view of rear wall panel 240', and top perspective view of ceiling panel 250', which as shown in FIG. 3 can be attached to pan 204, which rests upon base 202. An OLED printing system can mounted on top of pan 204, which printing processes are known to be sensitive to atmospheric conditions. According to the present teachings, a gas enclosure assembly can be constructed from frame members, for example, wall frame 210 of wall panel 210', wall frame 220 of wall panel 220', wall frame 230 of wall panel 230', wall frame 240 of wall panel 240', and ceiling frame 250 of ceiling panel 250', in which a plurality of section panels can then be installed. In that regard, it can be desirable to streamline the design of section panels that can be repeatedly installed and removed through cycles of construction and deconstruction of various embodiments of a gas enclosure assembly of the present teachings. Moreover, contouring of a gas enclosure assembly 100 can be done to accommodate a footprint of various embodiments of an OLED printing system in order to minimize the volume of inert gas required in a gas enclosure assembly, as well as providing ready access to an end-user; both during use of a gas enclosure assembly, as well as during maintenance.

Using front wall panel 210' and left wall panel 220' as exemplary, various embodiments of a frame member can have sheet metal panel sections 109 welded into a frame member during frame member construction. Inset panel 110, window panel 120 and readily-removable service window 130 can be installed in each of a wall frame member, and can be repeatedly installed and removed through cycles of construction and deconstruction of gas enclosure assembly 100 of FIG. 4. As can be seen; in the example of wall panel 210' and wall panel 220', a wall panel can have a window panel 120 proximal to a readily-removable service window 130. Similarly, as depicted in the example rear wall panel 240', a wall panel can have a window panel such as window panel 125, which has two adjacent gloveports 140. For various embodiments of wall frame members according to the present teachings, and as seen for gas enclosure assembly 100 of FIG. 3, such an arrangement of gloves provides easy access from the exterior of a gas enclosure to component parts within an enclosed system. Accordingly, various embodiments of a gas enclosure can provide two or more gloveports so that an end-user can extend a left glove and a right glove into the interior and manipulate one or more items in the interior, without disturbing the composition of the gaseous atmosphere within the interior. For example, any of window panel 120 and service window 130 can be positioned to facilitate easy access from the exterior of a gas enclosure assembly to an adjustable component in the interior of a gas enclosure assembly. According to various embodiments of a window panel, such as window panel 120 and service window 130, when end-user access through a gloveport glove is not indicated, such windows may not include a gloveport and gloveport assembly.

Various embodiments of wall and ceiling panels, as depicted in FIG. 4, can have a plurality of an inset panel 110. As can be seen in FIG. 4, inset panels can have a variety of shapes and aspect ratios. In addition to inset panels, ceiling panel 250' can have a fan filter unit cover 103 as well as first ceiling frame duct 105, and second ceiling frame duct 107, mounted, bolted, screwed, fixed, or otherwise secured to ceiling frame 250. As will be discussed in more detail subsequently, ductwork in fluid communication with duct 107 of ceiling panel 250' can be installed within the interior of a gas enclosure assembly. According to the present teachings, such ductwork can be part of a gas circulation system internal to a gas enclosure assembly, as well as providing for separating the flow stream exiting a gas enclosure assembly for circulation through at least one gas purification component external to a gas enclosure assembly.

Figure 5:
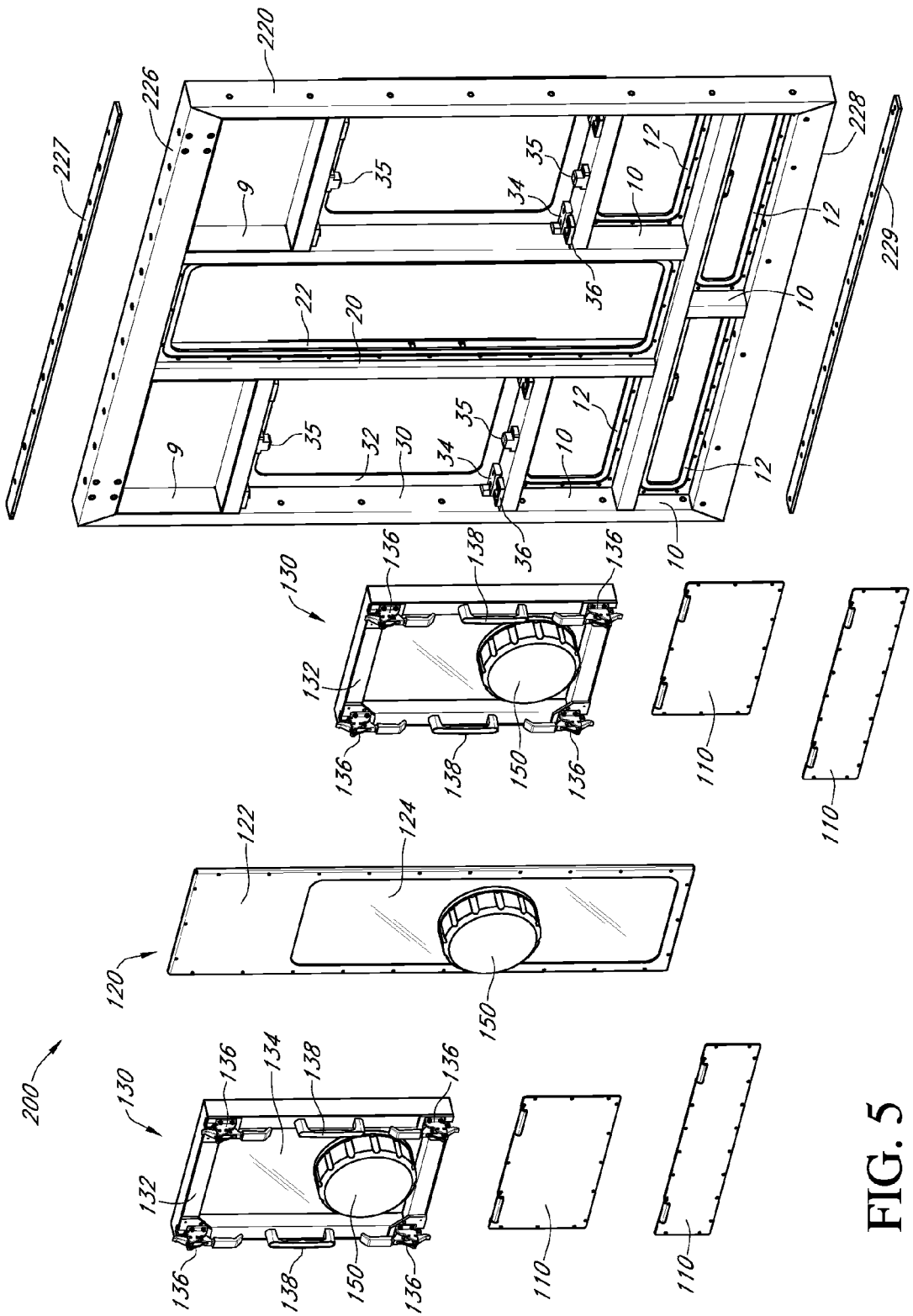
FIG. 5 is an exploded front perspective view of a frame member assembly depicting various panel frame sections, and section panels in accordance with various embodiments of the present teachings.

FIG. 5 is an exploded front perspective view of frame member assembly 200, in which wall frame 220 can be constructed to include a complete complement of panels. Though not limited to the design shown, frame member assembly 200, using wall frame 220, can be used as exemplary for various embodiments of a frame member assembly according to the present teachings. Various embodiments of a frame member assembly can be comprised of various frame members and section panels installed in various frame panel sections of various frame members according to the present teachings.

According to various embodiments of various frame member assemblies of the present teachings, frame member assembly 200 can be comprised of a frame member, such as wall frame 220. For various embodiments of a gas enclosure assembly, such as gas enclosure assembly 100 of FIG. 3, processes that may utilize equipment housed in such a gas enclosure assembly may not only require an hermetically sealed enclosure providing an inert environment, but an environment substantially free of particulate matter. In that regard, a frame member according to the present teachings may utilize variously dimensioned metal tube materials for the construction of various embodiments of a frame. Such metal tube materials address desired material attributes, including, but not limited by, a high-integrity material that will not degrade to produce particulate matter, as well as producing a frame member having high strength, yet optimal weight, providing for ready transport, construction, and deconstruction from one site to another site of a gas enclosure assembly comprising various frame members and panel sections. Any material satisfying these requirements can be utilized for creating various frame members according to the present teachings.

For example, various embodiments of a frame member according to the present teachings, such as frame member assembly 200, can be constructed from extruded metal tubing. According to various embodiments of a frame member, aluminum, steel, and a variety of metal composite materials may be utilized for constructing a frame member. In various embodiments, metal tubing having dimensions of, for example, but not limited by, 2"w×2"h, 4"w×2"h and 4"w×4"h and having ⅛" to ¼" wall thickness can be used to construct various embodiments of frame members according to the present teachings. Additionally, a variety of reinforced fiber polymeric composite materials of a variety of tube or other forms are available that have the material attributes including, but not limited by, a high-integrity material that will not degrade to produce particulate matter, as well as producing a frame member having high strength, yet optimal weight, providing for ready transport, construction, and deconstruction from one site to another site.

Regarding construction of various frame members from variously dimensioned metal tube materials, it is contemplated that welding to create various embodiments of frame weldments can be done. Additionally, construction of various frame members from variously dimensioned building materials can be done using an appropriate industrial adhesive. It is contemplated that the construction of various frame members should be done in a fashion that would not intrinsically create leak paths through a frame member. In that regard, construction of various frame members can be done using any approach that does not intrinsically create leak paths through a frame member for various embodiments of a gas enclosure assembly. Further, various embodiments of frame members according to the present teachings, such as wall frame 220 of FIG. 4, may be painted or coated. For various embodiments of a frame member made from a metal tubing material prone, for example, to oxidation, where material formed at the surface may create particulate matter, painting or coating, or other surface treatment, such as anodizing, to prevent the formation of particulate matter can be done.

A frame member assembly, such as frame member assembly 200 of FIG. 5, can have a frame member, such as wall frame 220. Wall frame 220 can have top 226, upon which a top wall frame spacer plate 227 can be fastened, as well as a bottom 228, upon which a bottom wall frame spacer plate 229 can be fastened. As will be discussed in more detail subsequently, spacer plates mounted on surfaces of a frame member are a part of a gasket sealing system, which in conjunction with the gasket sealing of panels mounted in frame member sections, provides for hermetic sealing of various embodiments of a gas enclosure assembly according to the present teachings. A frame member, such as wall frame 220 of frame member assembly 200 of FIG. 5, can have several panel frame sections, where each section can be fabricated to receive various types of panels, such as, but not limited by, an inset panel 110, a window panel 120 and a readily-removable service window 130. Various types of panel sections can be formed in the construction of a frame member. Types of panel sections can include, for example, but not limited by, an inset panel section 10, for receiving inset panel 110, a window panel section 20, for receiving window panel 120, and a service window panel section 30, for receiving readily-removable service window 130.

Each type of panel section can have a panel section frame to receive a panel, and can provide that each panel can be sealably fastened into each panel section in accordance with the present teachings for constructing an hermetically sealed gas enclosure assembly. For example, in FIG. 5 depicting a frame assembly according to the present teachings, inset panel section 10 is shown to have frame 12, window panel section 20 is shown to have frame 22, and service window panel section 30 is shown to have frame 32. For various embodiments of a wall frame assembly of the present teachings, various panel section frames can be a metal sheet material welded into the panel sections with a continuous weld-bead to provide a hermetic seal. For various embodiments of a wall frame assembly, various panel section frames can be made from a variety of sheet materials, including building materials selected from reinforced fiber polymeric composite materials, which can be mounted in a panel section using an appropriate industrial adhesive. As will be discussed in more detail in subsequent teachings concerning sealing, each panel section frame can have a compressible gasket disposed thereon to ensure that a gas-tight seal can be formed for each panel installed and fastened in each panel section. In addition to a panel section frame, each frame member section can have hardware related to positioning a panel, as well as to securely fastening a panel in a panel section.

Various embodiments of inset panel 110 and panel frame 122 for window panel 120 can be constructed from sheet metal material, such as, but not limited by, aluminum, various alloys of aluminum and stainless steel. The attributes for the panel material can be the same as they are for the structural material constituting various embodiments of frame members. In that regard, materials having attributes for various panel members include, but not are limited by, a high integrity material that will not degrade to produce particulate matter, as well as producing a panel having high strength, yet optimal weight, in order to provide for ready transport, construction, and deconstruction from one site to another site. Various embodiments of, for example, honeycomb core sheet material can have the requisite attributes for use as panel material for construction of inset panel 110 and panel frame 122 for window panel 120. Honeycomb core sheet material can be made of a variety of materials; both metal, as well as metal composite and polymeric, as well as polymer composite honeycomb core sheet material. Various embodiments of removable panels when fabricated from a metal material can have ground connections included in the panel to ensure that when a gas enclosure assembly is constructed that the entire structure is grounded.

Given the transportable nature of components used to construct a gas enclosure assembly of the present teachings, any of the various embodiments of section panels of the present teachings can be repeatedly installed and removed during use of a gas enclosure system to provide access to the interior of a gas enclosure assembly.

For example, panel section 30 for receiving a readily-removable service window panel 130 can have a set of four spacers, of which one is indicated as window guide spacer 34. Additionally, panel section 30, which is constructed for receiving a readily-removable service window panel 130, can have a set of four clamping cleats 36, which can be used to clamp service window 130 into service window panel section 30 using a set of four of a reverse acting toggle clamp 136 mounted on service window frame 132 for each of a readily removable service window 130. Further, two of each of a window handle 138 can be mounted on readily-removable service window frame 132 to provide an end-user ease of removal and installation of service window 130. The number, type, and placement of removable service window handles can be varied. Additionally, service window panel section 30 for receiving a readily-removable service window panel 130 can have at least two of a window clamp 35, selectively installed in each service window panel section 30. Though depicted as in the top and bottom of each of service window panel section 30, at least two window clamps can be installed in any fashion that acts to secure service window 130 in panel section frame 32. A tool can be used to remove and install window clamp 35, in order to allow service window 130 to be removed and reinstalled.

Reverse acting toggle clamp 136 of service window 130, as well as hardware installed on panel section 30, including clamping cleat 36, window guide spacer 34, and window clamp 35, can be constructed of any suitable material, as well as combination of materials. For example, one or more such elements can comprise at least one metal, at least one ceramic, at least one plastic, and a combination thereof. Removable service window handle 138 can be constructed of any suitable material, as well as a combination of materials. For example, one or more such elements can comprise at least one metal, at least one ceramic, at least one plastic, at least one rubber, and a combination thereof. Enclosure windows, such as window 124 of window panel 120, or window 134 of service window 130, can comprise any suitable material as well as a combination of materials. According to various embodiments of a gas enclosure assembly of the present teachings, enclosure windows can comprise a transparent and a translucent material. In various embodiments of a gas enclosure assembly, enclosure windows can comprise silica-based materials, for example, but not limited by, such as glass and quartz, as well as various types of polymeric-based materials, for example, but not limited by, such as various classes of polycarbonate, acrylic, and vinyl. Various composites and combinations thereof of exemplary window materials can also be useful as transparent and translucent materials according to the present teachings.

As will be discussed in the following teachings for FIGS. 8A-9B, wall and ceiling frame member seals in conjunction with gas-tight section panel frame seals together provide for various embodiments of an hermetically-sealed gas enclosure assembly for air-sensitive processes that require an inert environment. Components of a gas enclosure system that contribute to providing substantially low concentrations of reactive species, as well as substantially low particulate environment can include, but are not limited by, an hermetically sealed gas enclosure assembly, as well as a highly effective gas circulation and particle filtration system, including ductwork. Providing effective hermetic seals for a gas enclosure assembly can be challenging; especially where three frame members come together to form a three-sided joint. As such, three-sided joint sealing presents a particularly difficult challenge with respect to providing readily-installable hermetic sealing for a gas enclosure assembly that can be assembled and disassembled through cycles of construction and deconstruction.

In that regard, various embodiments of a gas enclosure assembly according to the present teachings provide for hermetic sealing of a fully-constructed gas enclosure system through effective gasket sealing of joints, as well as providing effective gasket sealing around load bearing building components. Unlike conventional joint sealing, joint sealing according to the present teachings: 1) includes uniform parallel alignment of abutted gasket segments from orthogonally oriented gasket lengths at top and bottom terminal frame joint junctures where three frame members are joined, thereby avoiding angular seam alignment and sealing, 2) provides for forming the abutted lengths across an entire width of a joint, thereby increasing the sealing contact area at three-sided joint junctures, 3) is designed with spacer plates that provide uniform compression force across all vertical, and horizontal, as well as top and bottom three-sided joint gasket seals. Additionally, the selection of the gasket material can impact the effectiveness of providing an hermetic seal, which will be discussed subsequently.

Figure 6B:
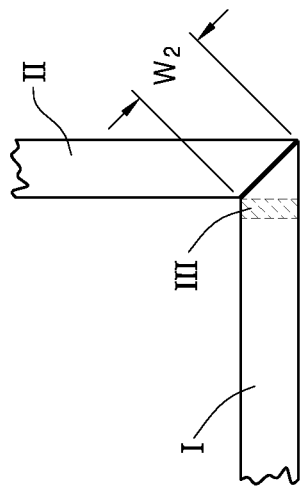
FIG. 6A, FIG. 6B and FIG. 6C are top schematic views of various embodiments of gasket seals for forming joints.
Figure 6C:
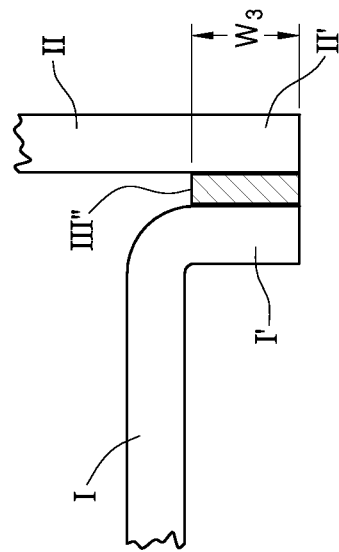
Figure 6A:
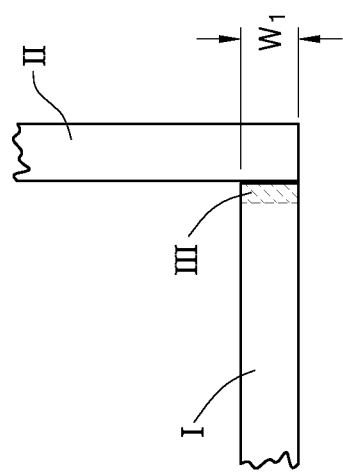

FIG. 6A through FIG. 6C are top schematic views that depict a comparison of conventional three-sided joint seals to three-sided joint seals according to the present teachings. According to various embodiments of a gas enclosure assembly the present teachings, there can be, for example, but not limited by, at least four wall frame members, a ceiling frame member and a pan, that can be joined to form a gas enclosure assembly, creating a plurality of vertical, horizontal, and three-sided joints requiring hermetic sealing. In FIG. 6A, a top schematic view of a conventional three-sided gasket seal formed from a first gasket I, which is orthogonally oriented to gasket II in the X-Y plane. As shown in FIG. 6A, a seam formed from the orthogonal orientation in the X-Y plane has a contact length $W_1$ between the two segments defined by the dimension of width of the gasket. Additionally, a terminal end portion of gasket III, which is a gasket orthogonally oriented to both gasket I and gasket II in the vertical direction, can abut gasket I and gasket II, as indicated by the hatching. In FIG. 6B, a top schematic view of a conventional three-sided joint gasket seal formed from a first gasket length I, which is orthogonal to a second gasket length II, and has a seam joining 45° faces of both lengths, where the seam has a contact length $W_2$ between the two segments that is greater than the width of the gasket material. Similarly to the configuration of FIG. 6A, an end portion of gasket III, which is orthogonal to both gasket I and gasket II in the vertical direction can abut gasket I and gasket II, as indicated by the hatching. Assuming that the gaskets widths are the same in FIG. 6A and FIG. 6B, the contact length $W_2$ for FIG. 6B is greater than the contact length $W_1$ for FIG. 6A.

FIG. 6C is a top schematic view of a three-sided joint gasket seal according to the present teachings. A first gasket length I can have a gasket segment I' formed orthogonally to the direction of gasket length I, where gasket segment I' has a length that can be approximately the dimension of the width of a structural component being joined, such as a 4"w×2"h or 4"w×4"h metal tube used to form various wall frame members of a gas enclosure assembly of the present teachings. Gasket II is orthogonal to gasket I in the X-Y plane, and has gasket segment II', which has an overlapping length with gasket segment I' that is approximately the width of structural components being joined. The width of gasket segments I' and II' are the width of a compressible gasket material selected. Gasket III is orthogonally oriented to both gasket I and gasket II in the vertical direction. Gasket segment III' is an end portion of gasket III. Gasket segment III' is formed from the orthogonal orientation of gasket segment III' to the vertical length of gasket III. Gasket segment III' can be formed so that it has approximately the same length as gasket segments I' and II', and a width that is the thickness of a compressible gasket material selected.

In that regard, the contact length $W_3$ for the three aligned segments shown in FIG. 6C is greater than for the conventional three-corner joint seals shown in either FIG. 6A or FIG. 6B, having contact length $W_1$ and $W_2$, respectively.

In that regard, three-sided joint gasket sealing according to the present teachings creates uniform parallel alignment of gasket segments at terminal joint junctures from what would otherwise be orthogonally aligned gaskets, as shown in the case of FIG. 6A and FIG. 6B. Such uniform parallel alignment of the three-sided joint gasket sealing segments provides for applying a uniform lateral sealing force across the segments to promote an hermetic three-sided joint seal at the top and bottom corners of joints formed from wall frame members. Additionally, each segment of the uniformly aligned gasket segments for each three-sided joint seal is selected to be approximately the width of the structural components being joined, providing for a maximum length of contact of the uniformly aligned segments. Moreover, joint sealing according to the present teachings is designed with spacer plates that provide a uniform compression force across all vertical, horizontal, and three-sided gasket seals of a building joint. It may be argued that the width of the gasket material selected for conventional three-sided seals given for the examples of FIGS. 6A and 6B could be at least the width of structural components being joined.

Figure 7B:
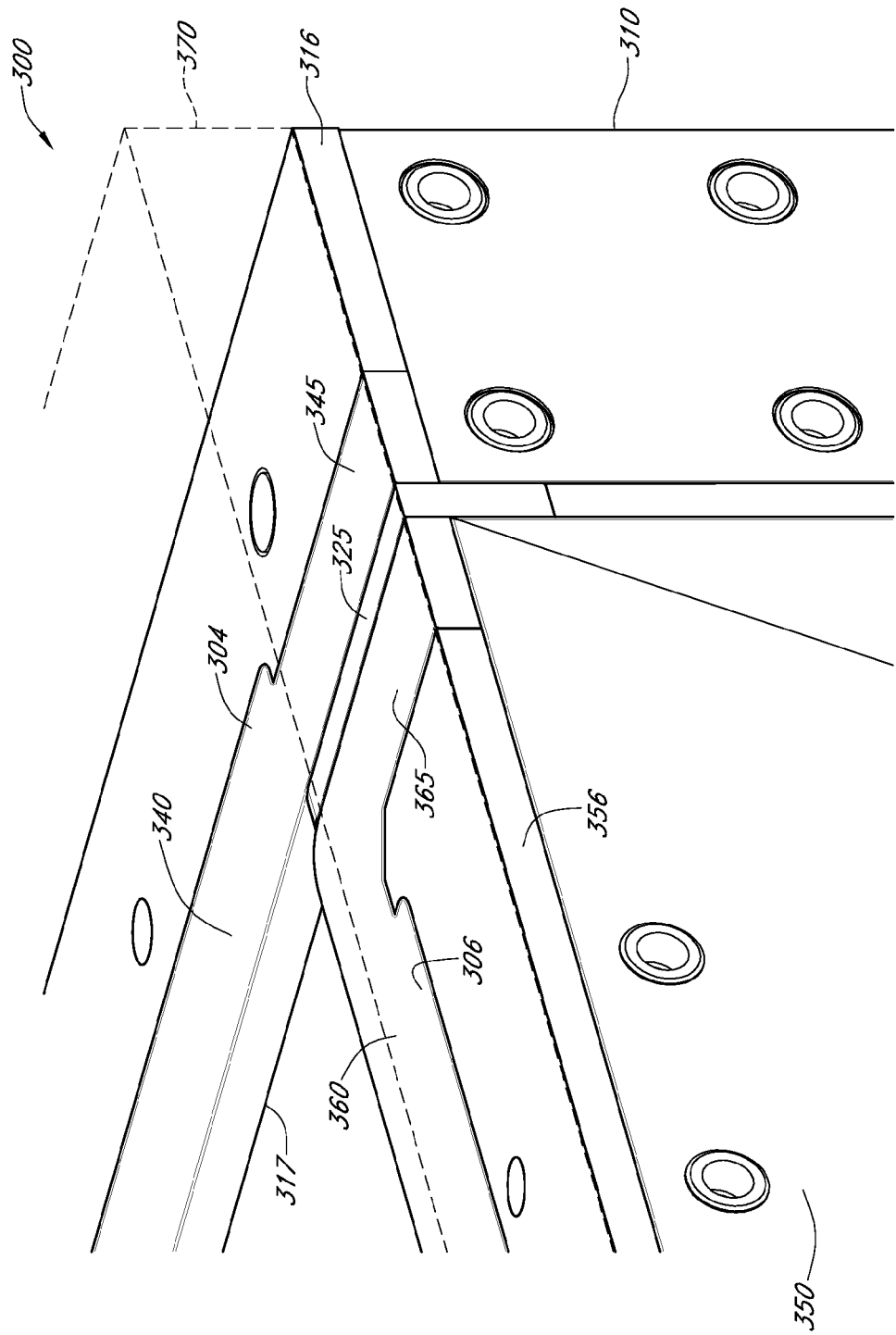

The exploded perspective view of FIG. 7A, depicts sealing assembly 300 according to the present teachings before all frame members have been joined, so that the gaskets are depicted in an uncompressed state. In FIG. 7A, a plurality of wall frame members, such as wall frame 310, wall frame 350, as well as ceiling frame 370 can be sealably joined in a first step of the construction of a gas enclosure from various components of a gas enclosure assembly. Frame member sealing according to the present teachings is a substantial part of providing that a gas enclosure assembly once fully constructed is hermetically sealed, as well as providing sealing that can be implemented through cycles of construction and deconstruction of a gas enclosure assembly. Though the example given in the following teachings for FIGS. 7A-7B are for the sealing of a portion of a gas enclosure assembly, such teachings apply to the entirety of any of a gas enclosure assembly of the present teachings.

First wall frame 310 depicted in FIG. 7A can have interior side 311 on which spacer plate 312 is mounted, vertical side 314, and top surface 315 on which spacer plate 316 is mounted. First wall frame 310 can have first gasket 320 disposed in and adhered to a space formed from spacer plate 312. Gap 302, remaining after first gasket 320 is disposed in and adhered to a space formed from spacer plate 312, can run a vertical length of first gasket 320, as shown in FIG. 7A. As depicted in FIG. 7A, compliant gasket 320 can be disposed in and adhered to the space formed from spacer plate 312, and can have vertical gasket length 321, curvilinear gasket length 323, and gasket length 325 that is formed 90° in plane to vertical gasket length 321 on interior frame member 311 and terminates at vertical side 314 of wall frame 310. In FIG. 7A, first wall frame 310 can have top surface 315 on which spacer plate 316 is mounted, thereby forming a space on surface 315 on which second gasket 340 is disposed in and adhered to proximal to inner edge 317 of wall frame 310. Gap 304, remaining after second gasket 340 is disposed in and adhered to a space formed from spacer plate 316, can run a horizontal length of second gasket 340, as shown in FIG. 7A. Further, as indicated by the hatched line, length 345 of gasket 340 is uniformly parallel and contiguously aligned with length 325 of gasket 320.

Second wall frame 350 depicted in FIG. 7A can have exterior frame side 353, vertical side 354, and top surface 355 on which spacer plate 356 is mounted. Second wall frame 350 can have first gasket 360 disposed in and adhered to first gasket a space, which is formed from spacer plate 356. Gap 306, remaining after first gasket 360 is disposed in and adhered to a space formed from spacer plate 356, can run a horizontal length of first gasket 360, as shown in FIG. 7A. As depicted in FIG. 7A, compliant gasket 360 can have horizontal length 361, curvilinear length 363, and length 365 that is formed 90° in plane on top surface 355 and terminates at exterior frame member 353.

As indicated in the exploded perspective view of FIG. 7A, interior frame member 311 of wall frame 310 can be joined to vertical side 354 of wall frame 350 to form one building joint of a gas enclosure frame assembly. Regarding the sealing of a building joint so formed, in various embodiments of gasket sealing at terminal joint junctures of wall frame members according to the present teachings as depicted in FIG. 7A, length 325 of gasket 320, length 365 of gasket 360 and length 345 of gasket 340 are all contiguously and uniformly aligned. Additionally, as will be discussed in more detail subsequently, various embodiments of a spacer plate of the present teachings can provide for a uniform compression of between about 20% to about 40% deflection of a compressible gasket material used for hermetically sealing various embodiments of a gas enclosure assembly of the present teachings.

FIG. 7B depicts sealing assembly 300 according to the present teachings after all frame members have been joined, so that the gaskets are depicted in a compressed state. FIG. 7B is perspective view that shows the detail of corner seal of a three-sided joint formed at the top terminal joint juncture between first wall frame 310, second wall frame 350 and ceiling frame 370; which is shown in phantom view. As shown in FIG. 7B, the gasket spaces defined by the spacer plates can be determined to be a width, such that upon joining wall frame 310, wall frame 350 and ceiling frame 370; shown in phantom view, a uniform compression of between about 20% to about 40% deflection of a compressible gasket material for forming vertical, horizontal, and three-sided gasket seals ensures that gasket sealing at all surfaces sealed at joints of wall frame members can provide hermetic sealing. Additionally gasket gaps 302, 304, and 306 (not shown) are dimensioned, so that upon optimal compression of between about 20% to about 40% deflection of a compressible gasket material, each gasket can fill a gasket gap as shown for gasket 340 and gasket 360 in FIG. 7B. As such, in addition to providing uniform compression by defining a space in which each gasket is disposed in and adhered to, various embodiments of a spacer plate designed to provide a gap also ensure that each compressed gasket can conform within the spaces defined by a spacer plate without wrinkling or bulging or otherwise irregularly forming in a compressed state in a fashion that could form leak paths.

According to various embodiments of a gas enclosure assembly of the present teachings, various types of section panels can be sealed using compressible gasket material disposed on each of a panel section frame. In conjunction with the frame member gasket sealing, the locations and materials of the compressible gaskets used to form seals between the various section panels and panel section frames can provide for an hermetically sealed gas enclosure assembly with little or no gas leakage. Additionally, the sealing design for all types of panels, such as inset panel 110, window panel 120 and readily-removable service window 130 of FIG. 5, can provide for durable panel sealing after repeated removal and installation of such panels that may be required as to access the interior of a gas enclosure assembly, for example, for maintenance.

Figure 8A:
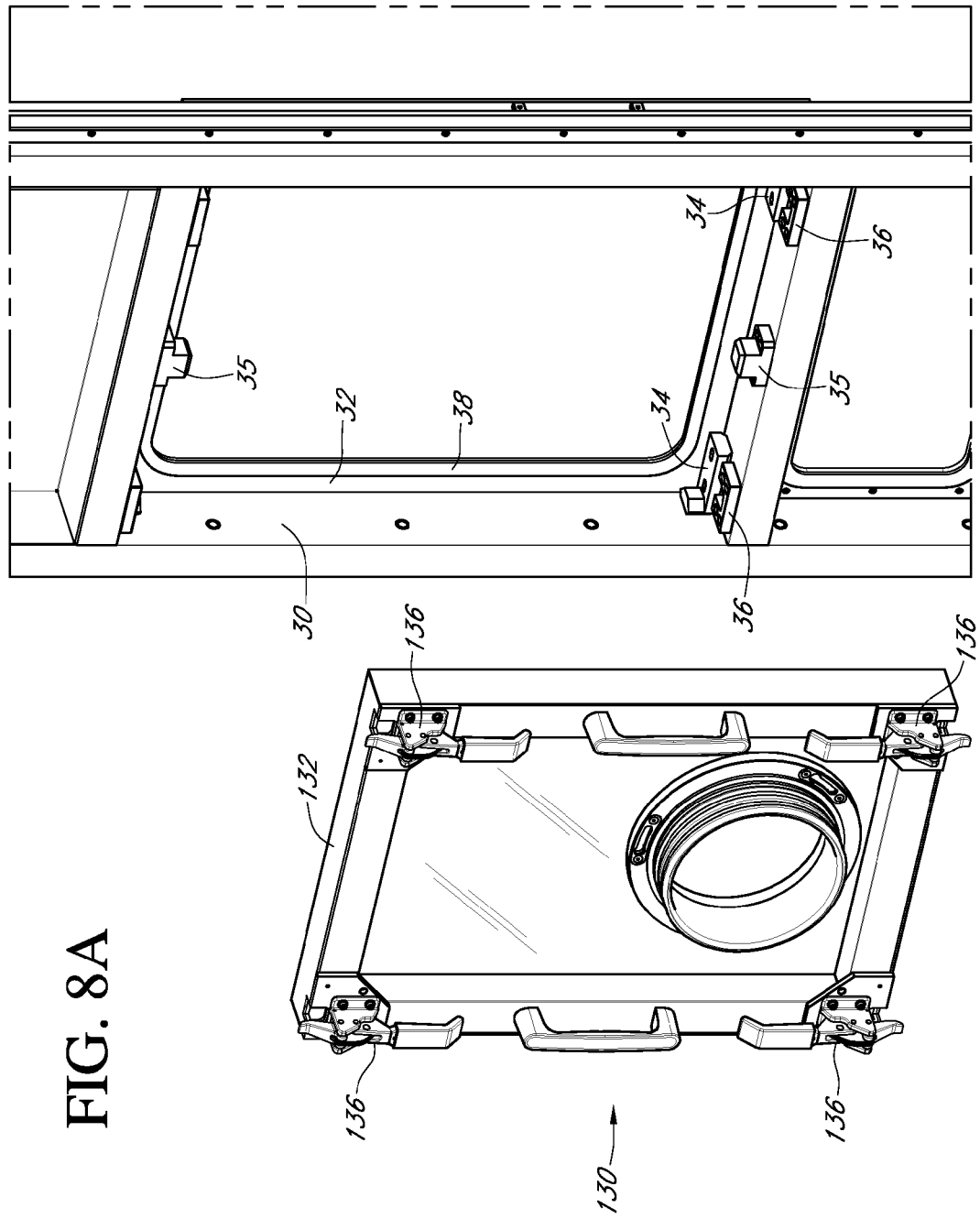
FIG. 8A and FIG. 8B are various views relating to sealing of a section panel for receiving a readily-removable service window according to various embodiments of a gas enclosure assembly of the present teachings.

For example, FIG. 8A, is an exploded view depicting service window panel section 30, and readily-removable service window 130. As previously discussed, service window panel section 30 can be fabricated for receiving readily-removable service window 130. For various embodiments of a gas enclosure assembly, a panel section, such as removable service panel section 30, can have panel section frame 32, as well as compressible gasket 38 disposed on panel section frame 32. In various embodiments, hardware related to fastening readily-removable service window 130 in removable service window panel section 30 can provide ease of installation and reinstallation to an end-user, and at the same time ensure that a gas-tight seal is maintained when readily-removable service window 130 is installed and reinstalled in panel section 30 as needed by an end-user requiring direct access to the interior of a gas enclosure assembly. Readily-removable service window 130 can include rigid window frame 132, which can be constructed from, for example, but not limited by, a metal tube material as described for constructing any of the frame members of the present teachings. Service window 130 can utilize quick-acting fastening hardware, for example, but not limited by reverse acting toggle clamp 136 in order to provide an end-user ready removal and reinstallation of service window 130.

Figure 8B:
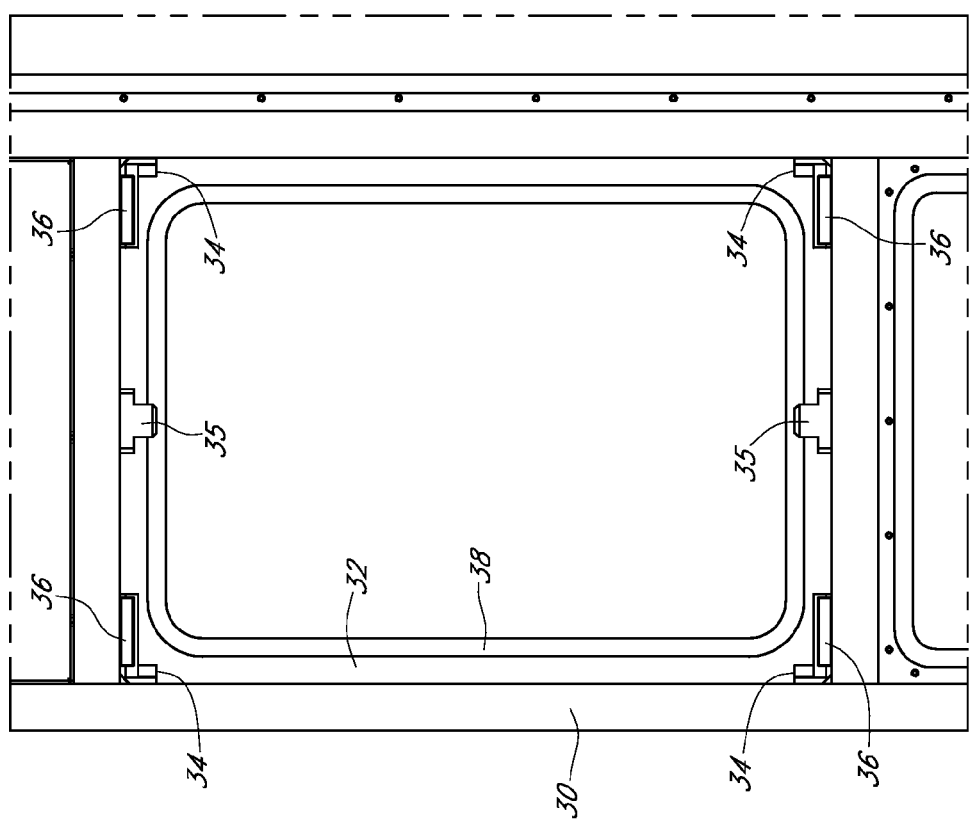

As shown in front view of removable service window panel section 30 of FIG. 8A, readily-removable service window 130 can have a set of four toggle clamps 136 secured on window frame 132. Service window 130 can be positioned into panel section frame 30 at a defined distance for insuring a proper compression force against gasket 38. Using a set of four window guide spacers 34, as shown in FIG. 8B, of which can be installed in each corner of panel section 30 for positioning service window 130 in panel section 30. A set of each of a clamping cleat 36 can be provided to receive reverse acting toggle clamp 136 of readily removable service window 130. According to various embodiments for the hermetic sealing of service window 130 through cycles of installation and removal, the combination of the mechanical strength of service window frame 132, in conjunction with the defined position of service window 130 provided by a set of window guide spacers 34 with respect to compressible gasket 38 can ensure that once service window 130 is secured in place with, for example, but not limited by, using reverse action toggle clamps 136 fastened in respective clamping cleats 36, service window frame 132 can provide an even force over panel section frame 32 with defined compression as set by a set of window guide spacers 34. The set of window guide spacers 34 are positioned so that the compression force of window 130 on gasket 38 deflects compressible gasket 38 between about 20% to about 40%. In that regard, the construction of service window 130, as well as fabrication of panel section 30 provide for a gas-tight seal of service window 130 in panel section 30. As previously discussed, window clamps 35 can be installed into panel section 30 after service window 130 is fastened into panel section 30, and removed when service window 130 needs to be removed.

Reverse acting toggle clamp 136 can be secured to a readily-removable service window frame 132 using any suitable means, as well as a combination of means. Examples of suitable securing means that can be used include at least one adhesive, for example, but not limited by an epoxy, or a cement, at least one bolt, at least one screw, at least one other fastener, at least one slot, at least one track, at least one weld, and a combination thereof. Reverse acting toggle clamp 136 can be directly connected to removable service window frame 132 or indirectly through an adaptor plate. Reverse acting toggle clamp 136, clamping cleat 36, window guide spacer 34, and window clamp 35 can be constructed of any suitable material, as well as a combination of materials. For example, one or more such elements can comprise at least one metal, at least one ceramic, at least one plastic, and a combination thereof.

In addition to sealing a readily-removable service window, gas-tight sealing can also be provided for inset panels and window panels. Other types of section panels that can be repeatedly installed and removed in panel sections include, for example, but not limited by, inset panels 110 and window panels 120, as shown in FIG. 5. As can be seen in FIG. 5, panel frame 122 of window panel 120 is constructed similarly to inset panel 110. As such, according to various embodiments of a gas enclosure assembly, the fabrication of panel sections for receiving inset panels and window panels can be the same. In that regard, the sealing of inset panels and window panel can be implemented using the same principles.

Figure 9B:
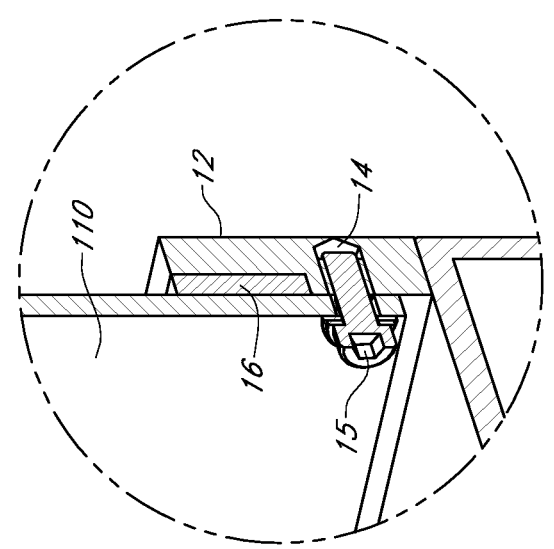
FIG. 9A and FIG. 9B are enlarged perspective section views relating to sealing of a section panel for receiving an inset panel or window panel according to various embodiments of the present teachings.
Figure 9A:
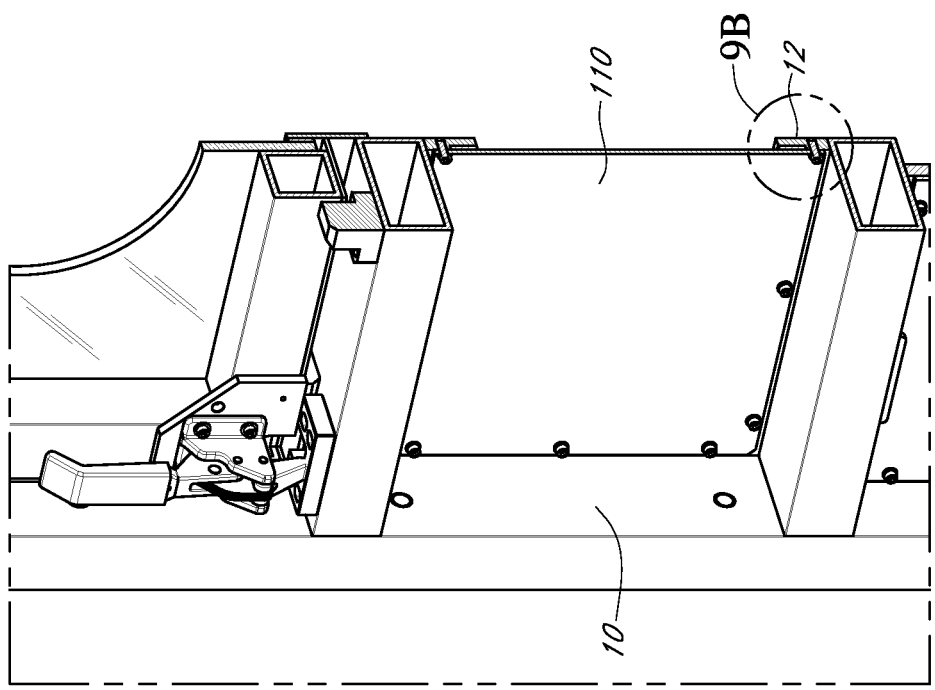

With reference to FIG. 9A and FIG. 9B, and according to various embodiments of the present teachings, any of the panels of gas enclosure, such as gas enclosure assembly 100 of FIG. 1, can include one or more inset panel sections 10, which can have frames 12 configured to receive a respective inset panel 110. FIG. 9A is a perspective view indicating an enlarged portion shown in FIG. 9B. In FIG. 9A inset panel 110 is depicted positioned with respect to inset frame 12. As can be seen in FIG. 9B, inset panel 110 is affixed to frame 12, where frame 12 can be, for example, constructed of a metal. In some embodiments, the metal can comprise aluminum, steel, copper, stainless steel, chromium, an alloy, and combinations thereof, and the like. A plurality of a blind tapped hole 14 can be made in inset panel section frame 12. Panel section frame 12 is constructed so as to comprise a gasket 16 between inset panel 110 and frame 12, in which compressible gasket 18 can be disposed. Blind tapped hole 14 can be of the M5 variety. Screw 15 can be received by blind tapped hole 14, compressing gasket 16 between inset panel 110 and frame 12. Once fastened into place against gasket 16, inset panel 110 forms a gas-tight seal within inset panel section 10. As previously discussed, such panel sealing can be implemented for a variety of section panels, including, but not limited by, inset panels 110 and window panels 120, as shown in FIG. 5.

According to various embodiments of compressible gaskets according to the present teachings, compressible gasket material for frame member sealing and panel sealing can be selected from a variety of compressible polymeric materials, for example, but not limited by, any in the class of closed-cell polymeric materials, also referred to in the art as expanded rubber materials or expanded polymer materials. Briefly, a closed-cell polymer is prepared in a fashion whereby gas is enclosed in discrete cells; where each discrete cell is enclosed by the polymeric material. Properties of compressible closed-cell polymeric gasket materials that are desirable for use in gas-tight sealing of frame and panel components include, but are not limited by, that they are robust to chemical attack over a wide range of chemical species, possess excellent moisture-barrier properties, are resilient over a broad temperature range, and they are resistant to a permanent compression set. In general, compared to open-cell-structured polymeric materials, closed-cell polymeric materials have higher dimensional stability, lower moisture absorption coefficients, and higher strength.

Various types of polymeric materials from which closed-cell polymeric materials can be made include, for example, but not limited by, silicone, neoprene, ethylene-propylene-diene terpolymer (EPT); polymers and composites made using ethylene-propylene-diene-monomer (EPDM), vinyl nitrile, styrene-butadiene rubber (SBR), and various copolymers and blends thereof.

The desirable material properties of closed-cell polymers are maintained only if the cells comprising the bulk material remain intact during use. In that regard, using such material in a fashion that can exceed material specifications set for a closed-cell polymer, for example, exceeding the specification for use within a prescribed temperature or compression range may cause degradation of a gasket seal. In various embodiments of closed-cell polymer gaskets used for sealing frame members and section panels in frame panel sections, compression of such materials should not exceed between about 50% to about 70% deflection, and for optimal performance can be between about 20% to about 40% deflection.

In addition to close-cell compressible gasket materials, another example of a class of compressible gasket material having desired attributes for use in constructing embodiments of a gas enclosure assembly according to the present teachings includes the class of hollow-extruded compressible gasket materials. Hollow-extruded gasket materials as a class of materials have the desirable attributes, including, but not limited by, that they are robust to chemical attack over a wide range of chemical species, possess excellent moisture-barrier properties, are resilient over a broad temperature range, and they are resistant to a permanent compression set. Such hollow-extruded compressible gasket materials can come in a wide variety of form factors, such as for example, but not limited by, U-cell, D-cell, square-cell, rectangular-cell, as well as any of a variety of custom form factor hollow-extruded gasket materials. Various hollow-extruded gasket materials can be fabricated from polymeric materials that are used for closed-cell compressible gasket fabrication. For example, but not limited by, various embodiments of hollow-extruded gaskets can be fabricated from silicone, neoprene, ethylene-propylene-diene terpolymer (EPT); polymers and composites made using ethylene-propylene-diene-monomer (EPDM), vinyl nitrile, styrene-butadiene rubber (SBR), and various copolymers and blends thereof. Compression of such hollow cell gasket materials should not exceed about 50% deflection in order to maintain the desired attributes.

While the class of close-cell compressible gasket materials and the class of hollow-extruded compressible gasket materials have been given as examples, any compressible gasket material having the desired attributes can be used for sealing structural components, such as various wall and ceiling frame members, as well as sealing various panels in panel section frames, as provided by the present teachings.

Figure 10:
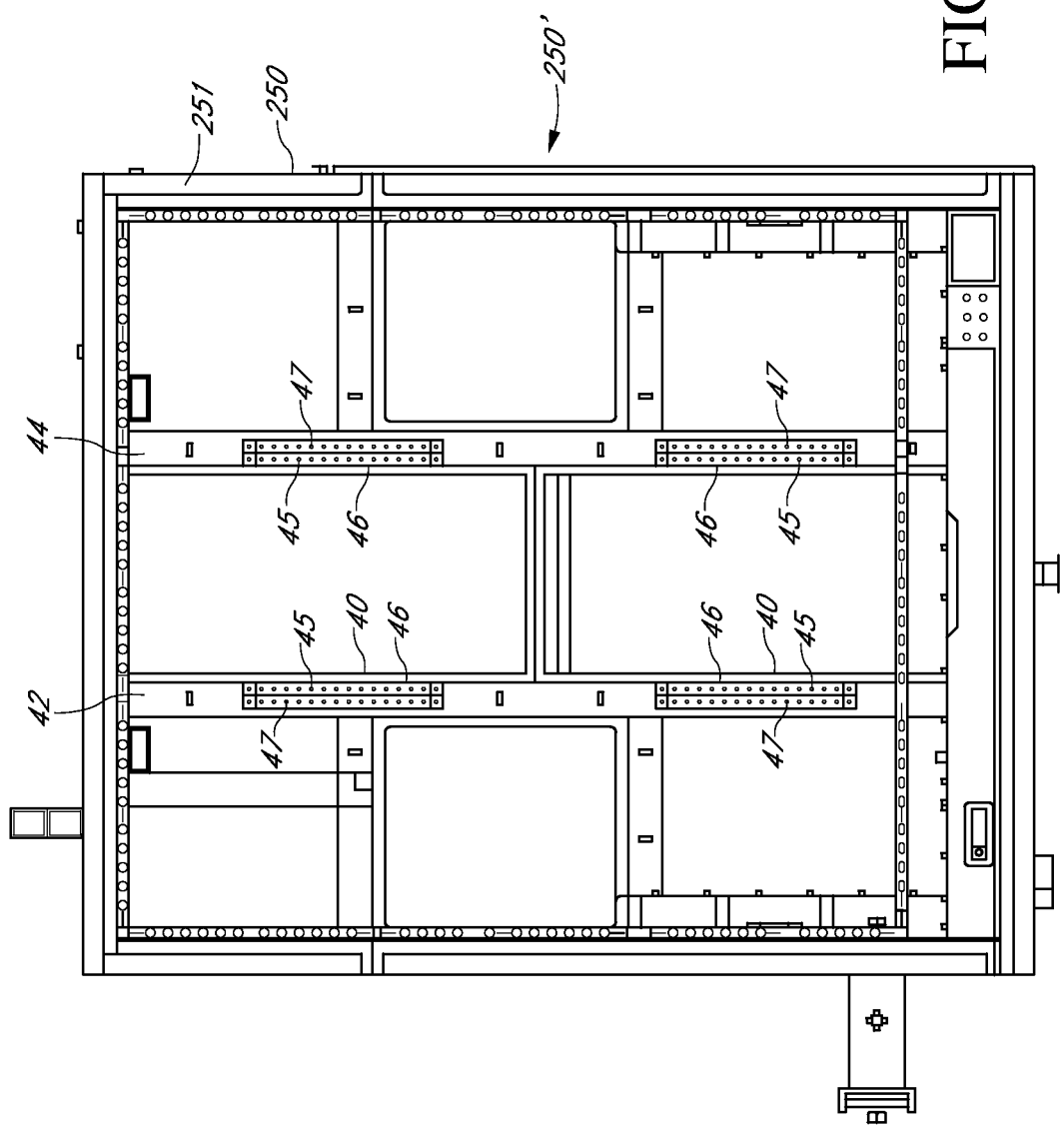
FIG. 10 is a view of a ceiling including a lighting system for various embodiments of a gas enclosure system in accordance with the present teachings.

FIG. 10 is a bottom view of various embodiments of a ceiling panel of the present teaching, for example, such as ceiling panel 250' of gas enclosure assembly 100 of FIG. 3. According to various embodiments of the present teachings for the assembly of a gas enclosure, lighting can be installed on the interior top surface of a ceiling panel, such as ceiling panel 250' of gas enclosure assembly 100 of FIG. 3. As depicted in FIG. 10, ceiling frame 250, having interior portion 251, can have lighting installed on the interior portion of various frame members. For example, ceiling frame 250 can have two ceiling frame sections 40, which have in common two ceiling frame beams 42 and 44. Each ceiling frame section 40 can have a first side 41, positioned towards the interior of ceiling frame 250, and a second side 43, positioned towards the exterior of ceiling frame 250. For various embodiments according to the present teaching of providing lighting for a gas enclosure system, pairs of lighting elements 46 can be installed. Each pair of lighting elements 46 can include a first lighting element 45, proximal to first side 41 and second lighting element 47 proximal to second side 43 of a ceiling frame section 40. The number, positioning, and grouping of lighting elements shown in FIG. 10 are exemplary. The number and grouping of lighting elements can be varied in any desired or suitable manner. In various embodiments, the lighting elements can be mounted flat, while in other embodiments that can be mounted so that they can be moved to a variety of positions and angles. The placement of lighting elements is not limited to the top panel ceiling 433 but can located, in addition or in the alternative, on any other interior surface, exterior surface, and combination of surfaces of gas enclosure assembly 100 shown in FIG. 3.

Figure 11:
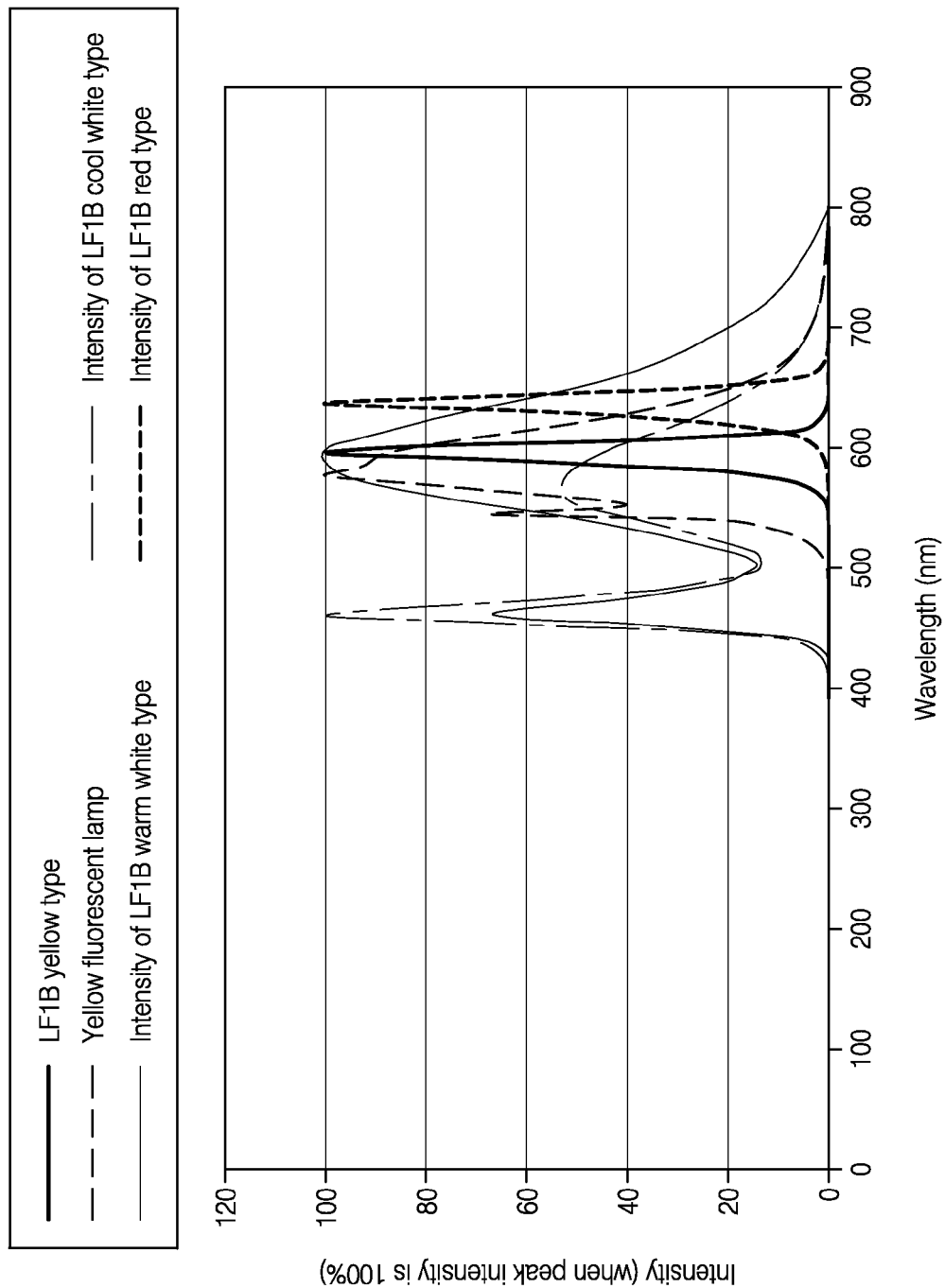
FIG. 11 is a graph depicting a LED light spectrum of a lighting system for various embodiments of a gas enclosure in accordance with the present teachings.

The various lighting elements can comprise any number, type, or combination of lights, for example, halogen lights, white lights, incandescent lights, arc lamps, or light emitting diodes or devices (LEDs). For example, each lighting element can comprise from 1 LED to about 100 LEDs, from about 10 LEDs to about 50 LEDs, or greater than 100 LEDs. LED or other lighting devices can emit any color or combination of colors in the color spectrum, outside the color spectrum, or a combination thereof. According to various embodiments of a gas enclosure assembly used for inkjet printing of OLED materials, as some materials are sensitive to some wavelengths of light, a wavelength of light for lighting devices installed in a gas enclosure assembly can be specifically selected to avoid material degradation during processing. For example, a 4× cool white LED can be used as can a 4× yellow LED or any combination thereof. An example of a 4× cool white LED is an LF1B-D4S-2THWW4 available from IDEC Corporation of Sunnyvale, Calif. An example of a 4× yellow LED that can be used is an LF1B-D4S-2SHY6 also available from IDEC Corporation. LEDs or other lighting elements can be positioned or hung from any position on interior portion 251 of ceiling frame 250 or on another surface of a gas enclosure assembly. Lighting elements are not limited to LEDs. Any suitable lighting element or combination of lighting elements can be used. FIG. 11 is a graph of an IDEC LED light spectra and shows the X-axis corresponding to intensity when peak intensity is 100% and the Y-axis corresponding to wavelength in nanometers. Spectra for LF1B yellow type, a yellow fluorescent lamp, a LF1B white type LED, a LF1B cool white type LED, and an LF1B red type LED are shown. Other light spectra and combinations of light spectra can be used in accordance with various embodiments of the present teachings.

A gas enclosure system according to the present teachings can have a gas circulation and filtration system internal a gas enclosure assembly. Such an internal filtration system can have a plurality of fan filter units within the interior, and can be configured to provide a laminar flow of gas within the interior. The laminar flow can be in a direction from a top of the interior to a bottom of the interior, or in any other direction. Although a flow of gas generated by a circulating system need not be laminar, a laminar flow of gas can be used to ensure thorough and complete turnover of gas in the interior. A laminar flow of gas can also be used to minimize turbulence, such turbulence being undesirable as it can cause particles in the environment to collect in such areas of turbulence, preventing the filtration system from removing those particles from the environment.

Figure 12:
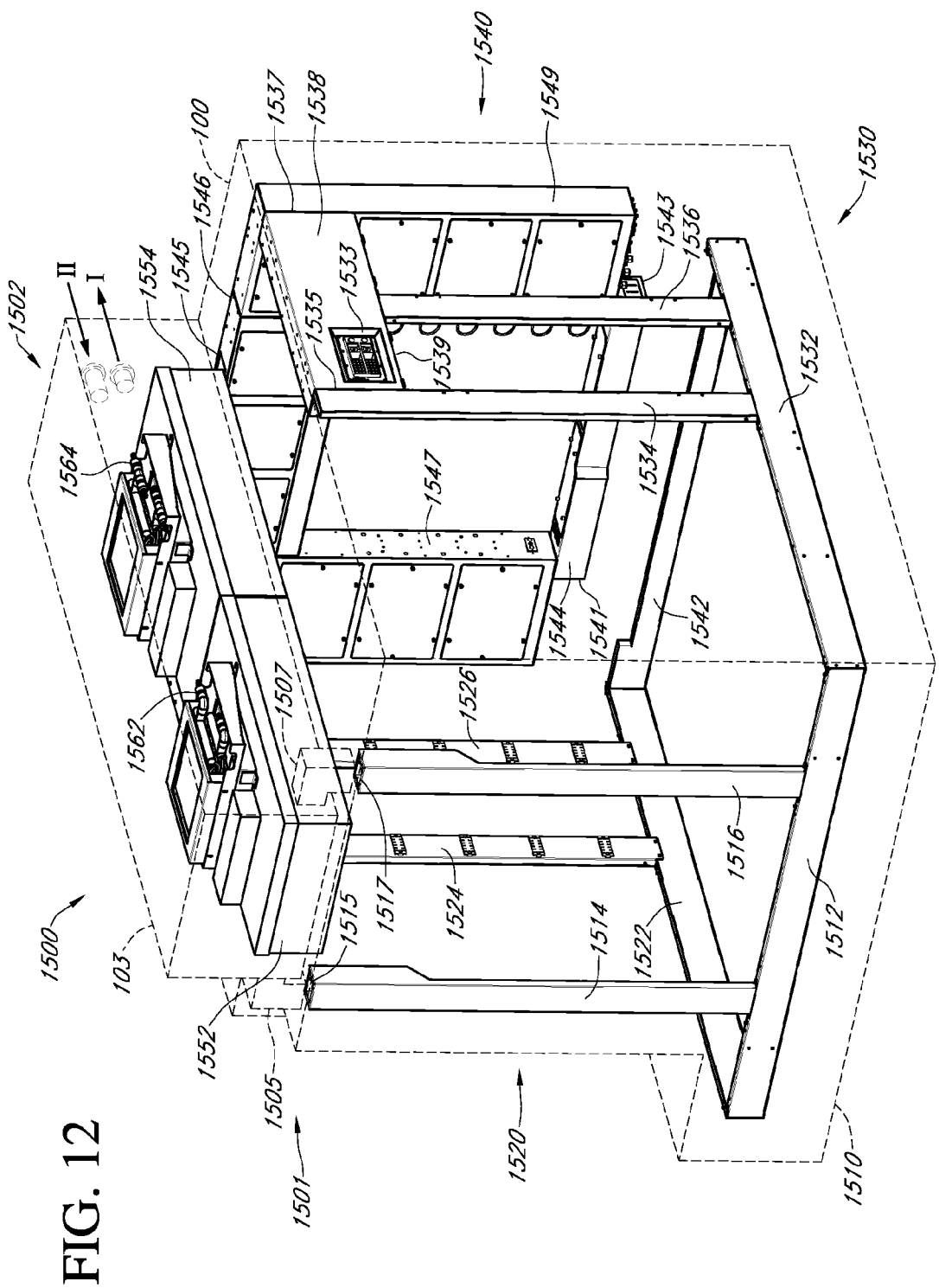
FIG. 12 is a phantom front perspective view of a gas enclosure assembly, which depicts ductwork installed in the interior of a gas enclosure assembly in accordance with various embodiments of the present teachings.

FIG. 12 depicts a right front phantom perspective view of circulation and filtration system 1500, which can include ductwork assembly 1501 and fan filter unit assembly 1502 of gas enclosure assembly 100. Enclosure ductwork assembly 1501 can have front wall panel ductwork assembly 1510. As shown front wall panel ductwork assembly 1510 can have front wall panel inlet duct 1512, first front wall panel riser 1514 and second front wall panel riser 1516, both of which are in fluid communication with front wall panel inlet duct 1512. First front wall panel riser 1514 is shown having outlet 1515, which is sealably engaged with ceiling duct 1505 of fan filter unit cover 103. In a similar fashion, second front wall panel riser 1516 is shown having outlet 1517, which is sealably engaged with ceiling duct 1507 of fan filter unit cover 103. In that regard, front wall panel ductwork assembly 1510 provides for circulating inert gas within a gas enclosure system from the bottom, utilizing front wall panel inlet duct 1512, through each front wall panel riser, 1514 and 1516, and delivering the air through outlets 1505 and 1507, respectively, so that the air can be filtered by, for example, fan filter unit 1552 of fan filter unit assembly 1502. Proximal fan filter unit 1552 is heat exchanger 1562, which as part of a thermal regulation system, can maintain inert gas circulating through gas enclosure assembly 100 at a desired temperature.

Right wall panel ductwork assembly 1530 can have right wall panel inlet duct 1532, which is in fluid communication with right wall panel upper duct 1538 through right wall panel first riser 1534 and right wall panel second riser 1536. Right wall panel upper duct 1538, can have first duct inlet end 1535 and second duct outlet end 1537, which second duct outlet end 1537 is in fluid communication with rear wall panel upper duct 1546 of rear wall ductwork assembly 1540. Left wall panel ductwork assembly 1520 can have the same components as described for right wall panel assembly 1530, of which left wall panel inlet duct 1522, which is in fluid communication with left wall panel upper duct (not shown) through first left wall panel riser 1524 and first left wall panel riser 1524 are apparent in FIG. 12. Rear wall panel ductwork assembly 1540 can have rear wall panel inlet duct 1542, which is in fluid communication with left wall panel assembly 1520 and right wall panel assembly 1530. Additionally, rear wall panel ductwork assembly 1540, can have rear wall panel bottom duct 1544, which can have rear wall panel first inlet 1541 and rear wall panel second inlet 1543. Rear wall panel bottom duct 1544 can be in fluid communication with rear wall panel upper duct 1546 via first bulkhead 1547 and second bulkhead 1549, which bulkhead structures can be used to feed, for example, but not limited by, various bundles of cables, wires, and tubings and the like, from the exterior of gas enclosure assembly 100 into the interior. Duct opening 1533 provides for moving bundles of cables, wires, and tubings and the like, out of rear wall panel upper duct 1546, which can be passed through rear wall panel upper duct 1546 via bulkhead 1549. Bulkhead 1547 and bulkhead 1549 can be hermetically sealed on the exterior using a removable inset panel, as previously described. Rear wall panel upper duct is in fluid communication with, for example, but not limited by, fan filter unit 1554 through vent 545, of which a corner is shown in FIG. 12. In that regard, left wall panel ductwork assembly 1520, right wall panel ductwork assembly 1530, and rear wall panel ductwork assembly 1540 provide for circulating inert gas within a gas enclosure assembly from the bottom, utilizing wall panel inlet ducts 1522, 1532, and 1542, respectively, as well as rear panel lower duct 1544, which are in fluid communication with vent 1545 through various risers, ducts, bulkhead passages, and the like as previously described. Accordingly, air can be filtered by, for example, fan filter unit 1554 of fan filter unit assembly 1502 of circulation and filtration system 1500. Proximal fan filter unit 1554 is heat exchanger 1564, which as part of a thermal regulation system, can maintain inert gas circulating through gas enclosure assembly 100 at a desired temperature. As will be discussed in more detail subsequently, the number, size and shape of fan filter units for a fan filter unit assembly, such as fan filter unit assembly 1502 including fan filter unit 1552 and 1554 of circulation and filtration system 1500, can be selected in accordance with the physical position of a substrate in a printing system during processing. The number, size and shape of fan filter units for a fan filter unit assembly selected with respect to the physical travel of a substrate can provide a low-particle zone proximal a substrate during a substrate manufacturing process.

In FIG. 12, cable feed through opening 1533 is shown. As will be discussed in more detail subsequently, various embodiments of a gas enclosure assembly of the present teachings provide for bringing bundles of cables, wires, and tubings and the like through ductwork. In order to eliminate leak paths formed around such bundles, various approaches for sealing differently sized cables, wires, and tubings in a bundle using conforming material can be used. Also shown in FIG. 12 for enclosure ductwork assembly 1501 is conduit I and conduit II, which are shown as part of fan filter unit cover 103. Conduit I provides an outlet of inert gas to an external gas purification system, while conduit II provides a return of purified inert gas to the circulation and filtration loop internal gas enclosure assembly 100.

Figure 13:
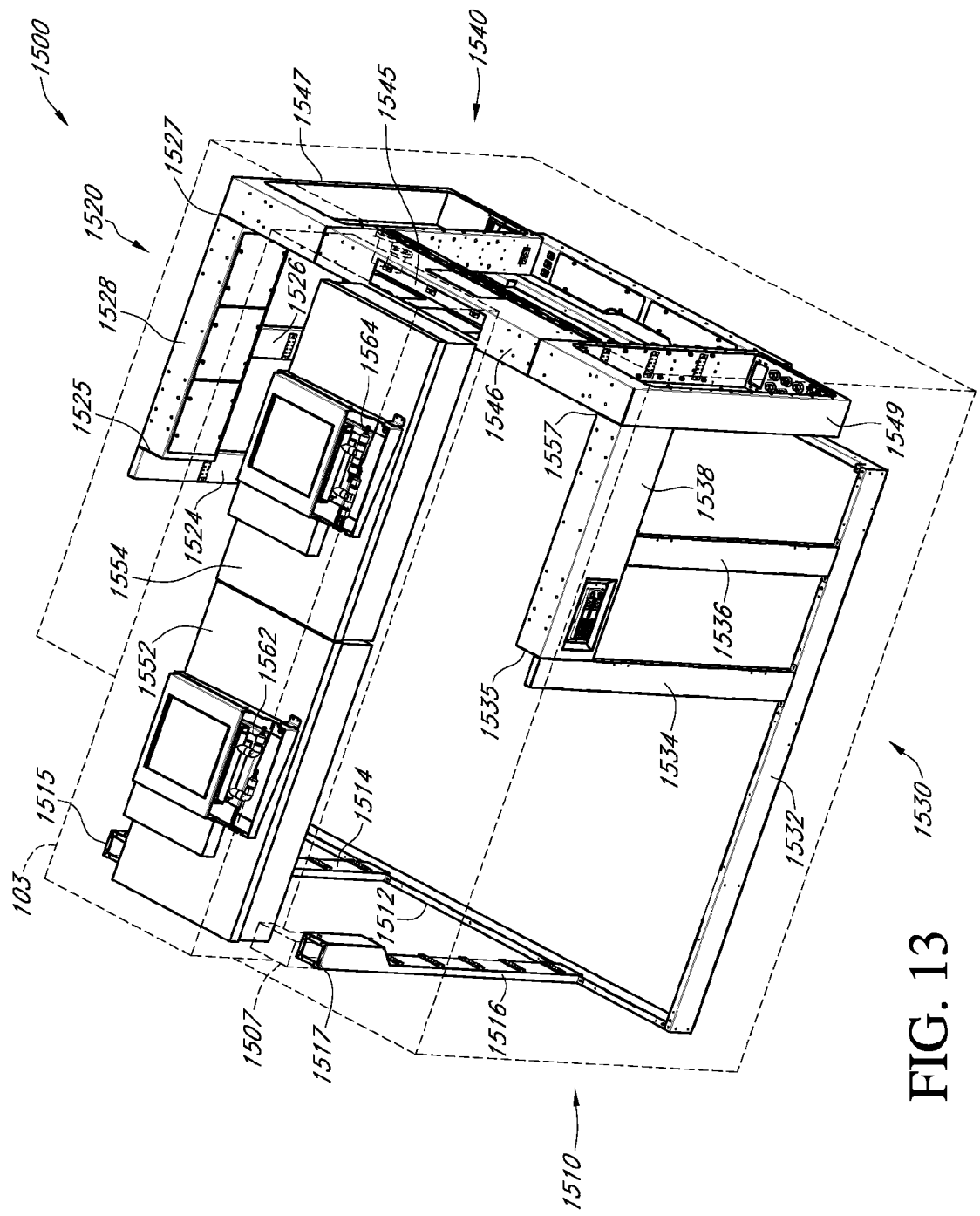
FIG. 13 is a phantom top perspective view of a gas enclosure assembly, which depicts ductwork installed in the interior of a gas enclosure assembly in accordance with various embodiments of the present teachings.

In FIG. 13, a top phantom perspective view of enclosure ductwork assembly 1501 is shown. The symmetric nature of left wall panel ductwork assembly 1520 and right wall panel ductwork assembly 1530 can be seen. For right wall panel ductwork assembly 1530, right wall panel inlet duct 1532, is in fluid communication with right wall panel upper duct 1538 through right wall panel first riser 1534 and right wall panel second riser 1536. Right wall panel upper duct 1538, can have first duct inlet end 1535 and second duct outlet end 1537, which second duct outlet end 1537 is in fluid communication with rear wall panel upper duct 1546 of rear wall ductwork assembly 1540. Similarly, left wall panel ductwork assembly 1520 can have left wall panel inlet duct 1522, which is in fluid communication with left wall panel upper duct 1528 through left wall panel first riser 1524 and left wall panel second riser 1526. Left wall panel upper duct 1528, can have first duct inlet end 1525 and second duct outlet end 1527, which second duct outlet end 1527 is in fluid communication with rear wall panel upper duct 1546 of rear wall ductwork assembly 1540. Additionally, rear wall panel ductwork assembly can have rear wall panel inlet duct 1542, which is in fluid communication with left wall panel assembly 1520 and right wall panel assembly 1530. Additionally, rear wall panel ductwork assembly 1540, can have rear wall panel bottom duct 1544, which can have rear wall panel first inlet 1541 and rear wall panel second inlet 1543. Rear wall panel bottom duct 1544 can be in fluid communication with rear wall panel upper duct 1546 via first bulkhead 1547 and second bulkhead 1549. Ductwork assembly 1501 as shown in FIG. 12 and FIG. 13 can provide effective circulation of inert gas from front wall panel ductwork assembly 1510, which circulates inert gas from front wall panel inlet duct 1512 to ceiling panel ducts 1505 and 1507 via front wall panel outlets 1515 and 1517, respectively, as well as from left wall panel assembly 1520, right wall panel assembly 1530 and rear wall panel ductwork assembly 1540, which circulate air from inlet ducts 1522, 1532, and 1542, respectively to vent 1545. Once inert gas is exhausted via ceiling panel ducts 1505 and 1507 and vent 1545 into the enclosure area under fan filter unit cover 103 of enclosure 100, the inert gas so exhausted can be filtered through fan filter units 1552 and 1554 of fan filter unit assembly 1502. Additionally, the circulated inert gas can be maintained at a desired temperature by heat exchangers 1562 and 1564, which are part of a thermal regulation system.

Figure 14:
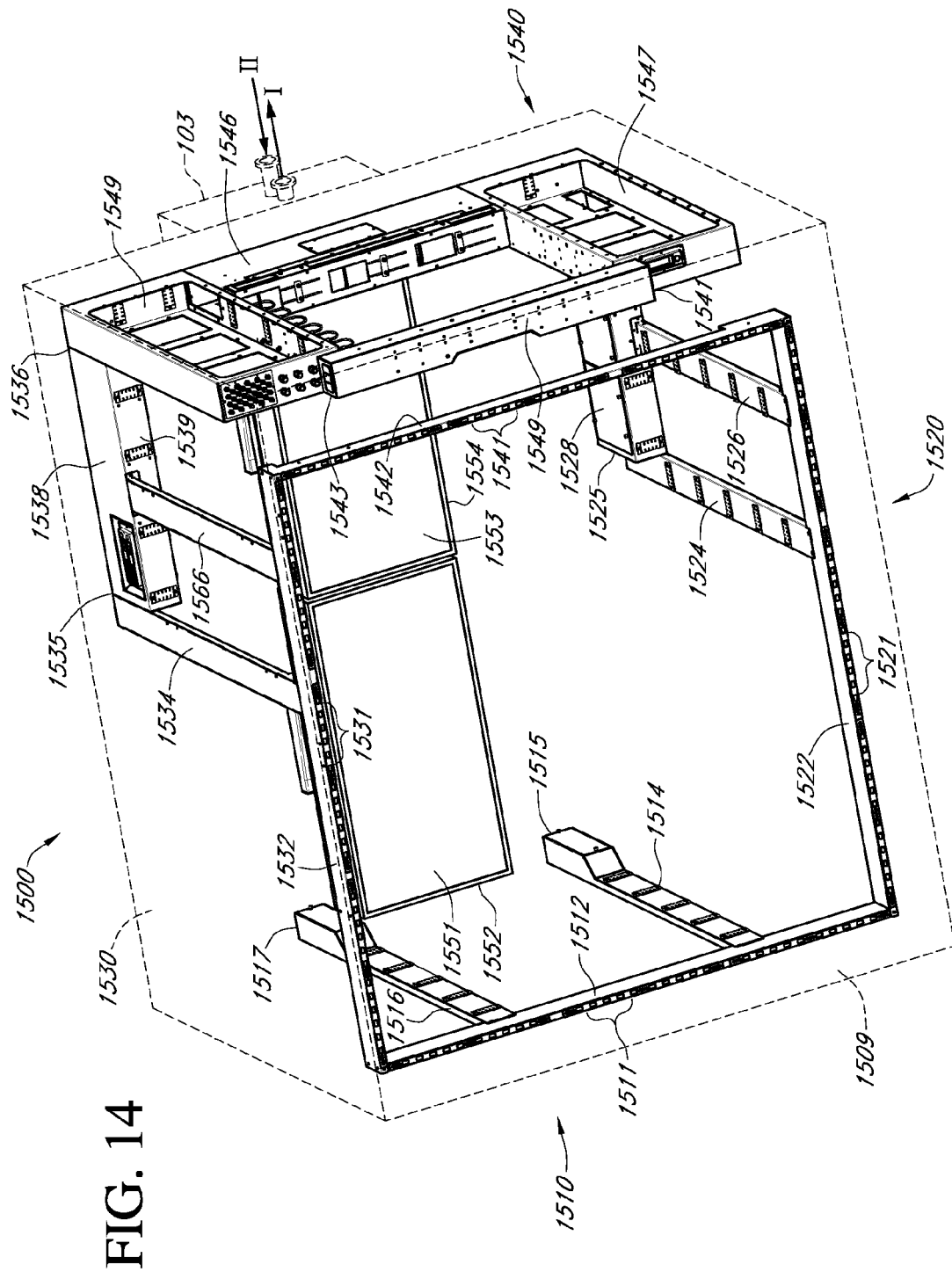
FIG. 14 is a phantom bottom perspective view of a gas enclosure assembly, which depicts ductwork installed in the interior of a gas enclosure assembly in accordance with various embodiments of the present teachings.

FIG. 14 is a bottom phantom view of enclosure ductwork assembly 1501. Inlet ductwork assembly 1509 includes front wall panel inlet duct 1512, left wall panel inlet duct 1522, right wall panel inlet duct 1532, and rear wall panel inlet duct 1542, which are in fluid communication with one another. As previously discussed, conduit I provides an outlet of inert gas to an external gas purification system, while conduit II provides a return of purified inert gas to the circulation and filtration loop internal to gas enclosure assembly 100.

For each inlet duct included in inlet ductwork assembly 1509, there are apparent openings evenly distributed across the bottom of each duct, sets of which are specifically highlighted for the purpose of the present teachings, as openings 1504 of front wall panel inlet duct 1512, openings 1521 of left wall panel inlet duct 1522, openings 1531 of right wall panel inlet duct 1532, and openings 1541 of right wall panel inlet duct 1542. Such openings, as are apparent across the bottom of each inlet duct, provide for effective uptake of inert gas within enclosure 100 for continual circulation and filtration. The continual circulation and filtration of inert gas various embodiments of a gas enclosure assembly are a part of a particle control system that can provide for maintaining a substantially particle-free environment within various embodiments of a gas enclosure system. Various embodiments of a gas circulation and filtration system can be designed to provide a low particle environment for airborne particulates meeting the standards of International Standards Organization Standard (ISO) 14644-1:1999, "Cleanrooms and associated controlled environments—Part 1: Classification of air cleanliness," as specified by Class 1 through Class 5.

In addition to a gas enclosure system utilizing a gas circulation and filtration system to provide a laminar flow of gas, ensuring a thorough and complete turnover of gas in the interior, a thermal regulation system utilizing a plurality of heat exchangers can be provided to maintain a desired temperature in the interior. For example, a plurality of heat exchangers can be provided operating with, adjacent to, or used in conjunction with, a fan or another gas circulating device. A gas purification loop can be configured to circulate gas from within the interior of a gas enclosure assembly through at least one gas purification component exterior the enclosure. In that regard, a circulation and filtration system internal a gas enclosure assembly in conjunction with a gas purification loop external a gas enclosure assembly can provide continuous circulation of a substantially low-particulate inert gas having substantially low levels of reactive species throughout a gas enclosure system. Various embodiments of a gas enclosure system having a gas purification system can be configured to maintain very low levels of undesired components, for example, organic solvents and vapors thereof, as well as water, water vapor, oxygen, and the like.

Figure 15:
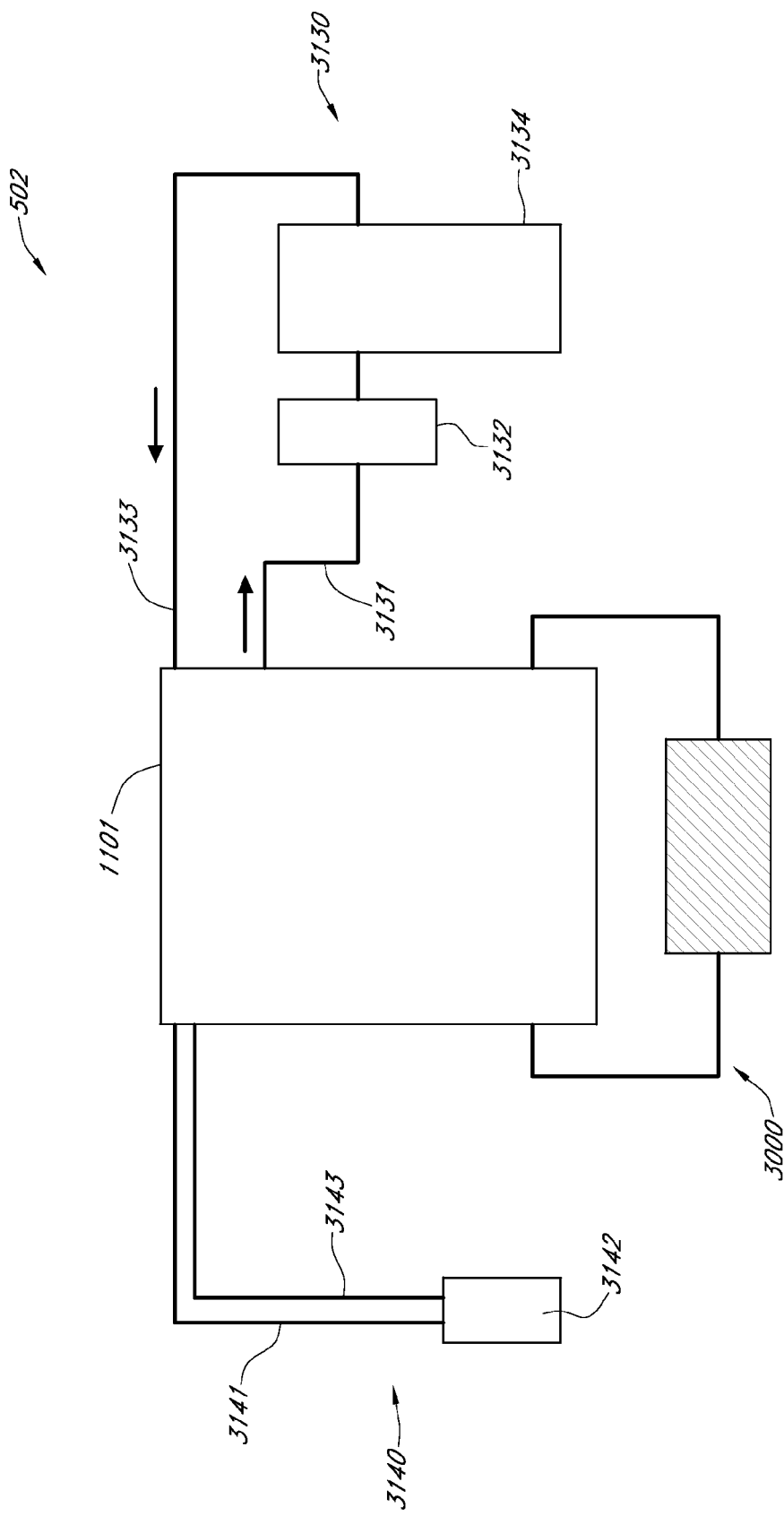
FIG. 15 is a schematic of a gas enclosure system in accordance with various embodiments of the present teachings.

FIG. 15 is a schematic diagram showing a gas enclosure system 502. Various embodiments of a gas enclosure system 502 according to the present teachings can comprise gas enclosure assembly 1101 for housing a printing system, gas purification loop 3130 in fluid communication gas enclosure assembly 1101, and at least one thermal regulation system 3140. Additionally, various embodiments of gas enclosure system 502 can have pressurized inert gas recirculation system 3000, which can supply inert gas for operating various devices, such as a substrate floatation table for an OLED printing system. Various embodiments of a pressurized inert gas recirculation system 3000 can utilize a compressor, a blower and combinations of the two as sources for various embodiments of pressurized inert gas recirculation system 3000, as will be discussed in more detail subsequently. Additionally, gas enclosure system 502 can have a circulation and filtration system internal to gas enclosure system 502 (not shown).

As depicted in FIG. 15, for various embodiments of a gas enclosure assembly according to the present teachings, the design of the ductwork can separate the inert gas circulated through gas purification loop 3130 from the inert gas that is continuously filtered and circulated internally for various embodiments of a gas enclosure assembly. Gas purification loop 3130 includes outlet line 3131 from gas enclosure assembly 1101, to a solvent removal component 3132 and then to gas purification system 3134. Inert gas purified of solvent and other reactive gas species, such as oxygen and water vapor, are then returned to gas enclosure assembly 1101 through inlet line 3133. Gas purification loop 3130 may also include appropriate conduits and connections, and sensors, for example, oxygen, water vapor and solvent vapor sensors. A gas circulating unit, such as a fan, blower or motor and the like, can be separately provided or integrated, for example, in gas purification system 3134, to circulate gas through gas purification loop 3130. According to various embodiments of a gas enclosure assembly, though solvent removal system 3132 and gas purification system 3134 are shown as separate units in the schematic shown in FIG. 15, solvent removal system 3132 and gas purification system 3134 can be housed together as a single purification unit.

Gas purification loop 3130 of FIG. 15 can have solvent removal system 3132 placed upstream of gas purification system 3134, so that inert gas circulated from gas enclosure assembly 1101 passes through solvent removal system 3132 via outlet line 3131. According to various embodiments, solvent removal system 3132 may be a solvent trapping system based on adsorbing solvent vapor from an inert gas passing through solvent removal system 3132 of FIG. 15. A bed or beds of a sorbent, for example, but not limited by, such as activated charcoal, molecular sieves, and the like, may effectively remove a wide variety of organic solvent vapors. For various embodiments of a gas enclosure system cold trap technology may be employed to remove solvent vapors in solvent removal system 3132. As previously mentioned, for various embodiments of a gas enclosure system according to the present teachings, sensors, such as oxygen, water vapor and solvent vapor sensors, may be used to monitor the effective removal of such species from inert gas continuously circulating through a gas enclosure system, such as gas enclosure system 502 of FIG. 15. Various embodiments of a solvent removal system can indicate when sorbent, such as activated carbon, molecular sieves, and the like, has reached capacity, so that the bed or beds of sorbent can be regenerated or replaced. Regeneration of a molecular sieve can involve heating the molecular sieve, contacting the molecular sieve with a forming gas, a combination thereof, and the like. Molecular sieves configured to trap various species, including oxygen, water vapor, and solvents, can be regenerated by heating and exposure to a forming gas that comprises hydrogen, for example, a forming gas comprising about 96% nitrogen and 4% hydrogen, with said percentages being by volume or by weight. Physical regeneration of activated charcoal can be done using a similar procedure of heating under an inert environment.

Any suitable gas purification system can be used for gas purification system 3134 of gas purification loop 3130 of FIG. 15. Gas purification systems available, for example, from MBRAUN Inc., of Statham, N.H., or Innovative Technology of Amesbury, Mass., may be useful for integration into various embodiments of a gas enclosure assembly according to the present teachings. Gas purification system 3134 can be used to purify one or more inert gases in gas enclosure system 502, for example, to purify the entire gas atmosphere within a gas enclosure assembly. As previously mentioned, in order to circulate gas through gas purification loop 3130, gas purification system 3134 can have a gas circulating unit, such as a fan, blower or motor, and the like. In that regard, a gas purification system can be selected depending on the volume of the enclosure, which can define a volumetric flow rate for moving an inert gas through a gas purification system. For various embodiments of gas enclosure system having a gas enclosure assembly with a volume of up to about 4 m$^3$; a gas purification system that can move about 84 m$^3$/h can be used. For various embodiments of gas enclosure system having a gas enclosure assembly with a volume of up to about 10 m$^3$; a gas purification system that can move about 155 m$^3$/h can be used. For various embodiments of a gas enclosure assembly having a volume of between about 52-114 m$^3$, more than one gas purification system may be used.

Any suitable gas filters or purifying devices can be included in the gas purification system 3134 of the present teachings. In some embodiments, a gas purification system can comprise two parallel purifying devices, such that one of the devices can be taken off line for maintenance and the other device can be used to continue system operation without interruption. In some embodiments, for example, the gas purification system can comprise one or more molecular sieves. In some embodiments, the gas purification system can comprise at least a first molecular sieve, and a second molecular sieve, such that, when one of the molecular sieves becomes saturated with impurities, or otherwise is deemed not to be operating efficiently enough, the system can switch to the other molecular sieve while regenerating the saturated or non-efficient molecular sieve. A control unit can be provided for determining the operational efficiency of each molecular sieve, for switching between operation of different molecular sieves, for regenerating one or more molecular sieves, or for a combination thereof. As previously mentioned, molecular sieves may be regenerated and reused.

Thermal regulation system 3140 of FIG. 15 can include at least one chiller 3142, which can have fluid outlet line 3141 for circulating a coolant into a gas enclosure assembly, and fluid inlet line 3143 for returning the coolant to the chiller. An at least one fluid chiller 3142 can be provided for cooling the gas atmosphere within gas enclosure system 502. For various embodiments of a gas enclosure system of the present teachings, fluid chiller 3142 delivers cooled fluid to heat exchangers within the enclosure, where inert gas is passed over a filtration system internal the enclosure. At least one fluid chiller can also be provided with gas enclosure system 502 to cool heat evolving from an apparatus enclosed within gas enclosure system 502. For example, but not limited by, at least one fluid chiller can also be provided for gas enclosure system 502 to cool heat evolving from an OLED printing system. Thermal regulation system 3140 can comprise heat-exchange or Peltier devices and can have various cooling capacities. For example, for various embodiments of a gas enclosure system, a chiller can provide a cooling capacity of from between about 2 kW to about 20 kW. Various embodiments of a gas enclosure system can have a plurality of fluid chillers that can chill one or more fluids. In some embodiments, the fluid chillers can utilize a number of fluids as coolant, for example, but not limited by, water, anti-freeze, a refrigerant, and a combination thereof as a heat exchange fluid. Appropriate leak-free, locking connections can be used in connecting the associated conduits and system components.

As shown in FIG. 15, various embodiments of a gas enclosure system can include a pressurized inert gas recirculation system 3000. Various embodiments of a pressurized inert gas recirculation loop can utilize a compressor, a blower and combinations thereof.

Figure 16:
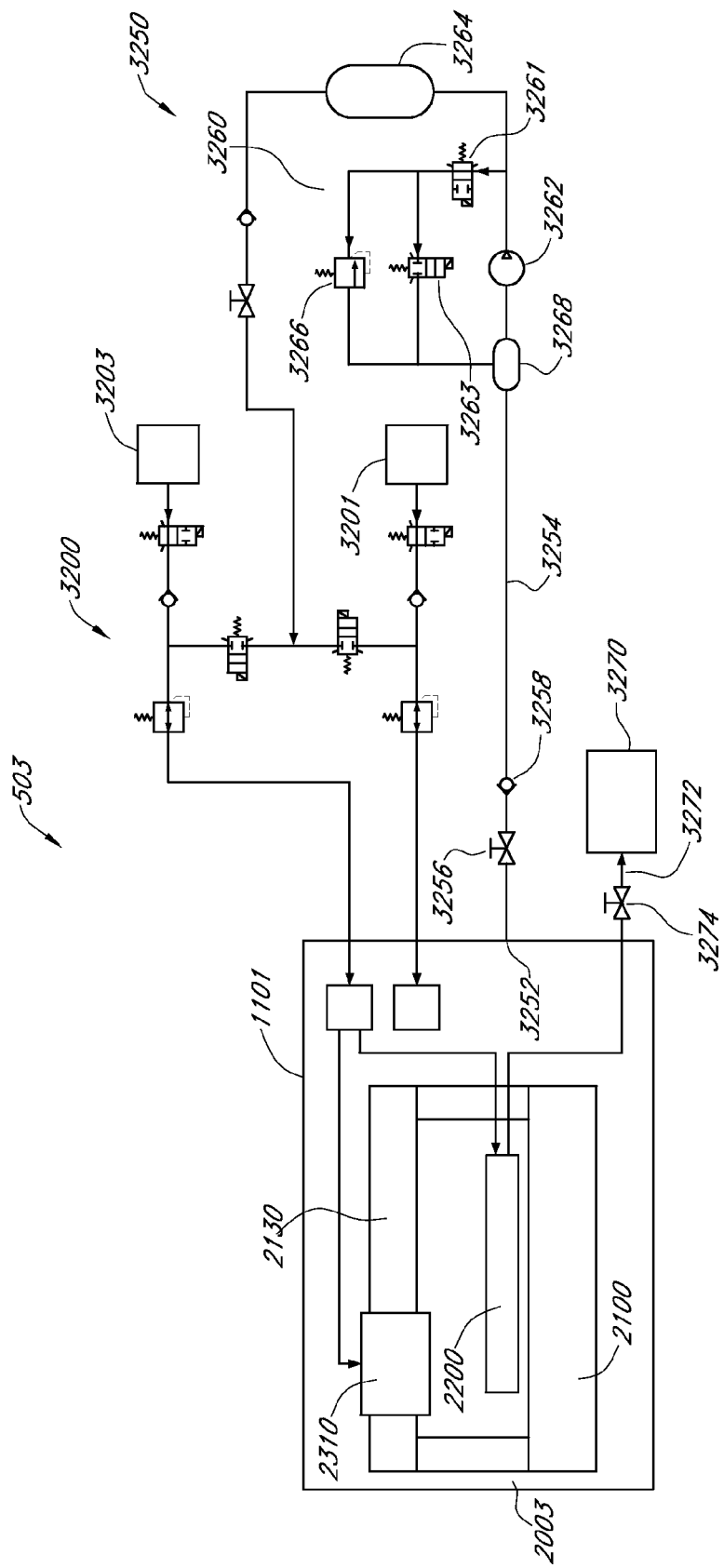
FIG. 16 is a schematic of a gas enclosure system in accordance with various embodiments of the present teachings.

For example, as shown in FIG. 16, various embodiments of gas enclosure system 503 can have external gas loop 3200 for integrating and controlling inert gas source 3201 and clean dry air (CDA) source 3203 for use in various aspects of operation of gas enclosure system 503. Gas enclosure system 503 can also include various embodiments of an internal particle filtration and gas circulation system, as well as various embodiments of an external gas purification system, as previously described. In addition to external loop 3200 for integrating and controlling inert gas source 3201 and CDA source 3203, gas enclosure system 503 can have compressor loop 3250, which can supply inert gas for operating various devices and apparatuses that can be disposed in the interior of gas enclosure system 503.

Compressor loop 3250 of FIG. 16 can include compressor 3262, first accumulator 3264 and second accumulator 3268, which are configured to be in fluid communication. Compressor 3262 can be configured to compress inert gas withdrawn from gas enclosure assembly 1101 to a desired pressure. An inlet side of compressor loop 3250 can be in fluid communication with gas enclosure assembly 1101 via gas enclosure assembly outlet 3252 through line 3254, having valve 3256 and check valve 3258. Compressor loop 3250 can be in fluid communication with gas enclosure assembly 1101 on an outlet side of compressor loop 3250 via external gas loop 3200. Accumulator 3264 can be disposed between compressor 3262 and the junction of compressor loop 3250 with external gas loop 3200 and can be configured to generate a pressure of 5 psig or higher. Second accumulator 3268 can be in compressor loop 3250 for providing dampening fluctuations due to compressor piston cycling at about 60 Hz. For various embodiments of compressor loop 3250, first accumulator 3264 can have a capacity of between about 80 gallons to about 160 gallons, while second accumulator can have a capacity of between about 30 gallons to about 60 gallons. According to various embodiments of gas enclosure system 503, compressor 3262 can be a zero ingress compressor. Various types of zero ingress compressors can operate without leaking atmospheric gases into various embodiments of a gas enclosure system of the present teachings. Various embodiments of a zero ingress compressor can be run continuously, for example, during an OLED printing process utilizing the use of various devices and apparatuses requiring compressed inert gas.

Accumulator 3264 can be configured to receive and accumulate compressed inert gas from compressor 3262.

Accumulator 3264 can supply the compressed inert gas as needed in gas enclosure assembly 1101. For example, accumulator 3264 can provide gas to maintain pressure for various components of gas enclosure assembly 1101, such as, but not limited by, one or more of a pneumatic robot, a substrate floatation table, an air bearing, an air bushing, a compressed gas tool, a pneumatic actuator, and combinations thereof. As shown in FIG. 16 for gas enclosure system 503, gas enclosure assembly 1101 can have an OLED printing system 2003 enclosed therein. As schematically depicted in FIG. 16, inkjet printing system 2003 can be supported by printing system base 2100, which can be a granite stage. Printing system base 2100 can support a substrate support apparatus, such as a chuck, for example, but not limited by, a vacuum chuck, a substrate floatation chuck having pressure ports, and a substrate floatation chuck having vacuum and pressure ports. In various embodiments of the present teachings, a substrate support apparatus can be a substrate floatation table, such as substrate floatation table 2200 indicated in FIG. 16. Substrate floatation table 2200 can be used for the frictionless support of a substrate. In addition to a low-particle generating floatation table, for frictionless y-axis conveyance of a substrate, printing system 2003 can have a y-axis motion system utilizing air bushings. Additionally, printing system 2003 can have at least one X,Z-axis carriage assembly with motion control provided by a low-particle generating X-axis air bearing assembly. Various components of a low-particle generating motion system, such as an X-axis air bearing assembly, can be used in place of, for example, various particle-generating linear mechanical bearing systems. For various embodiments of a gas enclosure and system of the present teachings, the use of a variety of pneumatically operated devices and apparatuses can provide low-particle generating performance, as well as being low maintenance. Compressor loop 3250 can be configured to continuously supply pressurized inert gas to various devices and apparatuses of gas enclosure system 503. In addition to a supply of pressurized inert gas, substrate floatation table 2200 of inkjet printing system 2003, which utilizes air bearing technology, also utilizes vacuum system 3270, which is in communication with gas enclosure assembly 1101 through line 3272 when valve 3274 is in an open position.

A pressurized inert gas recirculation system according to the present teachings can have pressure-controlled bypass loop 3260 as shown in FIG. 16 for compressor loop 3250, which acts to compensate for variable demand of pressurized gas during use, thereby providing dynamic balance for various embodiments of a gas enclosure system of the present teachings. For various embodiments of a gas enclosure system according to the present teachings, a bypass loop can maintain a constant pressure in accumulator 3264 without disrupting or changing the pressure in enclosure 1101. Bypass loop 3260 can have first bypass inlet valve 3261 on an inlet side of bypass loop, which is closed unless bypass loop 3260 is used. Bypass loop 3260 can also have back pressure regulator 3266, which can be used when second valve 3263 is closed. Bypass loop 3260 can have second accumulator 3268 disposed at an outlet side of bypass loop 3260. For embodiments of compressor loop 3250 utilizing a zero ingress compressor, bypass loop 3260 can compensate for small excursions of pressure that can occur over time during use of a gas enclosure system. Bypass loop 3260 can be in fluid communication with compressor loop 3250 on an inlet side of bypass loop 3260 when bypass inlet valve 3261 is in an opened position. When bypass inlet valve 3261 is opened, inert gas shunted through bypass loop 3260 can be recirculated to the compressor if inert gas from compressor loop 3250 is not in demand within the interior of gas enclosure assembly 1101. Compressor loop 3250 is configured to shunt inert gas through bypass loop 3260 when a pressure of the inert gas in accumulator 3264 exceeds a pre-set threshold pressure. A pre-set threshold pressure for accumulator 3264 can be from between about 25 psig to about 200 psig at a flow rate of at least about 1 cubic feet per minute (cfm), or from between about 50 psig to about 150 psig at a flow rate of at least about 1 cubic feet per minute (cfm), or from between about 75 psig to about 125 psig at a flow rate of at least about 1 cubic feet per minute (cfm) or between about 90 psig to about 95 psig at a flow rate of at least about 1 cubic feet per minute (cfm).

Various embodiments of compressor loop 3250 can utilize a variety of compressors other than a zero ingress compressor, such as a variable speed compressor or a compressor that can be controlled to be in either an on or off state. As previously discussed, a zero ingress compressor ensures that no atmospheric reactive species can be introduced into a gas enclosure system. As such, any compressor configuration preventing atmospheric reactive species from being introduced into a gas enclosure system can be utilized for compressor loop 3250. According to various embodiments, compressor 3262 of gas enclosure system 503 can be housed in, for example, but not limited by, an hermetically-sealed housing. The housing interior can be configured in fluid communication with a source of inert gas, for example, the same inert gas that forms the inert gas atmosphere for gas enclosure assembly 1101. For various embodiments of compressor loop 3250, compressor 3262 can be controlled at a constant speed to maintain a constant pressure. In other embodiments of compressor loop 3250 not utilizing a zero ingress compressor, compressor 3262 can be turned off when a maximum threshold pressure is reached, and turned on when a minimum threshold pressure is reached.

Figure 17:
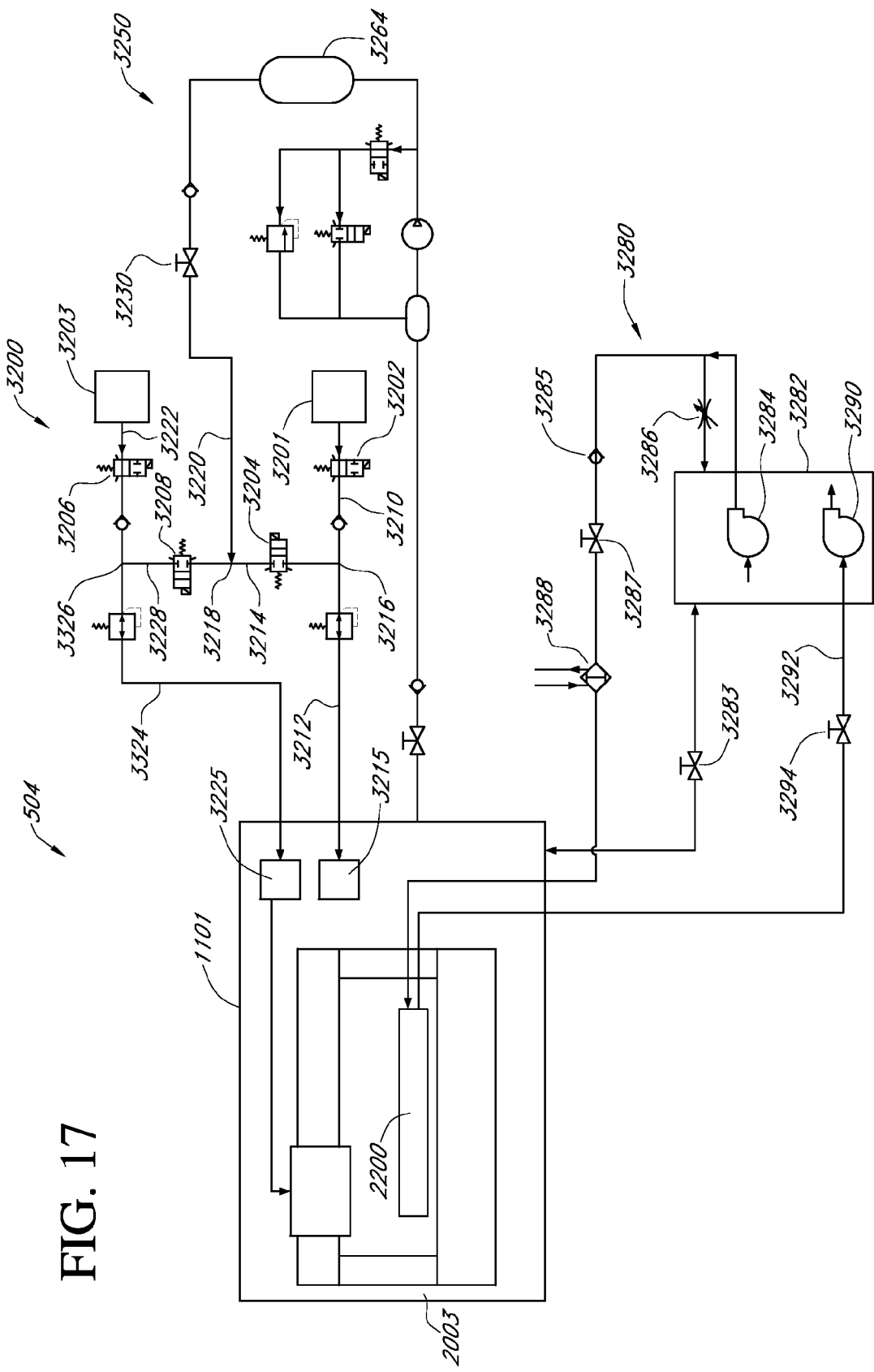
FIG. 17 is a schematic of a gas enclosure system in accordance with various embodiments of the present teachings.

In FIG. 17 for gas enclosure system 504, blower loop 3280 utilizing vacuum blower 3290 is shown for the operation of substrate floatation table 2200 of inkjet printing system 2003, which are housed in gas enclosure assembly 1101. As previously discussed for compressor loop 3250, blower loop 3280 can be configured to continuously supply pressurized inert gas to a substrate floatation table 2200 of printing system 2003.

Various embodiments of a gas enclosure system that can utilize a pressurized inert gas recirculation system can have various loops utilizing a variety of pressurized gas sources, such as at least one of a compressor, a blower, and combinations thereof. In FIG. 17 for gas enclosure system 504, compressor loop 3250 can be in fluid communication with external gas loop 3200, which can be used for the supply of inert gas for high consumption manifold 3225, as well as low consumption manifold 3215. For various embodiments of a gas enclosure system according to the present teachings as shown in FIG. 17 for gas enclosure system 504, high consumption manifold 3225 can be used to supply inert gas to various devices and apparatuses, such as, but not limited by, one or more of a substrate floatation table, a pneumatic robot, an air bearing, an air bushing, and a compressed gas tool, and combinations thereof. For various embodiments of a gas enclosure system according to the present teachings, low consumption 3215 can be used to supply inert gas to various apparatuses and devises, such as, but not limited by, one or more of an isolator, and a pneumatic actuator, and combinations thereof.

For various embodiments of gas enclosure system 504 of FIG. 17, blower loop 3280 can be utilized to supply pressurized inert gas to various embodiments of substrate floatation table 2200, while compressor loop 3250; in fluid communication with external gas loop 3200, can be utilized to supply pressurized inert gas to, for example, but not limited by, one or more of a pneumatic robot, an air bearing, an air bushing, and a compressed gas tool, and combinations thereof. In addition to a supply of pressurized inert gas, substrate floatation table 2200 of OLED inkjet printing system 2003, which utilizes air bearing technology, also utilizes blower vacuum 3290, which is in communication with gas enclosure assembly 1101 through line 3292 when valve 3294 is in an open position. Housing 3282 of blower loop 3280 can maintain first blower 3284 for supplying a pressurized source of inert gas to substrate floatation table 2200, and second blower 3290, acting as a vacuum source for substrate floatation table 2200, which is housed in an inert gas environment in gas enclosure assembly 1101. Attributes that can make blowers suitable for use as a source of either pressurized inert gas or vacuum for various embodiments a substrate floatation table include, for example, but not limited by, that they have high reliability; making them low maintenance, have variable speed control, and have a wide range of flow volumes; various embodiments capable of providing a volume flow of between about 100 m³/h to about 2,500 m³/h. Various embodiments of blower loop 3280 additionally can have first isolation valve 3283 at an inlet end of blower loop 3280, as well as check valve 3285 and a second isolation valve 3287 at an outlet end of blower loop 3280. Various embodiments of blower loop 3280 can have adjustable valve 3286, which can be, for example, but not limited by, a gate, butterfly, needle or ball valve, as well as heat exchanger 3288 for maintaining inert gas from blower loop 3280 to substrate floatation table 2200 at a defined temperature.

FIG. 17 depicts external gas loop 3200, also shown in FIG. 16, for integrating and controlling inert gas source 3201 and clean dry air (CDA) source 3203 for use in various aspects of operation of gas enclosure system 503 of FIG. 16 and gas enclosure system 504 of FIG. 17. External gas loop 3200 of FIG. 16 and FIG. 17 can include at least four mechanical valves. These valves comprise first mechanical valve 3202, second mechanical valve 3204, third mechanical valve 3206, and fourth mechanical valve 3208. These various valves are located at positions in various flow lines that allow control of both an inert gas, for example, such as nitrogen, any of the noble gases, and any combination thereof, and an air source such as clean dry air (CDA). From a house inert gas source 3201, a house inert gas line 3210 extends. House inert gas line 3210 continues to extend linearly as low consumption manifold line 3212, which is in fluid communication with low consumption manifold 3215. A cross-line first section 3214 extends from a first flow juncture 3216, which is located at the intersection of house inert gas line 3210, low consumption manifold line 3212, and cross-line first section 3214. Cross-line first section 3214 extends to a second flow juncture 3218. A compressor inert gas line 3220 extends from accumulator 3264 of compressor loop 3250 and terminates at second flow juncture 3218. A CDA line 3222 extends from a CDA source 3203 and continues as high consumption manifold line 3224, which is in fluid communication with high consumption manifold 3225. A third flow juncture 3226 is positioned at the intersection of a cross-line second section 3228, clean dry air line 3222, and high consumption manifold line 3224. Cross-line second section 3228 extends from second flow juncture 3218 to third flow juncture 3226. Various components that are high consumption can be supplied CDA during maintenance, by means high consumption manifold 3225. Isolating the compressor using valves 3204, 3208, and 3230 can prevent reactive species, such as oxygen and water vapor from contaminating an inert gas within the compressor and accumulator.

As previously discussed, the present teachings disclose various embodiments of a gas enclosure system that can include a gas enclosure assembly defining a first volume and an auxiliary enclosure defining a second volume. Various embodiments of a gas enclosure system can have an auxiliary enclosure that can be sealably constructed as a section of gas enclosure assembly and readily integrated with gas circulation, filtration and purification components to form a gas enclosure system that can sustain an inert, substantially particle-free environment for processes requiring such an environment with little or no interruption of a printing process. For example, all steps associated with a printhead management procedure can be done to eliminate or minimize the exposure of a printing system enclosure to contamination, such as air and water vapor and various organic vapors, as well as particulate contamination. According to various systems and methods of the present teachings, a printing system enclosure may be introduced to a level of contamination that is sufficiently low that a purification system can remove the contamination before it can affect a printing process.

Figure 18:
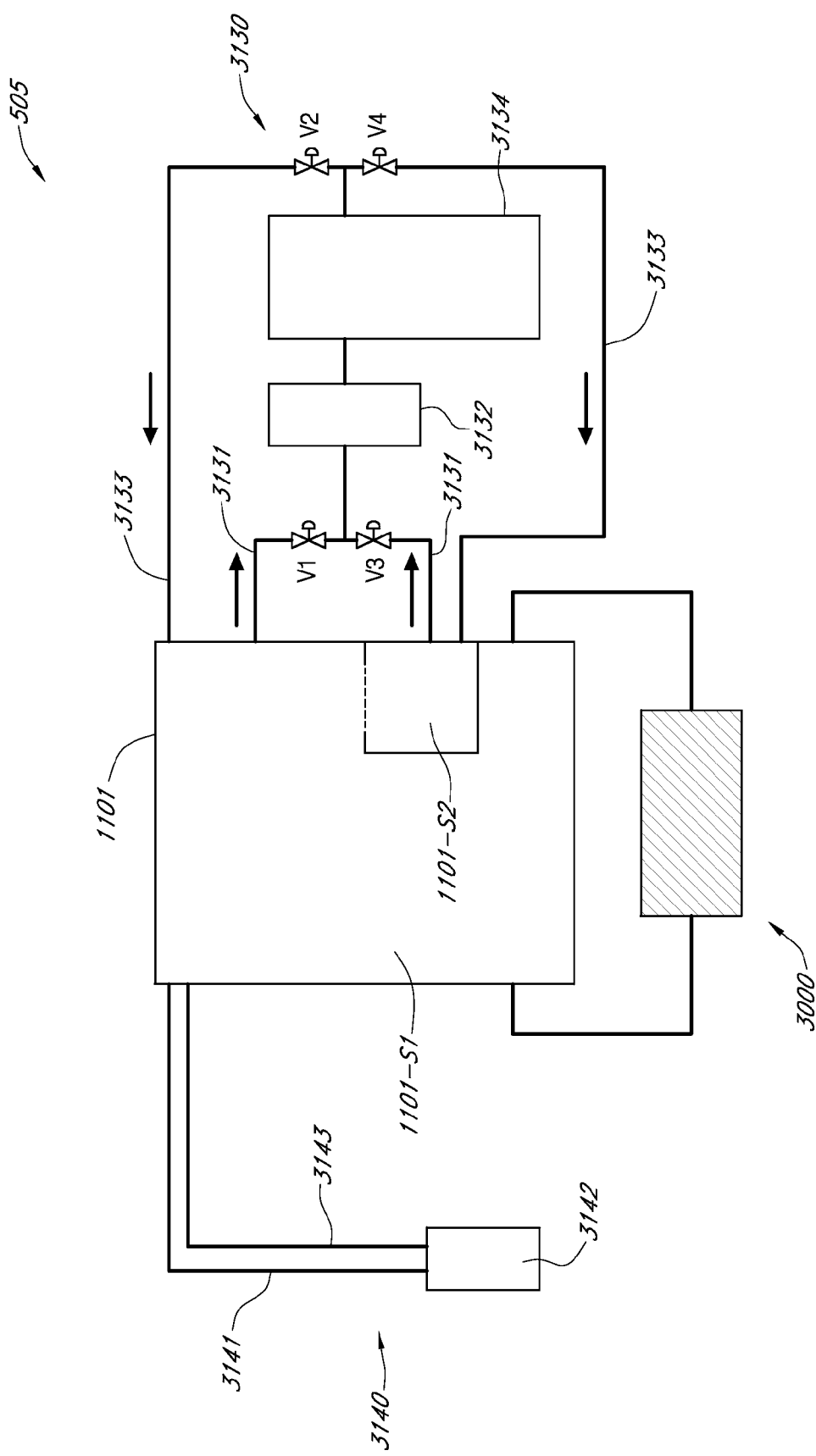
FIG. 18 is a schematic of a gas enclosure system in accordance with various embodiments of the present teachings.

According to systems and methods of the present teachings, various embodiments of a printing system enclosure and an auxiliary enclosure constructed as sections of a gas enclosure assembly can be constructed in a fashion to provide for separately-functioning frame member assembly sections. Gas enclosure system 505 of FIG. 18, in addition to having all elements disclosed for gas enclosure systems 502-504, can have first gas enclosure assembly section 1101-S1 of gas enclosure assembly 1101 defining a first volume and second gas enclosure assembly section 1101-S2 of gas enclosure assembly 1101 defining a second volume. If all valves, $V_1$, $V_2$, $V_3$ and $V_4$ are opened, then gas purification loop 3130 operates essentially as previously described for gas enclosure assembly and system 1101 of FIG. 15. With closure of $V_3$ and $V_4$, only first gas enclosure assembly section 1101-S1 is in fluid communication with gas purification loop 3130. This valve state may be used, for example, but not limited by, when second gas enclosure assembly section 1101-S2 is sealably closed and thereby isolated from first gas enclosure assembly section 1101-S1 during various measurement and maintenances procedure requiring that second gas enclosure assembly section 1101-S2 be opened to the atmosphere. With closure of $V_1$ and $V_2$, only second gas enclosure assembly section 1101-S2 is in fluid communication with gas purification loop 3130. This valve state may be used, for example, but not limited by, during recovery of second gas enclosure assembly section 1101-S2 after the section has been opened to the atmosphere. As previously mentioned for the present teachings related to FIG. 15, the requirements for gas purification loop 3130 are specified with respect to the total volume of gas enclosure assembly 1101. Therefore, by devoting the resources of a gas purification system to the recovery of a gas enclosure assembly section, such as second gas enclosure assembly section 1101-S2, which is depicted in FIG. 18 to be significantly less in volume than the total volume of gas enclosure 1101, the recovery time can be substantially reduced.

Additionally, various embodiments of an auxiliary enclosure can be readily integrated with a dedicated set of environmental regulation system components, such as lighting, gas circulation and filtration, gas purification, and thermostating components. In that regard, various embodiments of a gas enclosure system including an auxiliary enclosure that can be sealably constructed as a section of gas enclosure assembly can have a controlled environment that is set to be uniform with a first volume defined by a gas enclosure assembly housing a printing system Further, various embodiments of a gas enclosure system including an auxiliary enclosure that can be sealably constructed as a section of gas enclosure assembly can have a controlled environment that is set to be different than the controlled environment of a first volume defined by a gas enclosure assembly housing a printing system.

Recalling, various embodiments of a gas enclosure assembly utilized in embodiments of a gas enclosure system of the present teachings can be constructed in a contoured fashion that minimizes the internal volume of a gas enclosure assembly, and at the same time optimizes the working volume for accommodating various footprints of OLED printing systems designs. For example, various embodiments of a contoured gas enclosure assembly according to the present teachings can have a gas enclosure volume of between about 6 m$^3$ to about 95 m$^3$ for various embodiments of a gas enclosure assembly of the present teachings covering, for example, substrate sizes from Gen 3.5 to Gen 10. Various embodiments of a contoured gas enclosure assembly according to the present teachings can have a gas enclosure volume of, for example, but not limited by, of between about 15 m$^3$ to about 30 m$^3$, which might be useful for OLED printing of, for example, Gen 5.5 to Gen 8.5 substrate sizes. Various embodiments of an auxiliary enclosure can be constructed as a section of gas enclosure assembly and readily integrated with gas circulation and filtration, as well as purification components to form a gas enclosure system that can sustain an inert, substantially particle-free environment for processes requiring such an environment.

According to various embodiments of systems and methods of the present teachings, frame member construction, panel construction, frame and panel sealing, as well as construction of a gas enclosure assembly, such as gas enclosure assembly 100 of FIG. 3, can be applied to a gas enclosure assembly of a variety of sizes and designs. For example, but not limited by, various embodiments of a contoured gas enclosure assembly of the present teachings covering substrate sizes from Gen 3.5 to Gen 10 can have an internal volume of between about 6 m$^3$ to about 95 m$^3$, which can be between about 30% to about 70% savings in volume for an enclosure not contoured and having comparative gross dimensions. Various embodiments of a gas enclosure assembly can have various frame members that are constructed to provide contour for a gas enclosure assembly, in order to optimize the working volume accommodating various embodiments of a printing system of the present teachings; while minimizing inert gas volume, as well as also allowing ready access to an OLED printing system from the exterior during processing. In that regard, various gas enclosure assemblies of the present teachings can vary in contoured topology and volume.

Moreover, various embodiments of a gas enclosure system of the present teachings can utilize a gas enclosure assembly having an auxiliary enclosure that can be sealably constructed as a section of gas enclosure assembly, in order to readily perform various procedures related to the ongoing management of a printing system, for example, but not limited by, processes related to the management of a printhead assembly. For various embodiments of a gas enclosure assembly with an auxiliary enclosure, an auxiliary frame member assembly section can be less than or equal to about 1% of the enclosure volume of a gas enclosure system. In various embodiments of a gas enclosure assembly, an auxiliary frame member assembly section can be less than or equal to about 2% of the enclosure volume of a gas enclosure system. For various embodiments of a gas enclosure assembly, an auxiliary frame member assembly section can be less than or equal to about 5% of the enclosure volume of a gas enclosure system. In various embodiments of a gas enclosure assembly, an auxiliary frame member assembly section can be less than or equal to about 10% of the enclosure volume of a gas enclosure system. In various embodiments of a gas enclosure assembly, an auxiliary frame member assembly section can be less than or equal to about 20% of the enclosure volume of a gas enclosure system. Various procedures related to the ongoing management of a printing system, for example, but not limited by, various process steps related to the management of a printhead assembly can be performed in an auxiliary enclosure. According to various systems and methods of the present teachings, an auxiliary enclosure can be separated from a printing system enclosure portion of a gas enclosure system, thereby ensuring either minimal or no interruption of a printing process. Moreover, given the relatively small volume of an auxiliary enclosure, recovery of an auxiliary enclosure can take significantly less time than recovery of an entire printing system enclosure.

Further, various embodiments of a gas enclosure assembly of the present teachings can be constructed in a fashion to provide for separately-functioning frame member assembly sections. Recalling, with respect to FIG. 5, a frame member assembly according to various embodiments of a gas enclosure assembly and system of the present teachings, can include a frame member having various panels sealably mounted onto a frame member. For example, but not limited by, a wall frame member assembly, or wall panel assembly, can be a wall frame member including various panels sealably mounted onto the wall frame member. Accordingly, various fully constructed panel assemblies, such as, but not limited by, wall panel assemblies, ceiling panel assemblies, wall and ceiling panel assemblies, base support panel assemblies, and the like are various types of frame member assemblies. A gas enclosure assembly of the present teachings can provide for various embodiments of a gas enclosure assembly having various frame member assembly sections, where each frame member assembly section is a proportion of the total volume of a gas enclosure assembly. Various frame member assembly sections comprising various embodiments of a gas enclosure assembly can have at least one frame member in common. For various embodiments of a gas enclosure assembly, various frame member assembly sections comprising a gas enclosure assembly can have at least one frame member assembly in common. Various frame member assembly sections comprising various embodiments of a gas enclosure assembly can have a combination of at least one frame member and one frame member assembly in common.

According to the present teachings, various frame member assembly sections can be separated into sections through, for example, but not limited by, closure of an opening or passage, or combination thereof, common to each of a frame member assembly section. For example, in various embodiments, an auxiliary frame member assembly section can be separated by covering an opening or passage, or combination thereof, in a frame member or frame member panel common to each frame member assembly section; effectively closing the opening or passage, or combination thereof thereby. In various embodiments, an auxiliary frame member assembly section can be separated by sealing an opening or passage, or combination thereof, common to each frame member assembly section. In that regard, sealably closing an opening or passage, or combination thereof, can result in separation that disrupts the fluid communication between each volume of a gas enclosure frame member assembly section defining a working volume and an auxiliary enclosure defining a second volume, where each volume is a proportion of the total volume contained within a gas enclosure assembly. Sealably closing an opening or passage can thereby isolate a working volume of a gas enclosure assembly from an auxiliary frame member assembly section defining a second volume.

Figure 19:
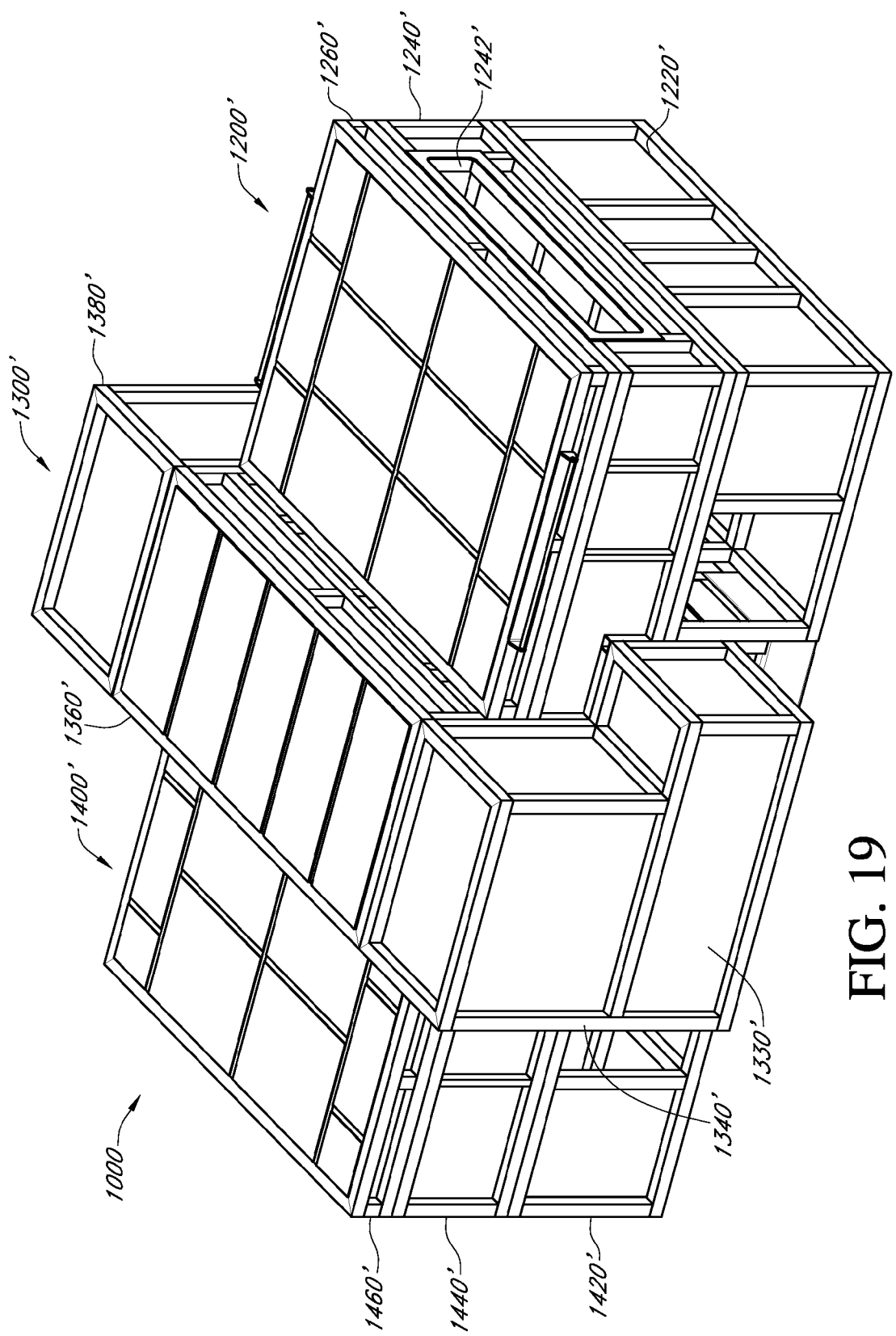
FIG. 19 is a front perspective view of view of a gas enclosure assembly in accordance with various embodiments of the present teachings.

FIG. 19 depicts a perspective view gas enclosure assembly 1000 in accordance with various embodiments of a gas enclosure assembly of the present teachings. Gas enclosure assembly 1000 can include front panel assembly 1200', middle panel assembly 1300' and rear panel assembly 1400'. Front panel assembly 1200' can include front ceiling panel assembly 1260', front wall panel assembly 1240', which can have opening 1242 for receiving a substrate, and front base panel assembly 1220'. Rear panel assembly 1400' can include rear ceiling panel assembly 1460', rear wall panel assembly 1440' and rear base panel assembly 1420'. Middle panel assembly 1300' can include first middle enclosure panel assembly 1340', middle wall and ceiling panel assembly 1360' and second middle enclosure panel assembly 1380', as well as middle base panel assembly 1320'. Additionally, middle panel assembly 1300' can include first printhead management system auxiliary panel assembly 1330', as well as a second printhead management system auxiliary panel assembly (not shown). Various embodiments of an auxiliary enclosure constructed as a section of a gas enclosure assembly can be sealably isolated from the working volume of a gas enclosure system. Such physical isolation of an auxiliary enclosure can enable various procedures, for example, but not limited by, various maintenance procedures on a printhead assembly, to be conducted with little or no interruption of a printing process, thereby minimizing or eliminating gas enclosure system downtime.

Figure 20A:
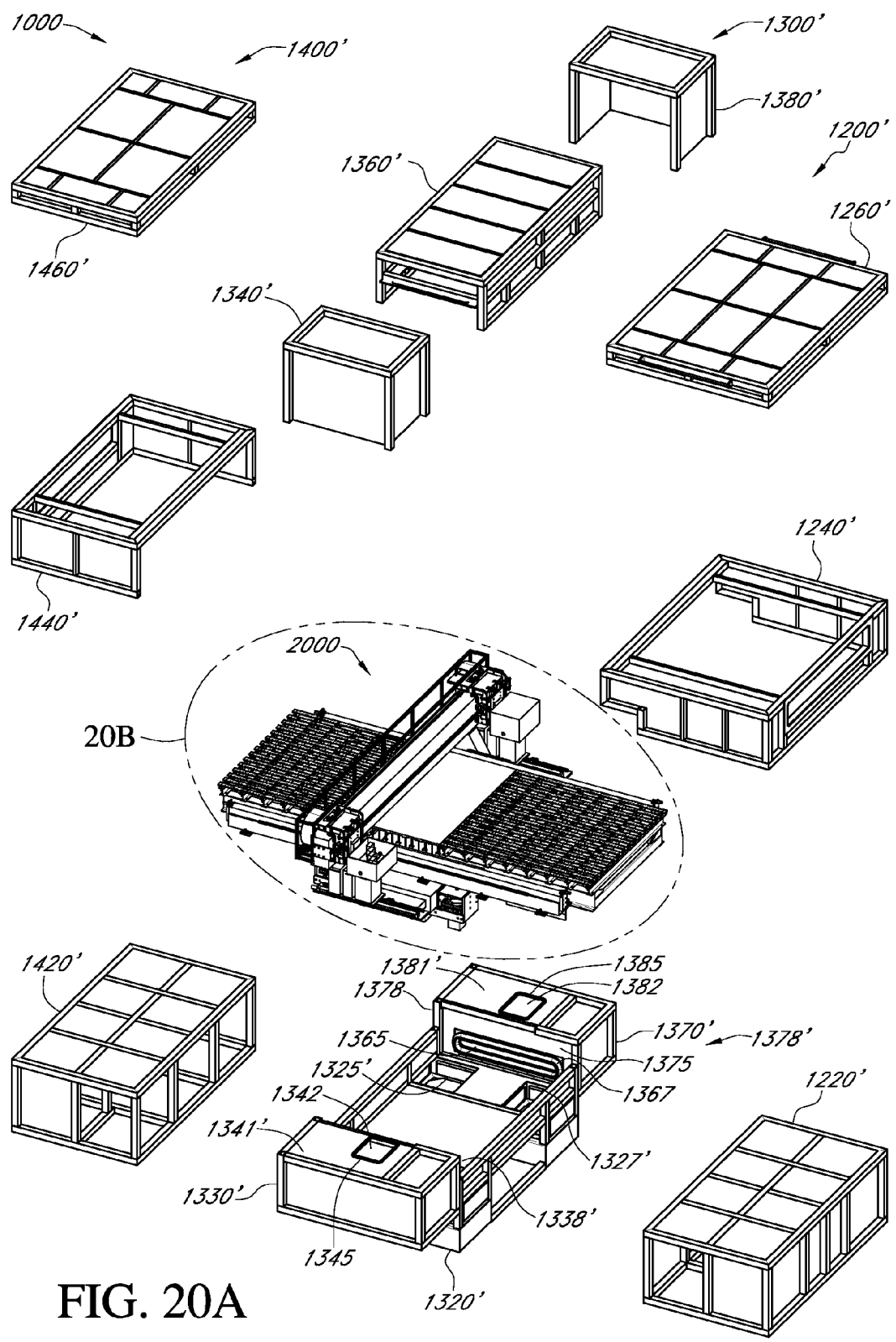
FIG. 20A depicts an exploded view of various embodiments of a gas enclosure assembly as depicted in FIG. 19 and related printing system in accordance with various embodiments of the present teachings.

As depicted in FIG. 20A, gas enclosure assembly 1000 can include front base panel assembly 1220', middle base panel assembly 1320', and rear base panel assembly 1420', which when fully-constructed form a contiguous base or pan on which OLED printing system 2000 can be mounted. In a similar fashion as described for gas enclosure assembly 100 of FIG. 3, the various frame members and panels comprising front panel assembly 1200', middle panel assembly 1300', and rear panel assembly 1400' of gas enclosure assembly 1000 can be joined around OLED printing system 2000. Accordingly, a fully constructed gas enclosure assembly, such as gas enclosure assembly 1000, when integrated with various environmental control systems can form various embodiments of a gas enclosure system including various embodiments of OLED printing system 2000. According to various embodiments of a gas enclosure system of the present teachings as previously described, environmental control of an interior volume defined by a gas enclosure assembly can include control of lighting, for example, by the number and placement of lights of a specific wavelength, control of particulate matter using various embodiments of a gas circulation and filtration system, control of reactive gas species using various embodiments of a gas purification system, and temperature control of a gas enclosure assembly using various embodiments of a thermal control system.

Figure 20B:
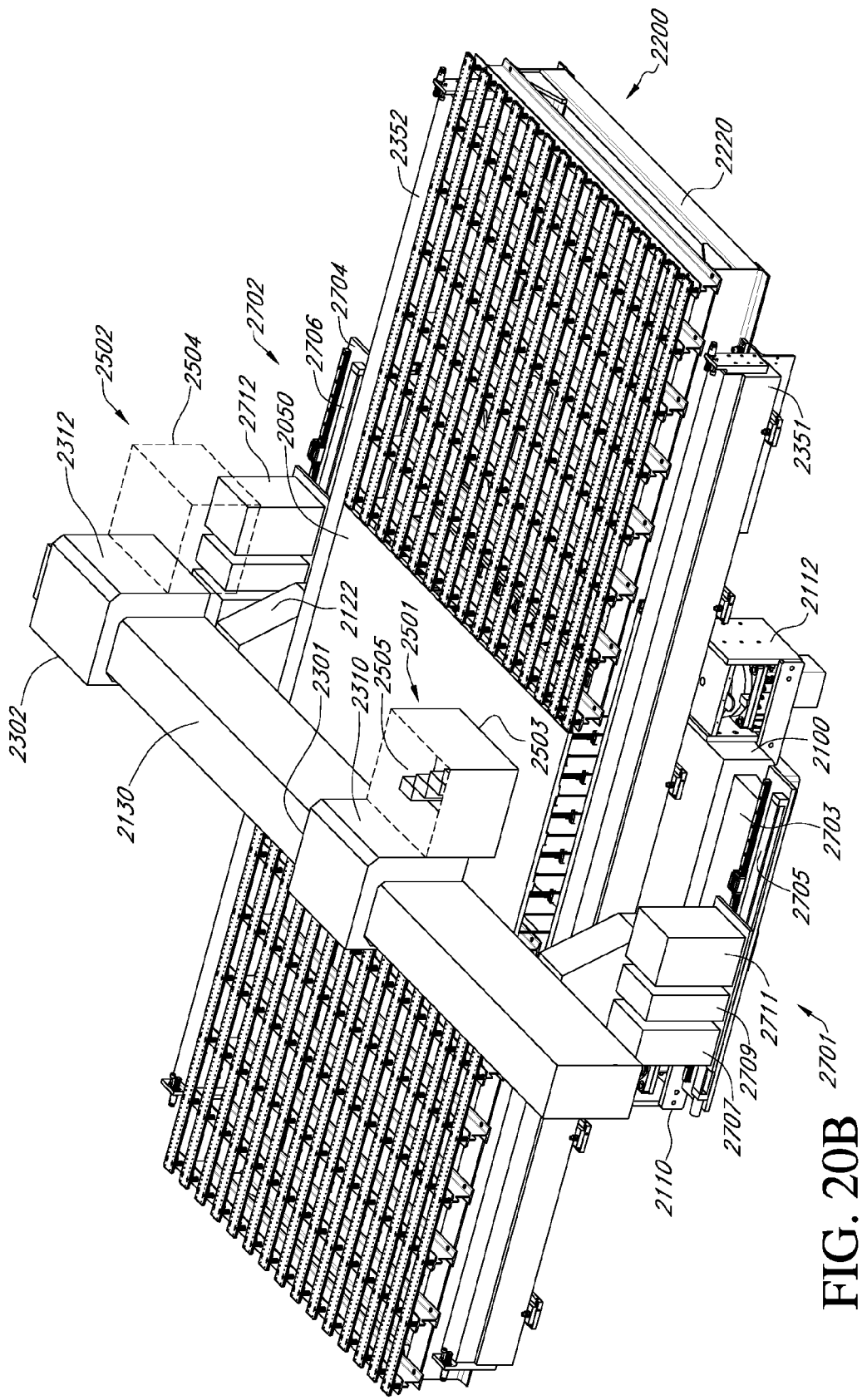
FIG. 20B depicts an expanded iso perspective view of the printing system depicted in FIG. 20A.

An OLED inkjet printing system, such as OLED printing system 2000 of FIG. 20A, shown in expanded view in FIG. 20B, can be comprised of several devices and apparatuses, which allow the reliable placement of ink drops onto specific locations on a substrate. These devices and apparatuses can include, but are not limited to, a printhead assembly, ink delivery system, motion system, substrate support apparatus, substrate loading and unloading system, and printhead management system.

A printhead assembly can include at least one ink jet head, with at least one orifice capable of ejecting droplets of ink at a controlled rate, velocity, and size. The inkjet head is fed by an ink supply system which provides ink to the inkjet head. As shown in an expanded view of FIG. 20B, OLED inkjet printing system 2000 can have a substrate, such as substrate 2050, which can be supported by a substrate support apparatus, such as a chuck, for example, but not limited by, a vacuum chuck, a substrate floatation chuck having pressure ports, and a substrate floatation chuck having vacuum and pressure ports. In various embodiments of systems and methods of the present teachings, a substrate support apparatus can be a substrate floatation table. As will be discussed in more detail subsequently, substrate floatation table 2200 of FIG. 20B can be used for supporting substrate 2050, and in conjunction with a Y-axis motion system, can be part of a substrate conveyance system providing for the frictionless conveyance of substrate 2050. Substrate floatation table 2200 of OLED inkjet printing system 2000 shown in FIG. 20A and FIG. 20B can define the travel of substrate 2050 through gas enclosure assembly 1000 of FIG. 19 during a printing process. Printing requires relative motion between the printhead assembly and the substrate. This is accomplished with a motion system, typically a gantry or split axis XYZ system. Either the printhead assembly can move over a stationary substrate (gantry style), or both the printhead and substrate can move, in the case of a split axis configuration. In another embodiment, a printhead assembly can be substantially stationary; for example, in the X and Y axes, and the substrate can move in the X and Y axes relative to the printheads, with Z axis motion provided either by a substrate support apparatus or by a Z-axis motion system associated with a printhead assembly. As the printheads move relative to the substrate, droplets of ink are ejected at the correct time to be deposited in the desired location on a substrate. A substrate can be inserted and removed from the printer using a substrate loading and unloading system. Depending on the printer configuration, this can be accomplished with a mechanical conveyor, a substrate floatation table with a conveyance assembly, or a substrate transfer robot with end effector. A printhead management system can be comprised of several subsystems which allow for such measurement tasks, such as the checking for nozzle firing, as well as the measurement of drop volume, velocity and trajectory from every nozzle in a printhead, and maintenance tasks, such as wiping or blotting the inkjet nozzle surface of excess ink, priming and purging a printhead by ejecting ink from an ink supply through the printhead and into a waste basin, and replacement of printheads. Given the variety of components that can comprise an OLED printing system, various embodiments of OLED printing system can have a variety of footprints and form factors.

In the expanded view of OLED printing system 2000 of FIG. 20B, various embodiments of a printing system can include substrate floatation table 2200, supported by substrate floatation table base 2220. Substrate floatation table base 2220 can be mounted on printing system base 2100. Substrate floatation table 2200 of OLED printing system can support substrate 2050, as well as defining the travel over which substrate 2050 can be moved through gas enclosure assembly 1000 during the printing of an OLED substrate. In that regard, in conjunction with a motion system; as depicted in FIG. 20B, a Y-axis motion system, substrate floatation table 2200 can provide frictionless conveyance of substrate 2050 through a printing system.

Figure 21:
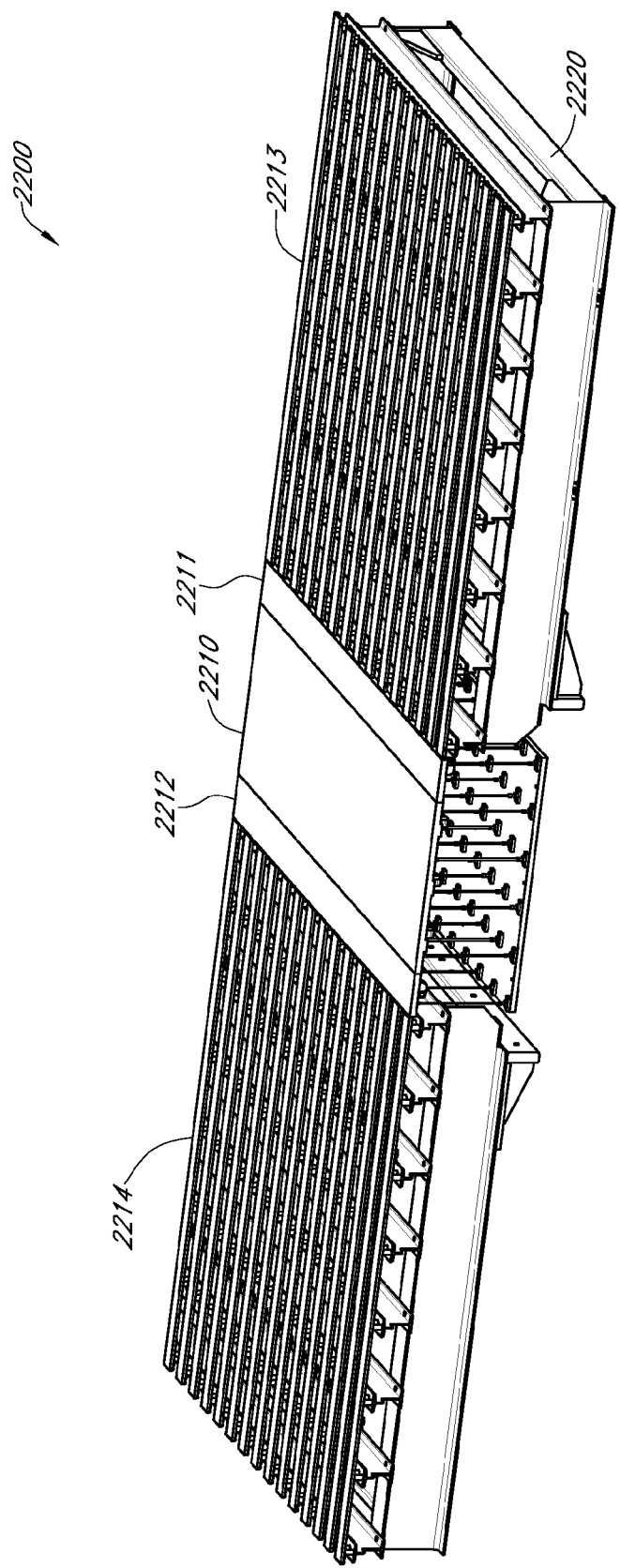
FIG. 21 depicts a perspective view of a floatation table according to various embodiments of the present teachings.

FIG. 21 depicts a floatation table according to various embodiments of the present teachings for the frictionless support, and in conjunction with a conveyance system, the stable conveyance of a load, such as substrate 2050 of FIG. 20B. Various embodiments of a floatation table can be used in any of the various embodiments of a gas enclosure system of the present teachings. As previously discussed, various embodiments of a gas enclosure system of the present teachings can process a range of sizes of OLED flat panel display substrates from smaller than a Gen 3.5 substrate, which has dimensions of about 61 cm×72 cm, as well as the progression of larger generation sizes. It is contemplated that various embodiments of gas enclosure system can process substrate sizes of Gen 5.5, having dimensions of about 130 cm×150 cm, as well as a Gen 7.5 substrate, having dimensions of about 195 cm×225 cm, and can be cut into eight 42" or six 47" flat panels per substrate and larger. A Gen 8.5 substrate is approximately 220 cm×250 cm, and can be cut to six 55" or eight 46" flat panels per substrate. However, substrate generation sizes keep advancing, so that a currently-available Gen 10 substrate, having dimensions of about 285 cm×305 cm, does not appear to be the ultimate generation of substrate sizes. Additionally, sizes recited from the terminology arising from the use of glass-based substrates can be applied to substrates of any material suitable for use in OLED printing. For various embodiments of an OLED inkjet printing system, a variety of substrate materials can be used for substrate 2050, for example, but not limited by, a variety of glass substrate materials, as well as a variety of polymeric substrate materials. Accordingly, there are a variety of substrate sizes and materials requiring stable conveyance during printing in various embodiments of gas enclosure systems of the present teachings.

As depicted if FIG. 21, substrate floatation table 2200 according to various embodiments of the present teachings can have floatation table base 2220 for supporting a plurality of floatation table zones. Substrate floatation table 2200 can have zone 2210 in which both pressure and vacuum can be applied through a plurality of ports. Such a zone having both pressure and vacuum control can effectively provide a fluidic spring between zone 2210 and a substrate (not shown). Zone 2210 having both pressure and vacuum control is a fluidic spring with bidirectional stiffness. The gap that exits between a load and a floatation table surface is referred to as the fly height. A zone such as zone 2210 of substrate floatation table 2200 of FIG. 21, in which a fluidic spring having bidirectional stiffness is created using a plurality of pressure and vacuum ports, can provide a controllable fly height for a load, such as a substrate.

Proximal to zone 2210 are first and second transition zones; 2211 and 2212, respectively, and then proximal first and second transition zones 2211 and 2212 are pressure-only zones, 2213 and 2214, respectively. In the transition zones, the ratio of pressure to vacuum nozzles increases gradually towards the pressure only zones to provide for a gradual transition from zone 2210 to zones 2213 and 2214. As indicated in FIG. 21, FIG. 14B depicts an expanded view of the three zones. For various embodiments of a substrate floatation table, for example, as depicted in FIG. 21, pressure-only zones 2213, 2214 are depicted as comprised of rail structures. For various embodiments of a substrate floatation table, pressure only zones, such as pressure-only zones 2213, 2214 of FIG. 21, can be comprised of a continuous plate, such as that depicted for pressure-vacuum zone 2210 of FIG. 21.

For various embodiments of a floatation table as depicted in FIG. 21, there can be essentially uniform height between the pressure-vacuum zone, the transition zone, and the pressure only zone, so that within tolerances, the three zones lie essentially in one plane and can vary in length. For example, but not limited by, in order to provide a sense of scale and proportion, for various embodiments of a floatation table of the present teachings, a transition zone can be about 400 mm, while the pressure-only zone can be about 2.5 m, and the pressure-vacuum zone can be about 800 mm. In FIG. 21, the pressure-only zones 2213 and 2214 do not provide a fluidic spring having bidirectional stiffness, and therefore do not provide the control that zone 2210 can provide. Accordingly, the fly height of a load can be typically greater over pressure-only zones than the fly height of a substrate over a pressure-vacuum zone, in order to allow enough height so that a load will not collide with a floatation table in the pressure-only zones. For example, but not limited by, it can be desirable for processing an OLED panel substrate to have a fly height of between about 150µ to about 300µ above pressure-only zones, such as zones 2213 and 2214, and then between about 30µ to about 50µ above a pressure-vacuum zone, such as zone 2210.

Various embodiments of substrate floatation table 2200 can be accommodated in a gas enclosure, including gas enclosure assemblies of the present teachings, for example, but not limited by those depicted and described for FIG. 3 and FIG. 19, which can be integrated with various system functions as those described for FIG. 15 through FIG. 18. For example, various embodiments of a gas enclosure system can utilize a pressurized inert gas recirculation system for the operation of a variety of pneumatically operated devices and apparatuses. Additionally, as was previously discussed, embodiments of a gas enclosure assembly of the present teachings can be maintained at a slight positive pressure relative to the external environment, for example, but not limited by between about 2 mbarg to about 8 mbarg. Maintaining a pressurized inert gas recirculation system within a gas enclosure system can be challenging, as it presents a dynamic and ongoing balancing act regarding maintaining a slight positive internal pressure of a gas enclosure system, while at the same time continuously introducing pressurized gas into a gas enclosure system. Further, variable demand of various pneumatically operated devices and apparatuses can create an irregular pressure profile for various gas enclosure assemblies and systems of the present teachings. Accordingly, maintaining a dynamic pressure balance for a gas enclosure assembly held at a slight positive pressure relative to the external environment under such conditions can provide for the integrity of an ongoing OLED printing process.

Referring back to FIG. 20B, printing system base 2100, can include first riser (not visible) and second riser 2122, upon which bridge 2130 is mounted. For various embodiments of OLED printing system 2000, bridge 2130 can support first X,Z-axis carriage assembly 2301 and second X,Z-axis carriage assembly 2302, which can control the movement of first printhead assembly 2501 and second printhead assembly 2502, respectively. Though FIG. 20B depicts two carriage assemblies and two printhead assemblies, for various embodiments of OLED inkjet printing system 2000, there can be a single carriage assembly and a single printhead assembly. For example, either of first printhead assembly 2501 and second printhead assembly 2502 can be mounted on an X,Z-axis carriage assembly, while a camera system for inspecting features of substrate 2050 can be mounted on a second X,Z-axis carriage assembly. Various embodiments of OLED inkjet printing system 2000 can have a single printhead assembly, for example, either of first printhead assembly 2501 and second printhead assembly 2502 can be mounted on an X,Z-axis carriage assembly, while a UV lamp for curing an encapsulation layer printed on substrate 2050 can be mounted on a second X,Z-axis carriage assembly. For various embodiments of OLED inkjet printing system 2000, there can be a single printhead assembly, for example, either of first printhead assembly 2501 and second printhead assembly 2502, mounted on an X,Z-axis carriage assembly, while a heat source for curing an encapsulation layer printed on substrate 2050 can be mounted on a second carriage assembly.

In FIG. 20B, first X,Z-axis carriage assembly 2301 can be used to position first printhead assembly 2501, which can be mounted on first Z-axis moving plate 2310, over substrate 2050, which is shown supported on substrate floatation table 2200. Second X,Z-axis carriage assembly 2302 can be similarly configured for controlling the X-Z axis movement of second printhead assembly 2502 relative to substrate 2050. Each printhead assembly, such as first printhead assembly 2501 and second printhead assembly 2502 of FIG. 20B, can have a plurality of printheads mounted in at least one printhead device, as depicted in partial view for first printhead assembly 2501, which depicts a plurality of printhead 2505. A printhead device can include, for example, but not limited by, fluidic and electronic connections to at least one printhead; each printhead having a plurality of nozzles or orifices capable of ejecting ink at a controlled rate, velocity and size. For various embodiments of printing system 2000, a printhead assembly can include between about 1 to about 60 printhead devices, where each printhead device can have between about 1 to about 30 printheads in each printhead device. A printhead, for example, an industrial inkjet head, can have between about 16 to about 2048 nozzles, which can expel a droplet volume of between about 0.1 pL to about 200 pL.

According to various embodiments of gas enclosure assembly 1000 and printing system 2000 of FIG. 20A and FIG. 20B, a printing system can have a printhead management system that can be mounted proximal to a printhead assembly, for example, first printhead management system 2701 and second printhead management system 2702 can be mounted upon first printhead management system platform 2703 and second printhead management system platform 2704, respectively. First printhead management system platform 2703 and second printhead management system platform 2704 are depicted in FIG. 20B affixed to floatation table base 2100. Various embodiments of a printhead management system can perform a variety of measurement and maintenance tasks on a printhead assembly. Various measurements performed on a printhead can include, for example, but not limited by, checking for nozzle firing, measuring drop volume, velocity and trajectory, as well as tuning a printhead so that each nozzle ejects a droplet of known volume. Maintaining a printhead can include, for example, but not limited by, procedures such as printhead purging and priming, which requires collection and containment of the ink expelled from a printhead, removal of excess ink after a purging or priming procedure, as well as printhead or printhead device replacement. In a printing process, for example, for the printing of an OLED display panel substrate, reliable firing of the nozzles is critical for ensuring that a printing process can manufacture quality OLED panel displays. Therefore, it is necessary that the various procedures associated with printhead management can be readily and reliably done to eliminate or minimize the exposure of a printing system enclosure to contamination, such as air and water vapor and various organic vapors, as well as particulate contamination. According to various systems and methods of the present teachings, a printing system enclosure may be introduced to a level of contamination that is sufficiently low that a purification system can remove the contamination before it can affect a printing process.

According to various embodiments of a gas enclosure system of the present teachings, given the sheer number of printhead devices and printheads, first printhead management system 2701 and second printhead management system 2702 can be housed in an auxiliary enclosure, which can be isolated during a printing process for performing various measurement and maintenance tasks with little or no interruption to the printing process. As can be seen in FIG. 20B, first printhead assembly 2501 can be seen positioned relative to first printhead management system 2701 for ready performance of various measurement and maintenance procedures that can be performed by first printhead management system apparatuses 2707, 2709 and 2711. Apparatuses 2707, 2709, and 2011 can be any of a variety of subsystems or modules for performing various printhead management functions. For example apparatuses 2707, 2709, and 2011 can be any of a drop measurement module, a printhead replacement module, a purge basin module, and a blotter module.

Recalling, a printhead assembly can include between about 1 to about 60 printhead devices, where each printhead device can have between about 1 to about 30 printheads in each printhead device. As such, various embodiments of a printing system of the present teachings can have between about 1 to about 1800 printheads. The sheer number of printheads can require ongoing measurement and maintenance procedures be performed on a periodic basis as required. For example, a drop measurement module can be used for measurement tasks, such as the checking for nozzle firing, as well as the measurement of drop volume, velocity and trajectory from every nozzle in a printhead. A purge basin module can be used for priming and purging a printhead by ejecting ink from an ink supply through the printhead into a waste basin, while a blotter module can be used for wiping or blotting the inkjet nozzle surface of excess ink.

In that regard, each subsystem can have various parts that are consumable by nature, and require replacement, such as replacing blotter paper, ink, and waste reservoirs. Various consumable parts can be packaged for ready insertion, for example, in a fully automated mode using a handler. As a non-limiting example, blotter paper can be packaged in a cartridge format, which can be readily inserted for use into a blotting module. By way of another non-limiting example ink can be packaged in a replaceable reservoir, as well as a cartridge format for use in a printing system. Various embodiments of a waste reservoir can be packaged in a cartridge format, which can be readily inserted for use into a purge basin module. Additionally, parts of various components of a printing system subject to on-going use can require periodic replacement. During a printing process, expedient management of a printhead assembly, for example, but not limited by, an exchange of a printhead device or printhead, can be desirable. A printhead replacement module can have parts, such as a printhead device or printhead, which can be readily inserted for use into a printhead assembly. A drop measurement module used for checking for nozzle firing, as well as the measurement based on optical detection of drop volume, velocity and trajectory from every nozzle can have a source and a detector, which can require periodic replacement after use. Various consumable and high-usage parts can be packaged for ready insertion, for example, in a fully automated mode using a handler or by end-user mitigated exchange. Accordingly, utilizing an auxiliary enclosure for the automated or end-user mitigated exchange of parts of a printing system can ensure that a printing process can continue in an uninterrupted fashion. As depicted in FIG. 20B, first printhead management system apparatuses 2707, 2709 and 2711 can be mounted on a linear rail motion system 2705 for positioning relative to first printhead assembly 2501.

With respect to various embodiments of a gas enclosure assembly having an auxiliary enclosure that can be closed off from, as well as sealably isolated from a first working volume, reference is made again to FIG. 20A. As depicted in FIG. 20B, there can be four isolators on OLED printing system 2000; first isolator set 2110 (second not shown on opposing side) and second isolator set 2112 (second not shown on opposing side), which support substrate floatation table 2200 of OLED printing system 2000. For gas enclosure assembly 1000 of FIG. 20A, first isolator set 2110 and second isolator set 2112 can be mounted in each of a respective isolator well panel, such as first isolator wall panel 1325' and second isolator wall panel 1327' of middle base panel assembly 1320'. For gas enclosure assembly 1000 of FIG. 20A, middle base assembly 1320' can include first printhead management system auxiliary panel assembly 1330', as well as second printhead management system auxiliary panel assembly 1370'. FIG. 20A of gas enclosure assembly 1000 depicts first printhead management system auxiliary panel assembly 1330' that can include first back wall panel assembly 1338'. Similarly, also depicted is second printhead management system auxiliary panel assembly 1370' that can include second back wall panel assembly 1378'. First back wall panel assembly 1338' of first printhead management system auxiliary panel assembly 1330' can be constructed in a similar fashion as shown for second back wall panel assembly 1378'. Second back wall panel assembly 1378' of second printhead management system auxiliary panel assembly 1370' can be constructed from second back wall frame assembly 1378 having second seal-support panel 1375 sealably mounted to second back wall frame assembly 1378. Second seal-support panel 1375 can have second passage 1365, which is proximal to a second end of base 2100 (not shown). Second seal 1367 can be mounted on second seal-support panel 1375 around second passage 1365. A first seal can be similarly positioned and mounted around a first passage for first printhead management system auxiliary panel assembly 1330'. Each passage in auxiliary panel assembly 1330' and auxiliary panel assembly 1370' can accommodate having each maintenance system platform, such as first and second maintenance system platforms 2703 and 2704 of FIG. 20B pass through the passages. As will be discussed in more detail subsequently, in order to sealably isolate auxiliary panel assembly 1330' and auxiliary panel assembly 1370' the passages, such as second passage 1365 of FIG. 20A must be sealable. It is contemplated that various seals, such as an inflatable seal, a bellows seal and a lip seal can be used for sealing a passage, such as second passage 1365 of FIG. 20A, around a maintenance platform affixed to a printing system base.

First printhead management system auxiliary panel assembly 1330' and second printhead management system auxiliary panel assembly 1370' can include first printhead assembly opening 1342 of first floor panel assembly 1341' and second printhead assembly opening 1382 of second floor panel assembly 1381'; respectively. First floor panel assembly 1341' is depicted in FIG. 20A as part of first middle enclosure panel assembly 1340' of middle panel assembly 1300'. First floor panel assembly 1341' is a panel assembly in common with both first middle enclosure panel assembly 1340' and first printhead management system auxiliary panel assembly 1330'. Second floor panel assembly 1381' is depicted in FIG. 20A as part of second middle enclosure panel assembly 1380' of middle panel assembly 1300'. Second floor panel assembly 1381' is a panel assembly in common with both second middle enclosure panel assembly 1380' and second printhead management system auxiliary panel assembly 1370'.

As previously mentioned, first printhead assembly 2501 can be housed in first printhead assembly enclosure 2503, and second printhead assembly 2502 can be housed in second printhead assembly enclosure 2504. As will be discussed in more detail subsequently, first printhead assembly enclosure 2503 and second printhead assembly enclosure 2504 can have an opening at the bottom that can have a rim (not shown), so that various printhead assemblies can be positioned for printing during a printing process. Additionally, the portions of first printhead assembly enclosure 2503 and second printhead assembly enclosure 2504 forming a housing can be constructed as previously described for various panel assemblies, so that the frame assembly members and panels are capable of providing an hermetically-sealed enclosure.

A compressible gasket, such as previously described for the hermetic sealing of various frame members, can be affixed around each of first printhead assembly opening 1342 and second printhead assembly opening 1382, or alternatively around the rim of first printhead assembly enclosure 2503 and second printhead assembly enclosure 2504.

As depicted in FIG. 20A, first printhead assembly docking gasket 1345 and second printhead assembly docking gasket 1385 can be affixed around first printhead assembly opening 1342 and second printhead assembly opening 1382, respectively. During various printhead measurement and maintenance procedures, first printhead assembly 2501 and second printhead assembly 2502 can be positioned by first X,Z-axis carriage assembly 2301 and second X,Z-axis carriage assembly 2302, respectively, over first printhead assembly opening 1342 of first floor panel assembly 1341' and second printhead assembly opening 1382 of second floor panel assembly 1381', respectively. In that regard, for various printhead measurement and maintenance procedures, first printhead assembly 2501 and second printhead assembly 2502 can be positioned over first printhead assembly opening 1342 of first floor panel assembly 1341' and second printhead assembly opening 1382 of second floor panel assembly 1381', respectively, without covering or sealing first printhead assembly opening 1342 and second printhead assembly opening 1382. First X,Z-axis carriage assembly 2301 and second X,Z-axis carriage assembly 2302 can dock first printhead assembly enclosure 2503 and second printhead assembly enclosure 2504, respectively, with first printhead management system auxiliary panel assembly 1330' and second printhead management system auxiliary panel assembly 1370', respectively. In various printhead measurement and maintenance procedures, such docking may effectively close first printhead assembly opening 1342 and second printhead assembly opening 1382 without the need for sealing first printhead assembly opening 1342 and second printhead assembly opening 1382. For various printhead measurement and maintenance procedures, the docking can include the formation of a gasket seal between each of the printhead assembly enclosures and the printhead management system panel assemblies. In conjunction with sealably closing passages, such as second passage 1365 and a complementary first passage of FIG. 20A, when first printhead assembly enclosure 2503 and second printhead assembly enclosure 2504 are docked with first printhead management system auxiliary panel assembly 1330' and second printhead management system auxiliary panel assembly 1370' to sealably close first printhead assembly opening 1342 and second printhead assembly opening 1382, the combined structures so formed are hermetically sealed.

Accordingly, sealing of first printhead assembly opening 1342 and second printhead assembly opening 1382 can separate first printhead management system auxiliary panel assembly 1330' as an auxiliary enclosure section and second printhead management system auxiliary panel assembly 1370' as an auxiliary enclosure section from the remaining volume of gas enclosure assembly 1000. For various printhead measurement and maintenance procedures, first printhead assembly 2501 and second printhead assembly 2502 can be docked upon a gasket in a Z-axis direction over first printhead assembly opening 1342 and second printhead assembly opening 1382, respectively, thereby closing first printhead assembly opening 1342 and second printhead assembly opening 1382. According to the present teachings, depending on the force applied to first printhead assembly enclosure 2503 and second printhead assembly enclosure 2504 in the Z-axis direction, first printhead assembly opening 1342 and second printhead assembly opening 1382 can be either be covered or sealed. In that regard, a force applied to first printhead assembly enclosure 2503 in the Z-axis direction that can seal first printhead assembly opening 1342 can isolate first printhead management system auxiliary panel assembly 1330' as an auxiliary enclosure section from the remaining frame member assembly sections comprising gas enclosure assembly 1000. Similarly, a force applied to second printhead assembly enclosure 2504 in the Z-axis direction that can second printhead assembly opening 1382 can isolate second printhead management system auxiliary panel assembly 1370' as an auxiliary enclosure section from the remaining frame member assembly sections comprising gas enclosure assembly 1000.

FIGS. 22A-22F are schematic cross-section views of gas enclosure assembly 1001 that can further illustrate various aspects of first printhead management system auxiliary panel assembly 1330' and second printhead management system auxiliary panel assembly 1370'. Various embodiments of a printing system, such as printing system 2000 of FIG. 20A and FIG. 20B, can be symmetric, and can have first X,Z-axis carriage assembly 2301 and second X,Z-axis carriage assembly 2302 for positioning first printhead assembly 2501 and second printhead assembly 2502, respectively. Moreover, various embodiments of a gas enclosure assembly can have a first and second auxiliary enclosure, such as first printhead management system auxiliary panel assembly 1330' and second printhead management system auxiliary panel assembly 1370' of FIG. 20A, for docking a first and second X-axis carriage assembly, which can have at least one printhead assembly, as well as other various apparatuses that may require maintenance. In that regard, for FIGS. 22A-22D, given the printing system symmetry of various printing systems of the present teachings, the following teachings recited for first printhead management system auxiliary panel assembly 1330' can apply to second printhead management system auxiliary panel assembly 1370'.

Figure 22A:
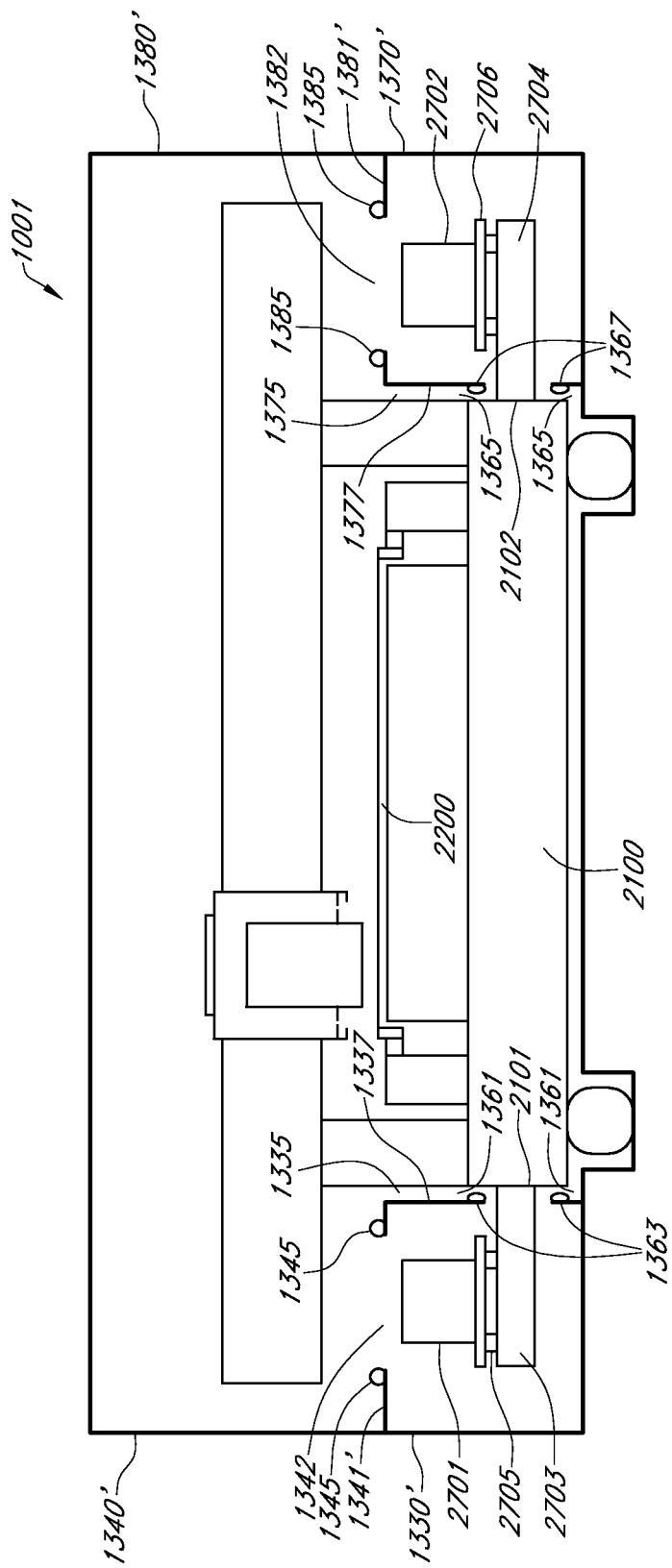
FIG. 22A is a schematic cross-sectional view of a gas enclosure system according to various embodiments of the present teachings.

FIG. 22A depicts a schematic cross-section view of gas enclosure assembly 1001, showing first printhead management system auxiliary panel assembly 1330' and second printhead management system auxiliary panel assembly 1370'. First printhead management system auxiliary panel assembly 1330' of FIG. 22A can house first printhead management system 2701, which can be positioned in relationship to first printhead assembly opening 1342 by first printhead management system positioning system 2705. First printhead assembly opening 1342 is an opening in first floor panel assembly 1341', which is a panel in common with first printhead management system auxiliary panel assembly 1330' and first middle enclosure panel assembly 1340'. First printhead management system positioning system 2705 can be mounted on first printhead management system platform 2703, which can be stably mounted to base 2100 on first end 2101. First printhead management system platform 2703 can extend through first passage 1361 from first end 2101 of base 2100 into first printhead management system auxiliary panel assembly 1330'. Similarly, as depicted in FIG. 22A, second printhead management system auxiliary panel assembly 1370' of FIG. 22A can house second printhead management system 2702, which can be positioned in relationship to second printhead assembly opening 1382 by second printhead management system positioning system 2706. Second printhead assembly opening 1382 is an opening in first floor panel assembly 1381', which is a panel in common with second printhead management system auxiliary panel assembly 1370' and second middle enclosure panel assembly 1380'. Second printhead management system positioning system 2706 can be mounted on second printhead management system platform 2704, which can extend through second passage 1365 from second end 2102 of base 2100 into second printhead management system auxiliary panel assembly 1370'.

First seal 1363 can be mounted on first outer surface 1337 of first seal-support panel 1335 around first passage 1361. Similarly, second seal 1367 can be mounted on second outer surface 1377 of second seal-support panel 1375 around second passage 1365. With respect to seal 1361 and 1367 of FIG. 22A, it is contemplated that a variety of gaskets providing a mechanical seal can be used for sealing for sealing passages 1361 and 1367.

In various embodiments, an inflatable gasket for sealing passage 1361 and 1367 can be used. Various embodiments of an inflatable gasket can be a made from a reinforced elastomeric material into a hollow molded structure, which when not inflated can be in a concave, convoluted or flat configuration. In various embodiments, a gasket can be mounted on panel first outer surface 1337 of first seal-support panel 1335 and second outer surface 1377 of second seal-support panel 1375 for sealably closing passages 1361 and 1367, respectively around base 2100. As such, when inflated using any of a variety of appropriate fluid media, for example, but not limited by, an inert gas, various embodiments of an inflatable gasket for sealably closing passages 1361 and 1367 around base 2100, can form a tight barrier between a mounting surface, such as first outer surface 1337 of first seal-support panel 1335 and second outer surface 1377 of second seal-support panel 1375, and a striking surface, such as the surface of first end 2101 and second end 2012 of base 2100, respectively. In various embodiments, an inflatable gasket can be mounted on first end 2101 and second end 2012 of base sealing passage 1361 and 1367, respectively. In that regard, for various embodiments, first end 2101 and second end 2012 of base 2100 can be a mounting surfaces and the first outer surface 1337 of first seal-support panel 1335 and second outer surface 1377 of second seal-support panel 1375 can be a striking surfaces, respectively. In that regard, various embodiments a conforming seal can be used to sealably close passages 1361 and 1365.

In addition to various embodiments of an inflatable gasket, a flexible seal, such as a bellows seal or a lip seal, can also be used for sealing passage a passage, such as passage 1361 and 1365 of FIG. 22A. Various embodiments of a flexible seal can be permanently attached, for example, attached to first outer surface 1337 of first seal-support panel 1335 and second outer surface 1377 of second seal-support panel 1375. Alternatively, various embodiments of a flexible seal can be permanently attached to first end 2101 and second end 2102 of base 2100. Such a permanently attached seal can provide the flexibility needed to accommodate the various translational and vibrational movements of base 2100, while at the same time providing a hermetic seal for a passage, such as passages 1361 and 1365.

Regarding various challenges related to hermetic sealing of various embodiments of a gas enclosure assembly of the present teachings, forming a conforming seal around a well-defined edge can be problematic. In various embodiments of a gas enclosure in which sealing around a structure, such as first printhead management system platform 2703 and second printhead management system platform 2703 affixed to first end 2101 and second end 2012 of base 2100, respectively. Such platform structures can be fabricated to eliminate well-defined edges where sealing is desired. For example, first printhead management system platform 2703 and second printhead management system platform 2703 affixed to first end 2101 and second end 2012 of base 2100 can be initially fabricated to have rounded lateral edges for promoting sealing. first printhead management system platform 2703 and second printhead management system platform 2703 affixed to first end 2101 and second end 2012 of base 2100 can be made of a material that can provide the stability needed for supporting a printhead management system, for example, but not limited by, granite and steel, and also modified for promoting sealing.

Figure 22B:
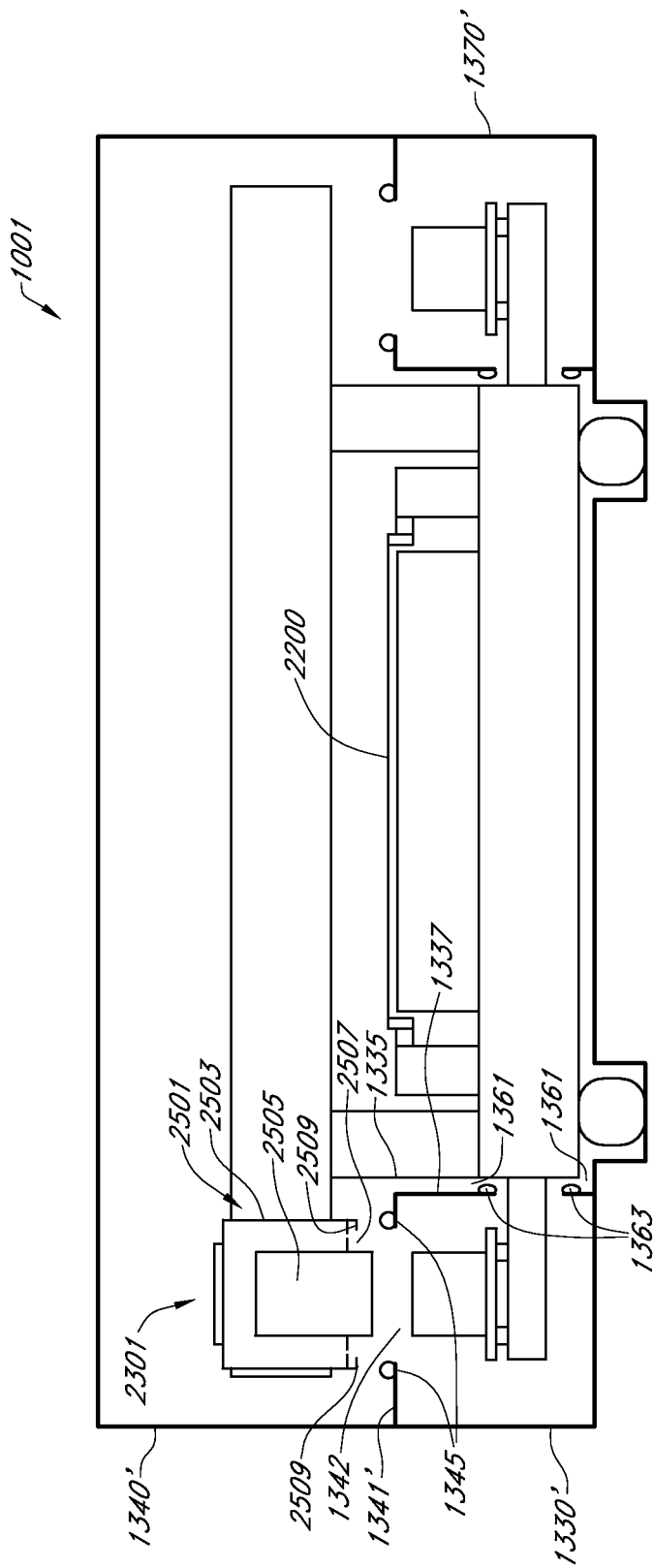
FIG. 22B and FIG. 22C are schematic cross-sectional views of a gas enclosure system depicting the successive movement of a printhead assembly moving into position for maintenance in accordance with various embodiments of the present teachings.
Figure 22C:
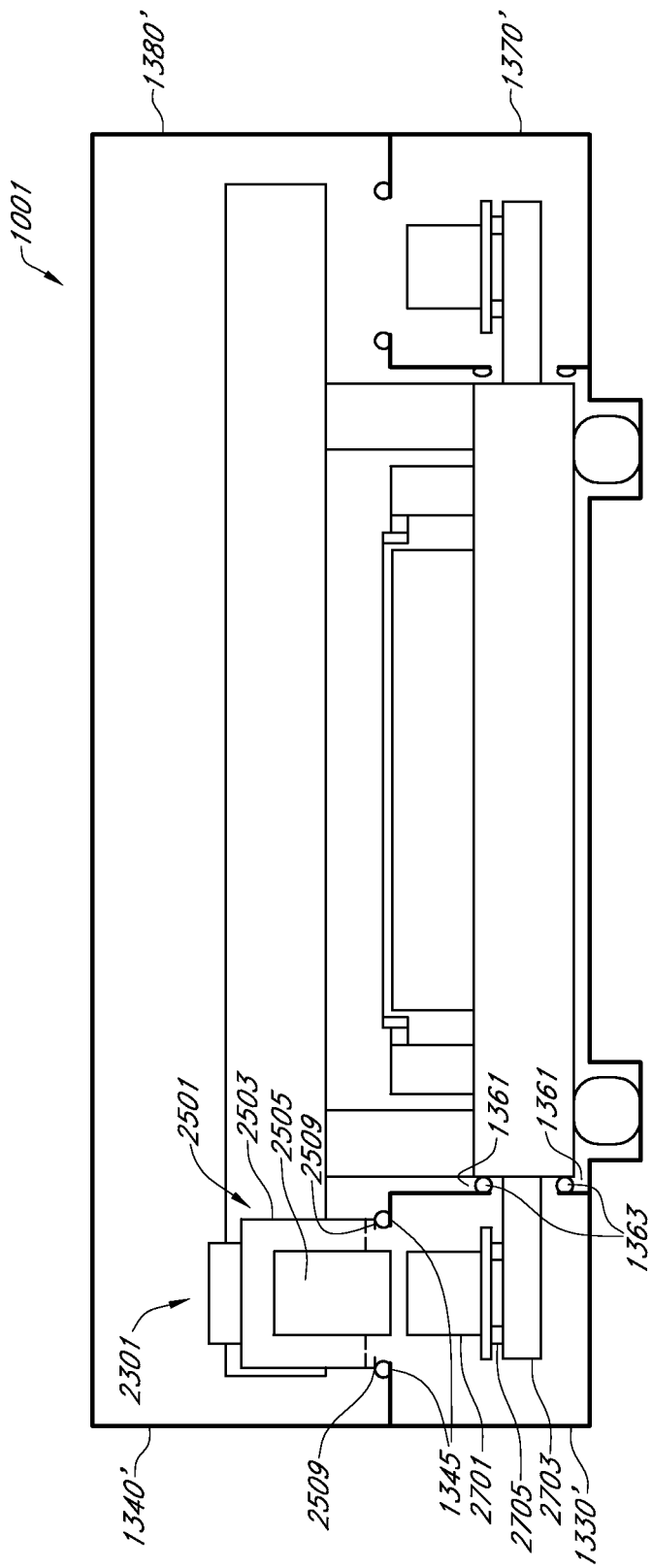

FIGS. 22B and 22C illustrate covering and sealing of various openings and passages of gas enclosure assembly 1001 of the present teachings, which illustrates positioning of first printhead assembly 2501 with respect to first printhead management system auxiliary panel assembly 1330' for various procedures related to printhead assembly management, for example. As previously mentioned, the following teachings for first printhead management system auxiliary panel assembly 1330' can apply to second printhead management system auxiliary panel assembly 1370', as well.

In FIG. 22B, first printhead assembly 2501 can include a printhead device 2505, having at least one printhead, which includes a plurality of nozzles or orifices. Printhead device 2505 can be housed in first printhead assembly enclosure 2503, which can have first printhead assembly enclosure opening 2507 from which printhead device 2505 can be positioned so that during printing the nozzles eject ink at a controlled rate, velocity and size onto a substrate mounted on substrate floatation table 2200. As previously discussed, first X,Z-axis carriage assembly 2301 can be controlled during a printing process to position first printhead assembly 2501 over a substrate for printing. Additionally, as depicted in FIG. 22B, for various embodiments of gas enclosure assembly 1001, first X,Z-axis carriage assembly 2301, which has controllable X-Z axis movement, can position first printhead assembly 2501 in over first printhead assembly opening 1342. As depicted in FIG. 22B, first printhead assembly opening 1342 of first floor panel assembly 1341' is common to first middle enclosure panel assembly 1340' and first printhead management system auxiliary panel assembly 1330'.

First printhead assembly enclosure 2503 of FIG. 22B can include first printhead assembly enclosure rim 2509, which can be a docking surface with first floor panel assembly 1341' around first printhead assembly opening 1342. First printhead assembly enclosure rim 2509 can engage first printhead assembly docking gasket 1345, which is depicted in FIG. 22B affixed around first printhead assembly opening 1342. Though first printhead assembly enclosure rim 2509 is shown depicted as an inwardly projecting structure, any of variety of rims can be constructed on first printhead assembly enclosure 2503. Additionally, though first printhead assembly docking gasket 1345 is depicted in FIG. 22B to be affixed around first printhead assembly opening 1342, the ordinary practitioner will appreciate that gasket 1345 can be affixed to first printhead assembly enclosure rim 2509. First printhead assembly docking gasket 1345 can be any of a gasket material as previously described for sealing frame member assemblies. In various embodiments of gas enclosure assembly 1001 of FIG. 22B, first printhead assembly docking gasket 1345 can be an inflatable gasket, such as gasket 1363. In that regard, first printhead assembly docking gasket 1345 can be an inflatable gasket as previously described for FIG. 22A. As previously presented, first seal 1363 can be mounted on first outer surface 1337 of first seal-support panel 1335 around first passage 1361.

As depicted in FIG. 22B and FIG. 22C, for various measurement and maintenance procedures that can be conducted in a fully-automated mode, first printhead assembly 2501 can remain positioned over first printhead assembly opening 1342. In that regard, first printhead assembly 2501 can be adjusted in the Z-axis direction by first X,Z-axis carriage assembly 2301 for positioning printhead device 2505 over first printhead assembly opening 1342 with respect to first printhead management system 2701. Additionally, first printhead management system 2701 can be adjusted in the Y-X direction on first printhead management system positioning system 2705 for positioning first printhead management system 2701 with respect to printhead device 2505. During various procedures related to the management of a printhead assembly, first printhead assembly 2501 can be placed into contact with first printhead assembly docking gasket 1345 by further adjustment in the Z-axis direction by first X,Z-axis carriage assembly 2301 to place first printhead assembly enclosure 2503 in a position to cover first printhead assembly opening 1342 (not shown). As depicted in FIG. 22C, for various procedures related to the management of a printhead assembly, for example, but not limited by, maintenance procedures requiring direct access to the interior of first printhead management system auxiliary panel assembly 1330', first printhead assembly 2501 can be docked with first printhead assembly docking gasket 1345 by still further adjustment in the Z-axis direction by first X,Z-axis carriage assembly 2301 to seal first printhead assembly opening 1342. As previously mentioned, first printhead assembly docking gasket 1345 can be either a compressible gasket material as previously described for the hermetic sealing of various frame members, or an inflatable gasket, as previously described for FIG. 22A. Additionally, as depicted in FIG. 22C, inflatable gasket 1363 can be inflated, thereby sealably closing first passage 1361. Moreover, the portions of first printhead assembly enclosure 2503 forming a housing can be constructed as previously described for various panel assemblies, so that the frame assembly members and panels are capable of providing an hermetic enclosure. As such, for FIG. 22C, when first printhead assembly opening 1342 and first passage 1361 are sealably closed, first printhead management system auxiliary panel assembly 1330' can be isolated from the remaining volume of gas enclosure assembly 1001.

Figure 22D:
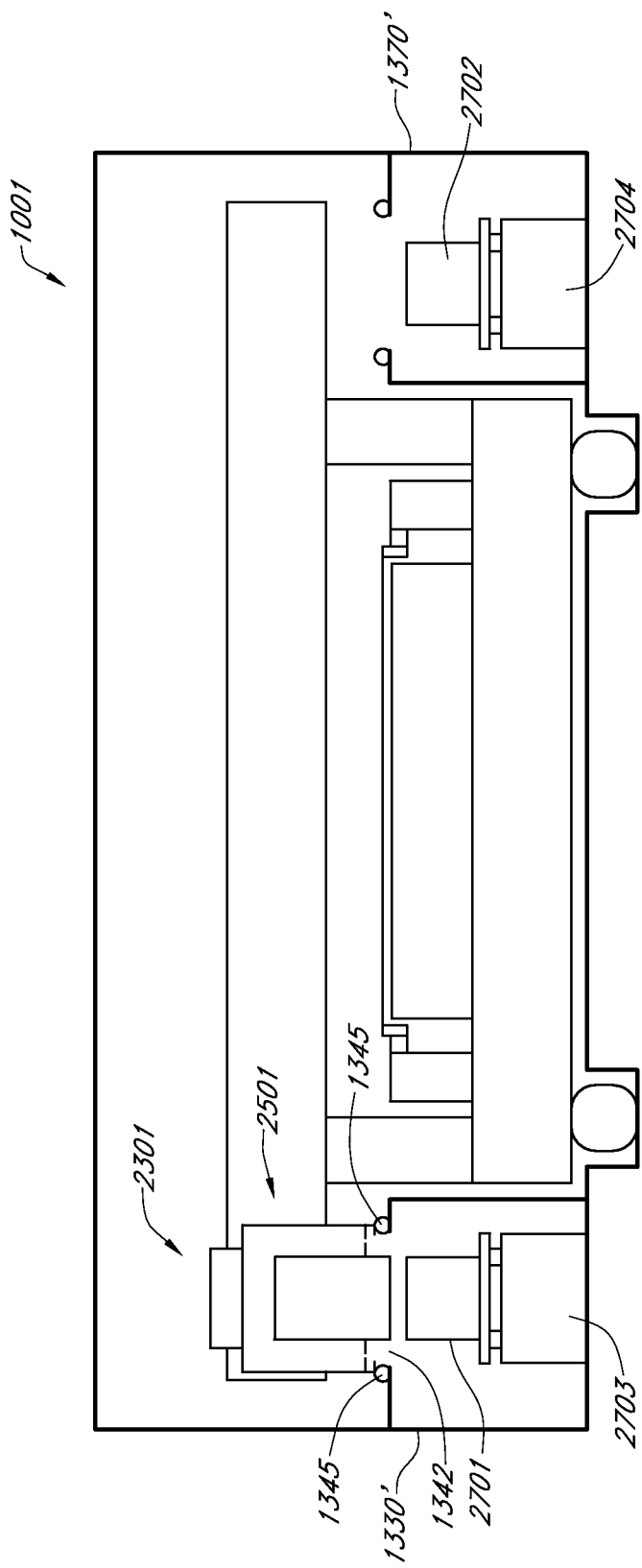
FIG. 22D through FIG. 22F are schematic cross-sectional views of a gas enclosure system according to various embodiments of the present teachings.
Figure 22E:
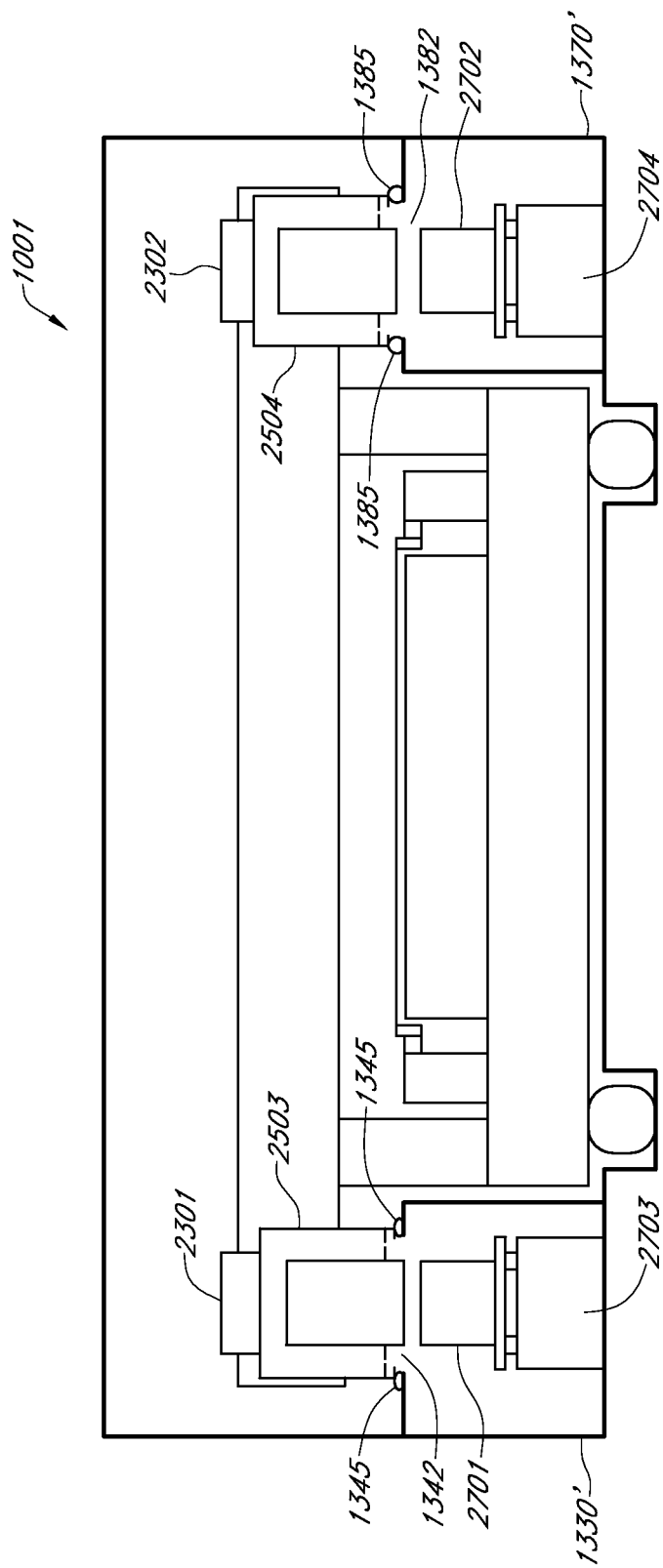

In FIG. 22D and FIG. 22E, various embodiments of gas enclosure 1001 are depicted in which first printhead management system 2701 and second printhead management system 2702 can be mounted on first printhead management system platform 2703 and second printhead management system platform 2704, respectively. In 22D and FIG. 22E, first printhead management system platform 2703 and second printhead management system platform 2704 are enclosed within first printhead management system auxiliary panel assembly 1330' and second printhead management system auxiliary panel assembly 1370', respectively. As previously mentioned, the following teachings for first printhead management system auxiliary panel assembly 1330' can apply to second printhead management system auxiliary panel assembly 1370', as well. In that regard, as indicated in FIG. 22D, first printhead assembly 2501 can be docked with first printhead assembly docking gasket 1345 with enough force applied the Z-axis direction by first X,Z-axis carriage assembly 2301 so that first printhead assembly opening 1342 can be sealed. As such, for FIG. 22D, when first printhead assembly opening 1342 is sealably closed, first printhead management system auxiliary panel assembly 1330' can be isolated from the remaining volume of gas enclosure assembly 1001.

As previously taught for various embodiments of gas enclosure assembly 1001 of FIGS. 22A-22C, a printhead can remain positioned over first printhead assembly opening 1342 to during various procedures related to the management of a printhead assembly without covering or sealing first printhead assembly opening 1342 so as to close first printhead assembly opening 1342. In various embodiments of gas enclosure assembly 1001, for example, but not limited by, for various maintenance procedures, a printhead assembly enclosure can be placed into contact with a gasket by adjusting the Z-axis to cover a printhead assembly opening. In this regard, FIG. 22E can be interpreted in two ways. In a first interpretation, first printhead assembly docking gasket 1345 and second printhead assembly docking gasket 1385 can made from a compressible gasket material, such as previously described for the hermetic sealing of various frame members. In FIG. 22E, first printhead assembly 2501 has been positioned in the Z-axis direction over first printhead management system 2701 so that gasket 1345 has been compressed, thereby sealably closing first printhead assembly opening 1342. In comparison, second printhead assembly 2502 has been positioned in the Z-axis direction over second printhead management system 2702 to contact second printhead assembly docking gasket 1385, thereby covering second printhead assembly opening 1382. In a second interpretation, first printhead assembly docking gasket 1345 and second printhead assembly docking gasket 1385 can be an inflatable gasket, as previously described for FIG. 22A. In FIG. 22E, first printhead assembly 2501 can be positioned in the Z-axis direction over first printhead management system 2701 to contact first printhead assembly docking gasket 1345 before it is inflated, thereby covering first printhead assembly opening 1342. In comparison, second printhead assembly 2502 has been positioned in the Z-axis direction over second printhead management system 2702 so that when second printhead assembly docking gasket 1385 is inflated, second printhead assembly opening 1382 is sealably closed.

Figure 22F:
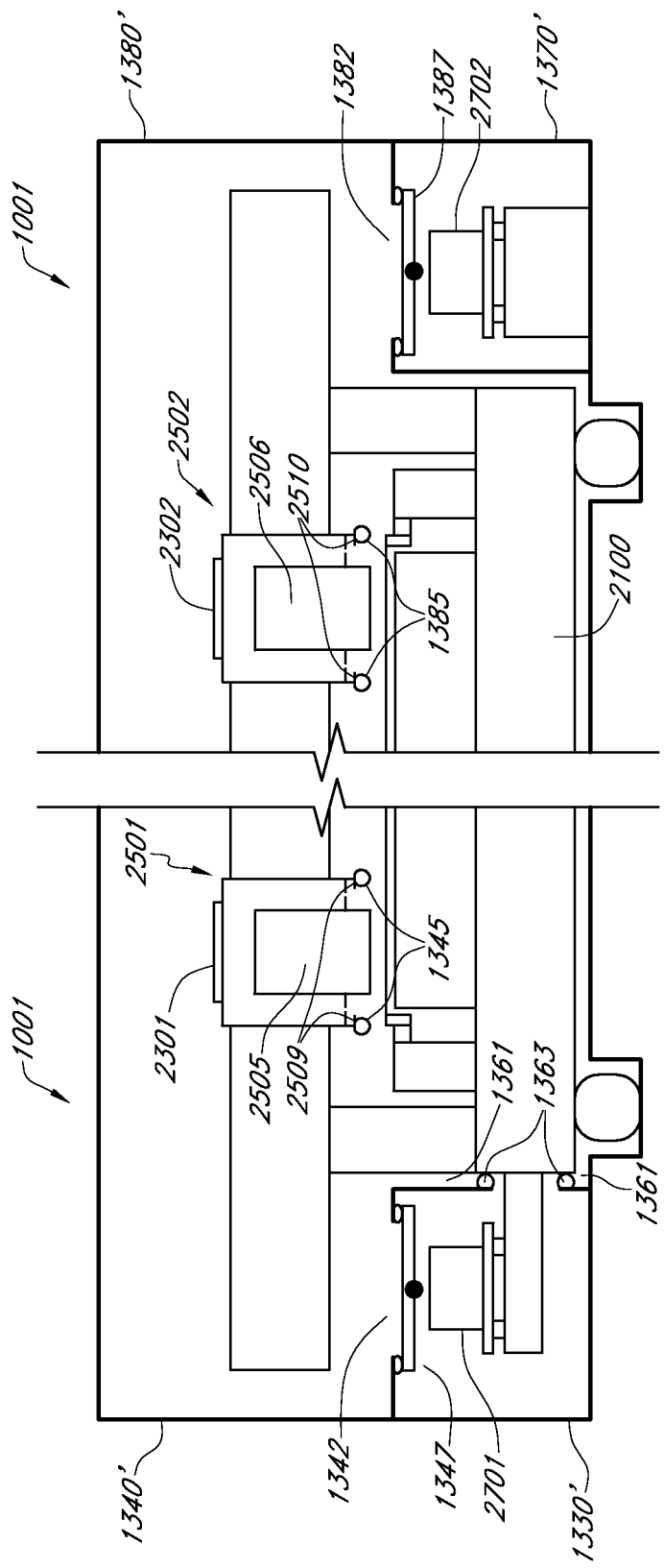

FIG. 22F depicts that a volume defined by, for example, illustrated using first printhead management system auxiliary panel assembly 1330' and second printhead management system auxiliary panel assembly 1370', can be sealed using a covering such as, for example, but not limited by, a gate-valve assembly. The following teachings for first printhead management system auxiliary panel assembly 1330' and second printhead management system auxiliary panel assembly 1370' can apply to various embodiments of printhead management system panel assemblies and gas enclosure assemblies. As depicted in FIG. 22F, closing first printhead assembly opening 1342 and second printhead assembly opening 1382 using, for example, but not limited by, first printhead assembly gate valve 1347 and second printhead assembly gate valve 1387, respectively, can provide for continued operation of first printhead assembly 2501 and second printhead assembly 2502, respectively. As depicted for first printhead management system auxiliary panel assembly 1330' of FIG. 22F, sealably closing first printhead assembly opening 1342 using first printhead assembly gate valve 1347, as well as sealably closing first passage 1361 around base 2100 can be done remotely and automatically. Similarly, as depicted for second printhead management system auxiliary panel assembly 1370' of FIG. 22F, sealably closing second printhead assembly opening 1382 using second printhead assembly gate valve 1387 can be done remotely and automatically. It is contemplated that various printhead measurement and maintenance procedures can be facilitated by isolation of a volume defined by an auxiliary frame member assembly section, for example, as defined by first printhead management system auxiliary panel assembly 1330' and second printhead management system auxiliary panel assembly 1370', while still providing for the continuation of printing processes utilizing first printhead assembly 2501 and second printhead assembly 2502.

As previously mentioned, first printhead assembly docking gasket 1345 and second printhead assembly docking gasket 1385 can be affixed around first printhead assembly opening 1342 and second printhead assembly opening 1382, respectively. Additionally, as depicted in FIG. 22F, first printhead assembly docking gasket 1345 and second printhead assembly docking gasket 1385 can be affixed around first printhead assembly enclosure rim 2509 and second printhead assembly enclosure rim 2510, respectively. When maintenance of first printhead assembly 2501 and second printhead assembly 2502 is indicated, first printhead assembly gate valve 1347 and second printhead assembly gate valve 1387 can be opened, and first printhead assembly 2501 and second printhead assembly 2502 can dock with first printhead management system auxiliary panel assembly 1330' and second printhead management system auxiliary panel assembly 1370' as previously described.

For example, but not limited by, any procedure related to the management of a printhead assembly that can be performed on first printhead management system 2701 and second printhead management system 2702 by isolating first printhead management system auxiliary panel assembly 1330' and second printhead management system panel assembly 1370,' respectively, without interrupting printing processes. It is further contemplated that loading of new printheads or printhead assembles into the system, or removal of printheads or printhead assemblies from the system can be done by isolating first printhead management system auxiliary panel assembly 1330' and second middle printhead management system panel assembly 1370,' respectively, without interrupting printing processes. Such activities may be facilitated automatically, for example, but not limited by, the use of robots. For example, but not limited by, robotic retrieval of a printhead stored in a volume defined by an auxiliary frame member assembly section, such as first printhead management system auxiliary panel assembly 1330' and second printhead management system auxiliary panel assembly 1370' of FIG. 22F could be done, followed by robotic changing of a malfunctioning printhead on printhead device 2505 of first printhead assembly 2501 or on printhead device 2506 of second printhead assembly 2502 for a functioning printhead. This could then be followed by robotic deposition of a malfunctioning printhead into a module in either first printhead management system 2701 or second printhead management system 2702. Such maintenance procedures can be carried out in an automated mode without disrupting ongoing printing processes.

After robotic deposition of a malfunctioning printhead in either first printhead management system 2701 or second printhead management system 2702, a volume defined by an auxiliary frame member assembly section, such as first printhead management system auxiliary panel assembly 1330' and second printhead management system auxiliary panel assembly 1370', respectively can be sealably closed and isolated by closing first printhead assembly opening 1342 and second printhead assembly opening 1382 using, for example, but not limited by, first printhead assembly gate valve 1347 and second printhead assembly gate valve 1387, respectively. Moreover a volume defined by an auxiliary frame member assembly section can then be opened to the atmosphere, for example, in accordance with the preceding teachings, so that malfunctioning printheads can be retrieved and replaced. As will be discussed in more detail subsequently, as various embodiments of a gas purification system are designed with respect to the volume of an entire gas enclosure assembly, gas purification resources can be devoted to purging the significantly reduced volume of a volume defined by an auxiliary frame member assembly section space, thereby significantly reducing system recovery time for a volume defined by an auxiliary frame member assembly section. In that regard, various procedures related to the management of a printhead assembly that would require opening an auxiliary frame member assembly section to the atmosphere can be carried out with either no or minimal disruption to ongoing printing processes.

Figure 23:
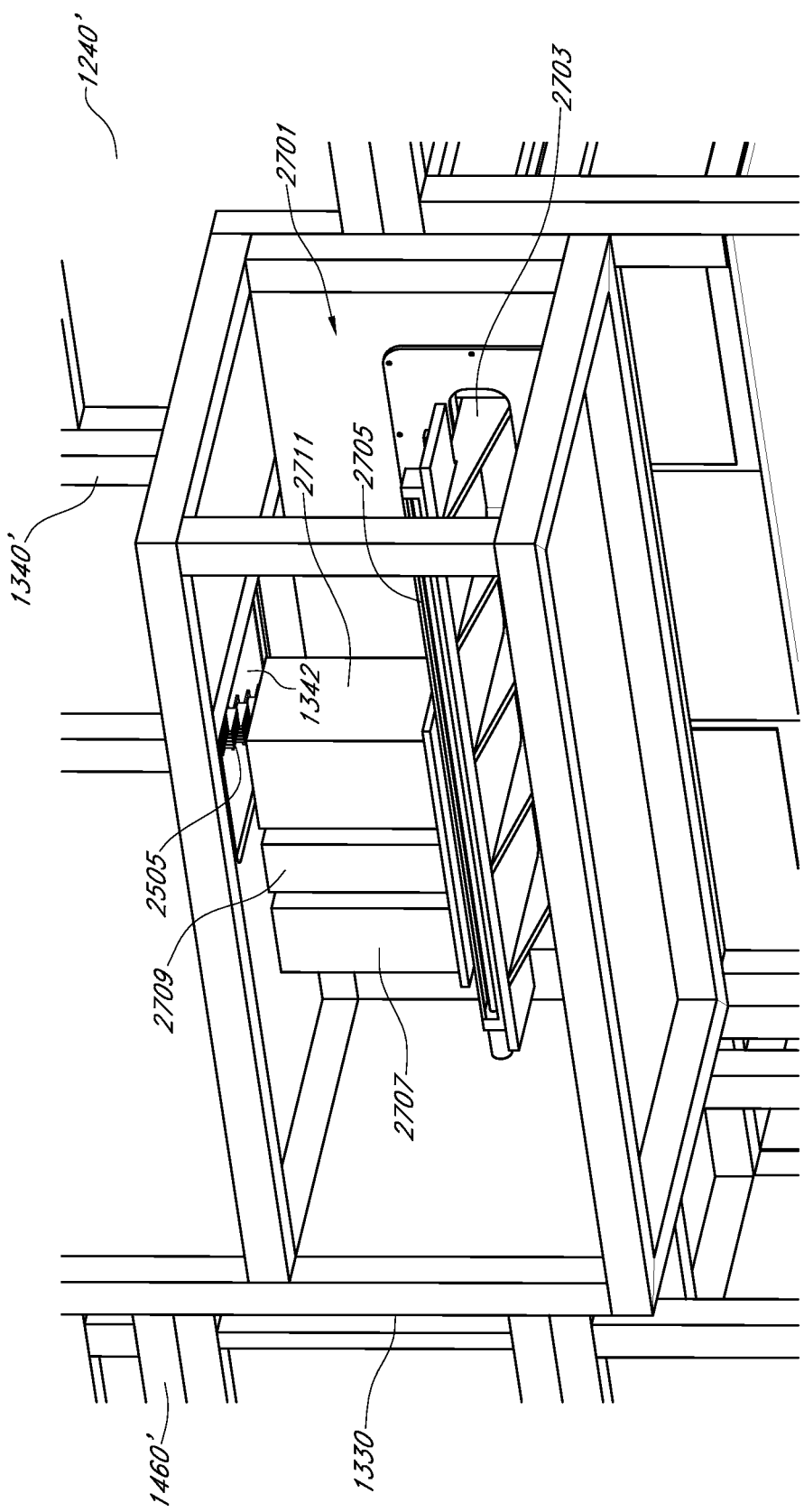
FIG. 23 depicts a perspective view of a maintenance station mounted in an auxiliary enclosure of a gas enclosure assembly in accordance with various embodiments of the present teachings.

FIG. 23 depicts an expanded view of first printhead management system 2701 housed within first printhead management system auxiliary panel assembly 1330' in accordance with various embodiments of a gas enclosure assembly and system of the present teachings. As previously discussed, a printhead management system can include, for example, but not limited by, a drop measurement module, a purge station, a blotting station and a printhead exchange station. In various embodiments of a printhead management system, a drop measurement module can perform measurements on a printhead, such as checking for nozzle firing, measuring drop volume, velocity and trajectory, as well as tuning a printhead so that each nozzle ejects a droplet of known volume. For various embodiments of a printhead management system, a purge station can be used for priming and purging a printhead, which requires collection and containment of the ink expelled from a printhead, while a blotting station can be utilized for removal of excess ink after the priming or purging procedure. Additionally, a printhead management system can include one or more printhead exchange stations for receiving one or more printheads or printhead devices that have been removed from a printhead assembly, such as first printhead assembly 2501 and second printhead assembly 2502 of FIG. 20B, as well as for storing printheads or printhead devices that can be loaded into first printhead assembly 2501 and second printhead assembly 2502 during a various procedures related to the management of a printhead assembly.

Various embodiments of a printhead management system according to the present teachings, such as first printhead management system 2701 of FIG. 23, apparatuses 2707, 2709, and 2011 can be a variety of modules for performing various functions. For example apparatuses 2707, 2709, and 2011 can be one or more of a drop measurement module, a printhead replacement module, a purge basin module and a blotter module. First printhead management system 2701 can be mounted on first printhead management system positioning system 2705. First printhead management system positioning system 2705 can provide Y-axis movement to selectively align each of the various modules with a printhead assembly having a printhead device with at least one printhead, such as printhead device 2505 of FIG. 22B, with first printhead assembly opening 1342. Positioning of various modules with a printhead assembly having a printhead device with at least one printhead can be done using a combination of first printhead management system positioning system 2705, as well as a printhead assembly positioning system, such as first X,Z-axis carriage assembly 2301 of FIG. 20B. For various embodiments of a gas assembly system of the present teachings, printhead management system positioning system 2705 can provide Y-X positioning of various modules of first printhead management system 2701 relative to first printhead assembly opening 1342, while first X,Z-axis carriage assembly 2301 can provide X-Z positioning of first printhead assembly 2501 over first printhead assembly opening 1342. In that regard, a printhead device with at least one printhead can be positioned over or within first printhead assembly opening 1342 to receive maintenance.

Figure 24A:
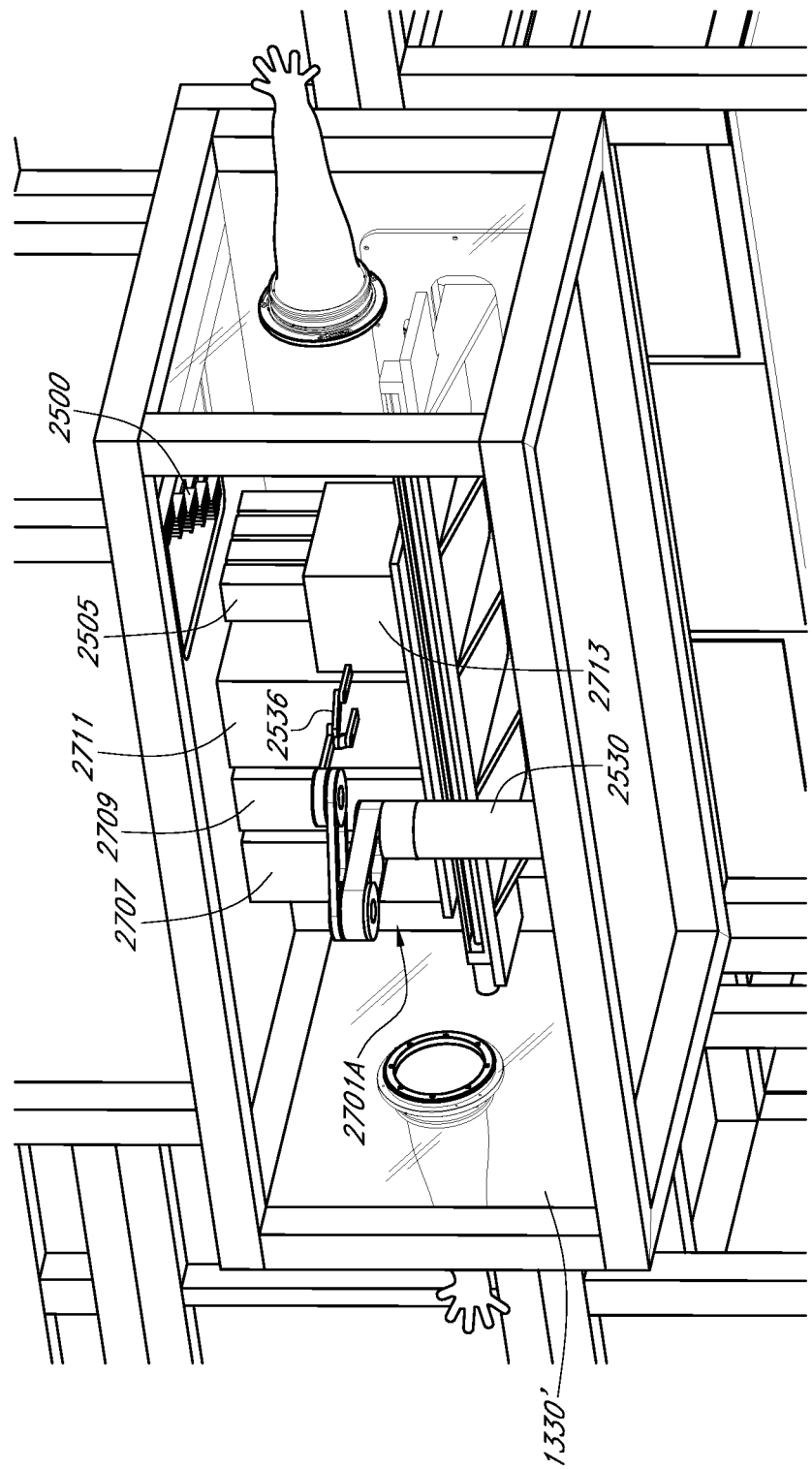
FIG. 24A and FIG. 24B depict various embodiments of systems and methods according to the present teachings.

FIG. 24A depicts an expanded view of first printhead management system 2701A housed within first printhead management system auxiliary panel assembly 1330' in accordance with various embodiments of a gas enclosure assembly and system of the present teachings. As depicted in FIG. 24A, auxiliary panel assembly 1330' is shown with front removable service windows absent to more clearly see the details of first printhead management system 2701A. Various embodiments of a printhead management system according to the present teachings, such as first printhead management system 2701A of FIG. 24A, apparatuses 2707, 2709, and 2011 can be a variety of subsystems or modules for performing various functions. For example apparatuses 2707, 2709, and 2011 can be a drop measurement module, a printhead purge basin module and a blotter module. As depicted in FIG. 24A, printhead replacement module 2713 can provide locations for docking at least one printhead device 2505. In various embodiments of first printhead management system 2701A, first printhead management system auxiliary panel assembly 1330' can be maintained to the same environmental specifications that gas enclosure assembly 1000 (see FIG. 19) is maintained. First printhead management system auxiliary panel assembly 1330' can have handler 2530 positioned for the carrying out tasks associated with various printhead management procedures. For example, each subsystem can have various parts that are consumable by nature, and require replacement, such as replacing blotter paper, ink, and waste reservoirs. Various consumable parts can be packaged for ready insertion, for example, in a fully automated mode using a handler. As a non-limiting example, blotter paper can be packaged in a cartridge format, which can be readily inserted for use into a blotting module. By way of another non-limiting example ink can be packaged in a replaceable reservoir, as well as a cartridge format for use in a printing system. Various embodiments of a waste reservoir can be packaged in a cartridge format, which can be readily inserted for use into a purge basin module. Additionally, parts of various components of a printing system subject to on-going use can require periodic replacement. During a printing process, expedient management of a printhead assembly, for example, but not limited by, an exchange of a printhead device or printhead, can be desirable. A printhead replacement module can have parts, such as a printhead device or printhead, which can be readily inserted for use into a printhead assembly. A drop measurement module used for checking for nozzle firing, as well as the measurement based on optical detection of drop volume, velocity and trajectory from every nozzle can have a source and a detector, which can require periodic replacement after use. Various consumable and high-usage parts can be packaged for ready insertion, for example, in a fully automated mode using a handler. Handler 2530 can have end effector 2536 mounted to arm 2534. Various embodiments of an end effector configuration can be used, for example, a blade-type end effector, a clamp-type end effector, and a gripper-type end effector. Various embodiments of an end effector can include mechanical grasping and clamping, as well as pneumatic or vacuum-assisted assemblies to either actuate portions of the end effector or otherwise retain a printhead device or a printhead from a printhead device.

Regarding the replacement of a printhead device or printhead, printhead replacement module 2713 of printhead management system 2701A FIG. 24A can include a docking station for a printhead device having at least one printhead, as well as a storage receptacle for a printhead. As each printhead assembly (see FIG. 20B) can include between about 1 to about 60 printhead devices, and as each printhead device can have between about 1 to about 30 printheads, then various embodiments of a printing system of the present teachings can have between about 1 to about 1800 printheads. In various embodiments of printhead replacement module 2013, while a printhead device is docked, each printhead mounted to the printhead device can be maintained in an operable condition while not in use in a printing system. For example, when placed in a docking station, each printhead on each printhead device can be connected to an ink supply and an electrical connection. Electrical power can be provided to each printhead on each printhead device, so that a periodic firing pulse to each nozzle of each printhead can be applied while docked in order to ensure that the nozzles remain primed and do not clog. Handler 2530 of FIG. 24A can be positioned proximal to printhead assembly 2500. Printhead assembly 2500 can be docked over first printhead management system auxiliary panel assembly 1330', as depicted in FIG. 24A. During a procedure for exchanging a printhead, handler 2530 can remove a target part; either a printhead or printhead device having at least one printhead, from printhead assembly 2500. Handler 2530 can retrieve a replacement part, such as a printhead device or a printhead, from printhead replacement module 2013, and complete the replacement process. The removed part can be placed in printhead replacement module 2713 for retrieval.

Figure 24B:
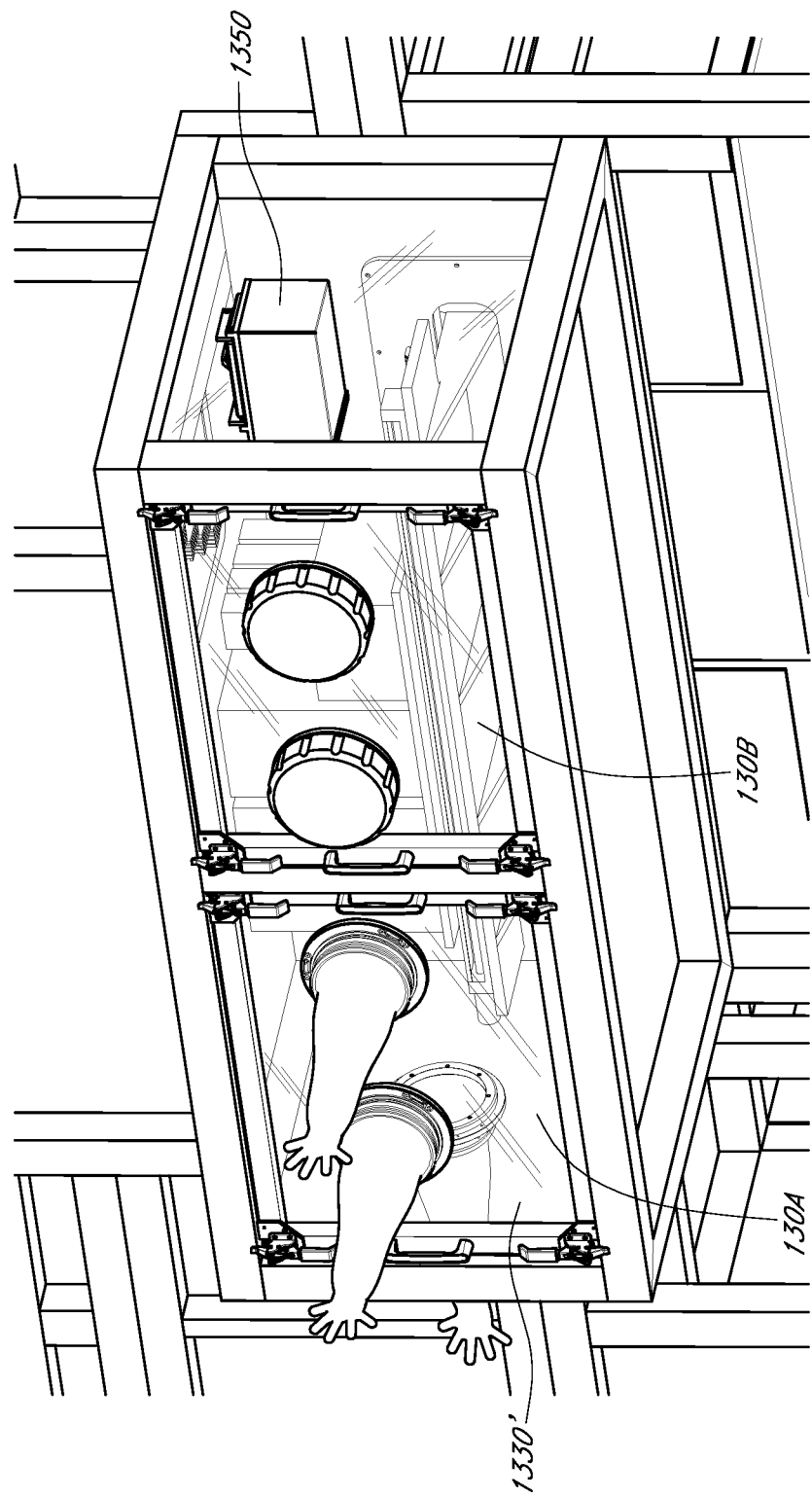

As depicted in FIG. 24B, auxiliary panel assembly 1330' can have first removable service window 130A and second removable service window 130B mounted on the front panel for ready access from the exterior of a gas enclosure, such as gas enclosure 1000 of FIG. 20A. Additionally, a load lock, such as load lock 1350, can be mounted on a wall panel of auxiliary panel assembly 1330'. According to various embodiments of the present teachings, a printhead management procedure as described for FIG. 24A recited as being performed by a handler, can be performed remotely by an end-user through various gloveports, as shown by the various locations of gloves and gloveports in FIG. 24A and FIG. 24B.

Moreover, for various embodiments of systems and methods of the present teachings, load lock 1350 can be used transfer various parts for subsystems and modules of various embodiments of a printhead management system of the present teachings. Various replacement parts for printhead management system 2701A of FIG. 24A, for example, but not limited by, a blotter paper cartridge, an ink cartridge, a waste reservoir, a printhead and a printhead device, and can transferred into auxiliary panel assembly 1330' using load lock 1350 using handler 2530 of FIG. 24A, and moved to printhead management system 2701A of FIG. 24A. Conversely, parts needing replacement, for example, but not limited by, a blotter paper cartridge, an ink cartridge, a waste reservoir, a printhead and a printhead device, can be removed from printhead management system 2701A by handler 2530 of FIG. 24A and placed in load lock 1350. According to the present teachings, load lock 1350 can have a gate that is open to the exterior of a gas enclosure, such as gas enclosure 1000 of FIG. 20A, while a gate that allows access to auxiliary panel assembly 1330' is closed, exposing only load lock 1350 to ambient gas during a procedure for transfer of parts. After a procedure for the retrieval of parts, the replacement of parts or both has been completed, a gate for load lock 1350 allowing access to the exterior of a gas enclosure can be closed, and load lock 1350 can go through a recovery procedure to restore the gas environment of the load lock to a target specification. In a next step, a gate between load lock 1350 and auxiliary panel assembly 1330' can be open, so that retrieval or removed parts from auxiliary panel assembly 1330', as well as transfer of replacement parts to auxiliary panel assembly 1330' can be done by a handler, such as handler 2530 of FIG. 24A.

Given the substantially small volume of load lock 1350 in comparison to the volume of auxiliary panel assembly 1330', the recovery time is substantially shorter than the recovery time for auxiliary panel assembly 1330', allowing ready transfer of parts between load lock 1350 and auxiliary panel assembly 1330' without interruption of a printing process. Further, should any maintenance requiring direct access to auxiliary panel assembly 1330' be indicated, removable service windows 130A and 130B can allow such direct access to auxiliary panel assembly 1330' from the exterior of a gas enclosure, such as gas enclosure 1000 of FIG. 20A. Given the substantially small volume of auxiliary panel assembly 1330' in comparison to the volume of the working volume of a gas enclosure, such as gas enclosure 1000 of FIG. 20A, the recovery time for auxiliary panel assembly 1330' is substantially shorter than the recovery time for the entirety of the working volume of a gas enclosure. As such, all steps associated with a printhead management procedure can be done to eliminate or minimize the exposure of a printing system enclosure to contamination, such as air and water vapor and various organic vapors, as well as particulate contamination. According to various systems and methods of the present teachings, a printing system enclosure may be introduced to a level of contamination that is sufficiently low that a purification system can remove the contamination before it can affect a printing process. In that regard, various embodiments of auxiliary panel assembly 1330' can provide for fully automated replacement of a part in a printhead management system while maintaining an inert, particle-free environment and with little or no interruption of a printing process.

Figure 25:
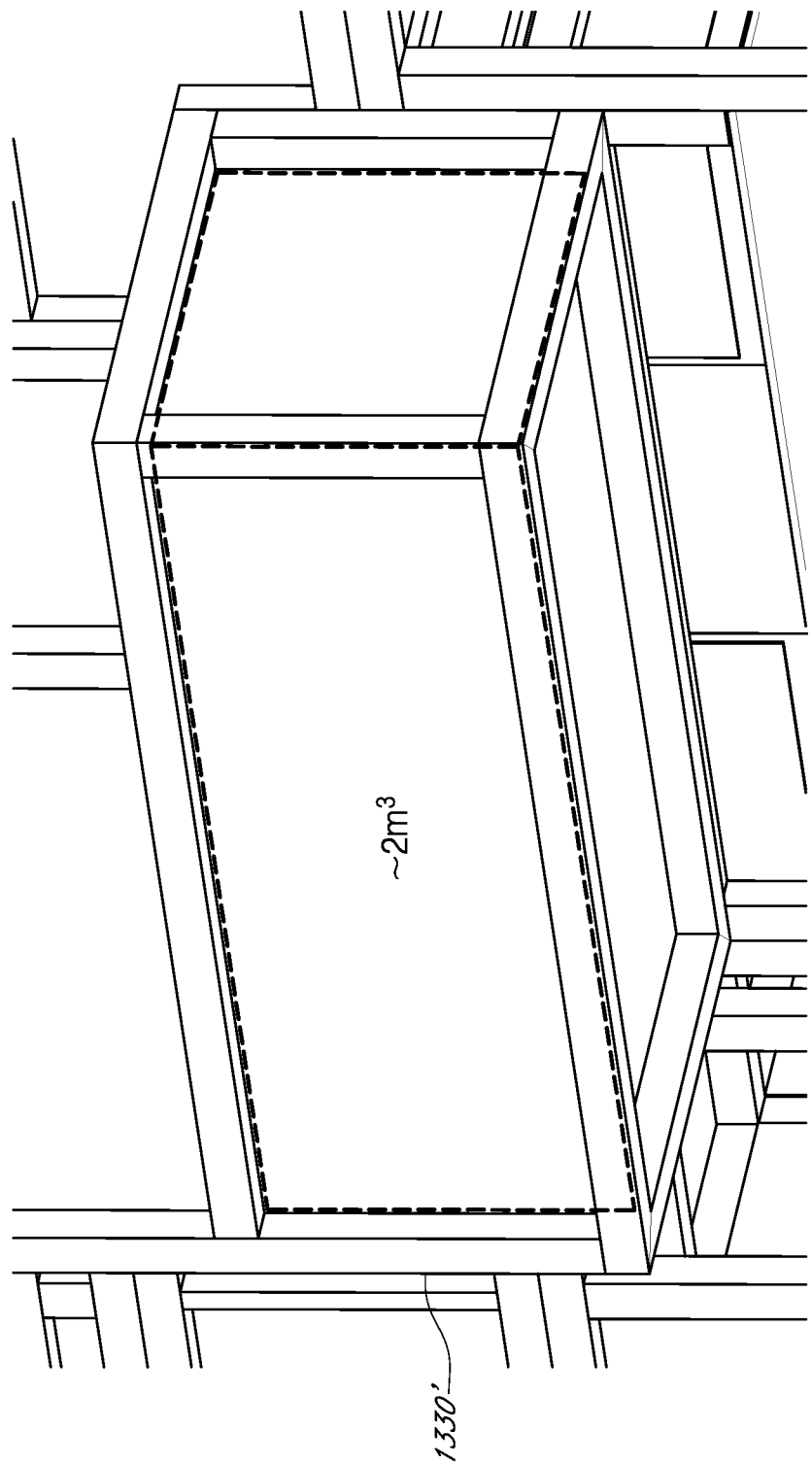
FIG. 25 is a perspective view of an auxiliary enclosure of a gas enclosure assembly in accordance with various embodiments of the present teachings.

FIG. 25 illustrates expanded perspective view of first printhead management system auxiliary panel assembly 1330'. As indicated, it is contemplated that the volume of various printhead management system panel assemblies, such as first printhead management system auxiliary panel assembly 1330', can be about 2 m$^3$. It is contemplated that various embodiments of an auxiliary frame member assembly section can have a volume of about 1 m$^3$, while for various embodiments of an auxiliary frame member assembly section the volume can be about 10 m$^3$. For various embodiments of a gas enclosure assembly, such as gas enclosure assembly 100 of FIG. 3 and 1000 of FIG. 19, an auxiliary frame member assembly section can be a fractional value of the enclosure volume of a gas enclosure system. For example, an auxiliary frame member assembly section can be less than or equal to about 1% of the enclosure volume of a gas enclosure system. In various embodiments of a gas enclosure assembly, an auxiliary frame member assembly section can be less than or equal to about 2% of the enclosure volume of a gas enclosure system. For various embodiments of a gas enclosure assembly, an auxiliary frame member assembly section can be less than or equal to about 5% of the total volume of a gas enclosure system. In various embodiments of a gas enclosure assembly, an auxiliary frame member assembly section can be less than or equal to about 10% of the enclosure volume of a gas enclosure system. In various embodiments of a gas enclosure assembly, an auxiliary frame member assembly section can be less than or equal to about 20% of the enclosure volume of a gas enclosure system. Accordingly, given the relatively small volume of an auxiliary enclosure, recovery of an auxiliary enclosure can take significantly less time than recovery of an entire printing system enclosure.

Various procedures associated with printhead management can be conducted in a fully-automated mode. As will be discussed in more detail subsequently, in some instances, where a certain degree of end-user intervention may be indicated during various procedures related to the management of a printhead assembly, end-user access can be done externally through, for example, the use of gloveports. As previously discussed, various embodiments of a gas enclosure assembly with an auxiliary enclosure as a section of the gas enclosure assembly, for example, as depicted in FIG. 19 through FIG. 25 effectively decrease the volume of inert gas required during an OLED printing process, while at the same time provide ready access to the interior of gas enclosure.

In addition to various embodiments of a gas enclosure system having an auxiliary enclosure constructed as a section of a gas enclosure assembly, various embodiments of an auxiliary enclosure can be associated with a gas enclosure system without being constructed as an auxiliary frame member assembly section of a gas enclosure assembly.

For example, for various embodiments of a gas enclosure system of the present teachings, an auxiliary enclosure can be an adaptable controlled-environment enclosure. According to the present teachings, an adaptable controlled-environment enclosure can be adaptable with respect flexibility of design and construction, which can include, for example, number and types of openings, environmental control systems, size, breadth of selection of materials used for construction, as well as ease of installation. For example, in various embodiments, an adaptable can be of a soft wall construction, in which the framework can be, for example, either steel, powder-coated steel, or aluminum, and the panels can be fabricated from a flexible polymer sheet material, such as for example, vinyl, polyvinyl chloride, and polyurethane, of about 1-2 mm thickness. For various embodiments of a soft wall construction, the flexible polymeric sheet material can be mounted as a series of strips, as intact sheets, as well as combinations of strips and sheets. In still other embodiments of an auxiliary enclosure, an adaptable controlled-environment enclosure can be a hard wall construction, in which the panel material is a rigid material, such as a rigid plastic, for example, an acrylic or polycarbonate material, or a tempered glass material. For various embodiments of a hard wall construction, various panels of a hard wall construction, such as a wall panel, window panel, and door panel, can be selected from different materials. In various embodiments of the present teachings, an adaptable controlled-environment enclosure can be a combination of a hard wall and soft wall construction. Panel materials for various embodiments of an adaptable controlled-environment enclosure of the present teachings may be selected for attributes that include, for example, but not limited by, low-particle generation, high optical clarity, effective static dissipation, and mechanical durability.

In addition to an adaptable controlled-environment enclosure, various embodiments of an auxiliary enclosure can be a transfer chamber. In still other embodiments, an auxiliary chamber can be a load lock chamber. According to the present teachings, various embodiments of an auxiliary enclosure can have a separate environmental control system from the working volume of a gas enclosure system, while other embodiments of an auxiliary enclosure can be maintained using the same environmental control system as the working volume of a gas enclosure system. Various embodiments of an auxiliary enclosure can be stationary, while other embodiments of an auxiliary enclosure can be movable, such as on wheels or on a track assembly, so that they can be readily positioned for use proximal to a gas enclosure system.

Figure 26A:
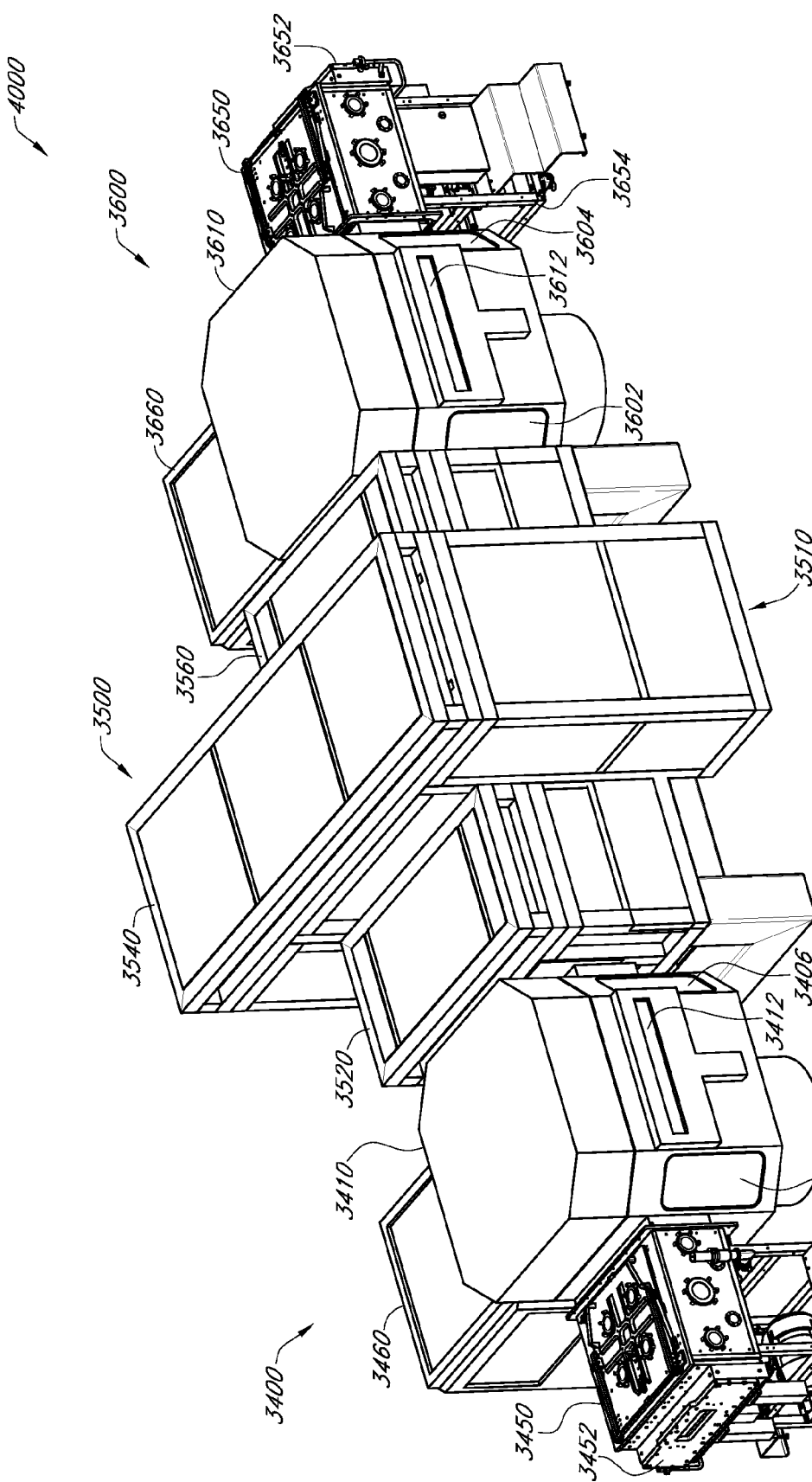
FIG. 26A is a front perspective view of an OLED printing tool, according to various embodiments of systems and methods of the present teachings.

FIG. 26A depicts a perspective view of OLED printing tool 4000 according to various embodiments of the present teachings, which can include first module 3400, printing module 3500, and second module 3600. Various modules, such as first module 3400 can have first transfer chamber 3410, which can have a gate, such as gate 3412, for each side of first transfer chamber 3410 to accommodate various chambers having a specified function. As depicted in FIG. 26A first transfer chamber 3410 can have a load lock gate (not shown) for integration of first load lock chamber 3450 with first transfer chamber 3410, as well as a buffer gate (not shown) for integration of first buffer chamber 3460 with first transfer chamber 3410. Gate 3412 of first transfer chamber 3410 can be used for a chamber or unit that can be movable, such as, but not limited by, a load lock chamber. Observation windows, such as observation windows 3402 and 3404 of first transfer chamber 3410, as well as observation window 3406 of first buffer chamber 3460, can be provided for an end user to, for example, monitor a process. Printing module 3500 can include gas enclosure assembly 3510, which can have first panel assembly 3520, printing system enclosure assembly 3540, and second panel assembly 3560. Similar to gas enclosure assembly 1000 of FIG. 19, gas enclosure assembly 3510 can house various embodiments of a printing system. Second module 3600 can include second transfer chamber 3610, which can have a gate, such as gate 3612, for each side of second transfer chamber 3610 to accommodate various chambers having a specified function. As depicted in FIG. 26A second transfer chamber 3610 can have a load lock gate (not shown) for integration of second load lock chamber 3650 with second transfer chamber 3610, as well as a buffer gate (not shown) for integration of second buffer chamber 3660 with second transfer chamber 3610. Gate 3612 of second transfer chamber 3610 can be used for a chamber or unit that can be movable, such as, but not limited by, a load lock chamber. Observation windows, such as observation windows 3602 and 3604 of second transfer chamber 3610, can be provided for an end user to, for example, monitor a process.

First load lock chamber 3450 and second load lock chamber 3650 can be affixably associated with first transfer chamber 3410 and second transfer chamber 3610, respectively or can be movable, such as on wheels or on a track assembly, so that they can be readily positioned for use proximal a chamber. As previously described for gas enclosure system 500 of FIG. 1, a load lock chamber can be mounted to a support structure and can have at least two gates. For example first load lock chamber 3450 can be supported by first support structure 3454 and can have first gate 3452, as well as a second gate (not shown) that can allow fluid communication with first transfer module 3410. Similarly, second load lock chamber 3650 can be supported by second support structure 3654 and can have second gate 3652, as well as a first gate (not shown) that can allow fluid communication with second transfer module 3610.

Figure 26B:
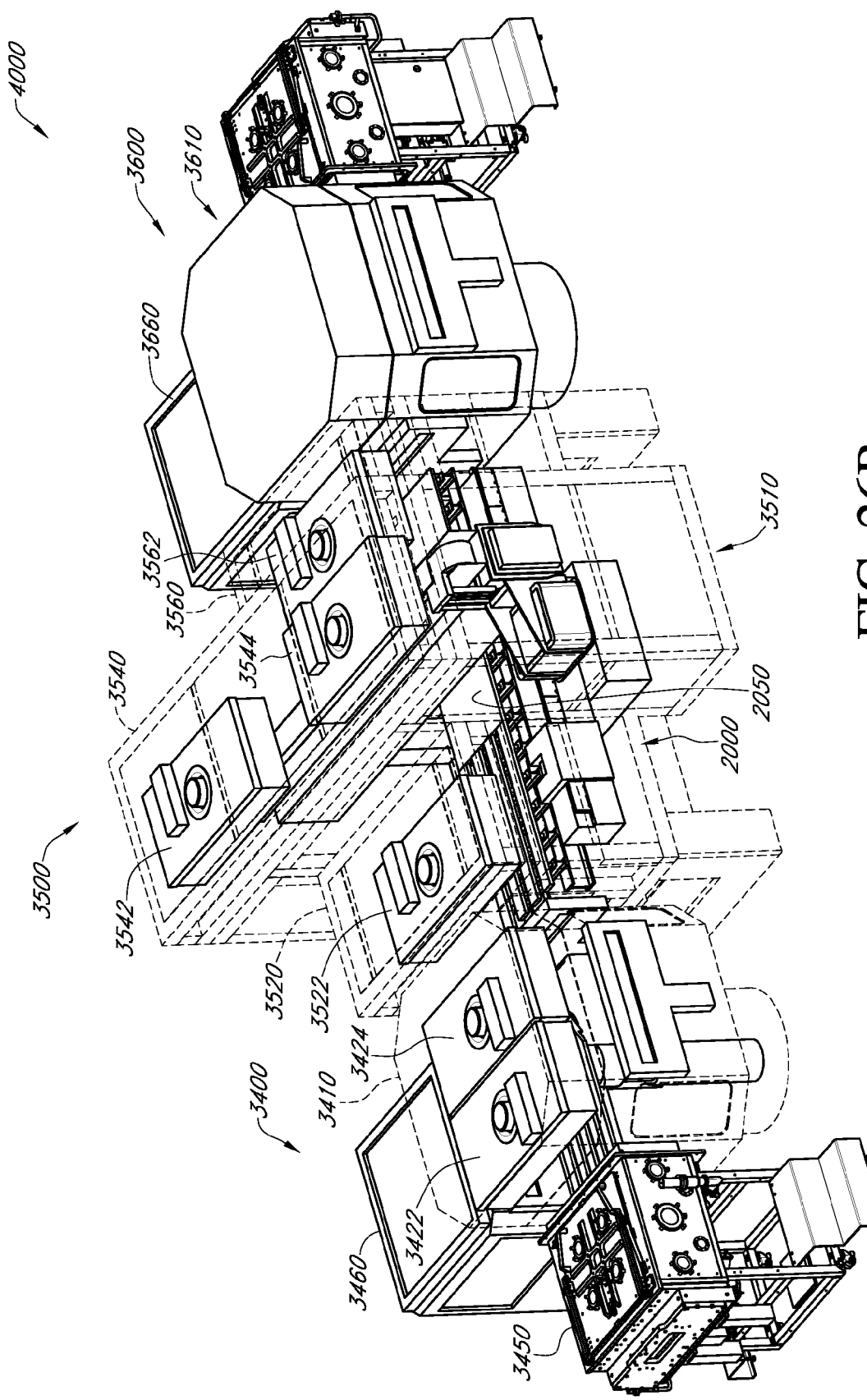
FIG. 26B is a first phantom perspective view of an OLED printing tool as shown in FIG. 26A, according to various embodiments of systems and methods of the present teachings.

FIG. 26B a first phantom perspective view of OLED printing tool 4000 of FIG. 26A, which particularly depicts the placement of a plurality of fan filter units proximal to the position of travel of a substrate. As previously discussed, the number, size and shape of fan filter units for a fan filter unit assembly of a circulation and filtration system can be selected in accordance with the physical position of a substrate in a printing system during processing. The number, size and shape of fan filter units for a fan filter unit assembly selected with respect to the physical travel of a substrate can provide a low-particle zone proximal a substrate during a substrate manufacturing process. Various embodiments of printing module 3500 of FIG. 26A through FIG. 26C can also include a controlled particulate level meeting the standards of International Standards Organization Standard (ISO) 14644-1:1999, "Cleanrooms and associated controlled environments—Part 1: Classification of air cleanliness," as specified by Class 1 through Class 5. In an illustrative example of FIG. 26B, an array of fan filter units can be located along a path traversed by a substrate during processing, such, for example fan filter units 3422 and 3423 of first module 3400, as well as fan filter units 3522, 3542, 3544, and 3562 of second module 3500 as depicted in FIG. 26B. Fan filter units can be included in other chambers, such as one or more fan filter unit located within transfer chamber 3610 of second module 3600, similarly to fan filter units 3422 and 3423 of first module 3400, within the first buffer chamber 3460 or the second buffer chamber 3660. As previously described, various embodiments of a circulation and filtration system of the present teachings need not provide a down-flow direction of air flow. For various embodiments of systems and methods of the present teachings, ductwork and fan filter units can be positioned to provide a substantially laminar flow in a lateral direction across a surface of a substrate, such as substrate 2050, as well as a vertical direction, as depicted in FIG. 26B. Such laminar flow can enhance or otherwise provide particulate control.

Figure 26C:
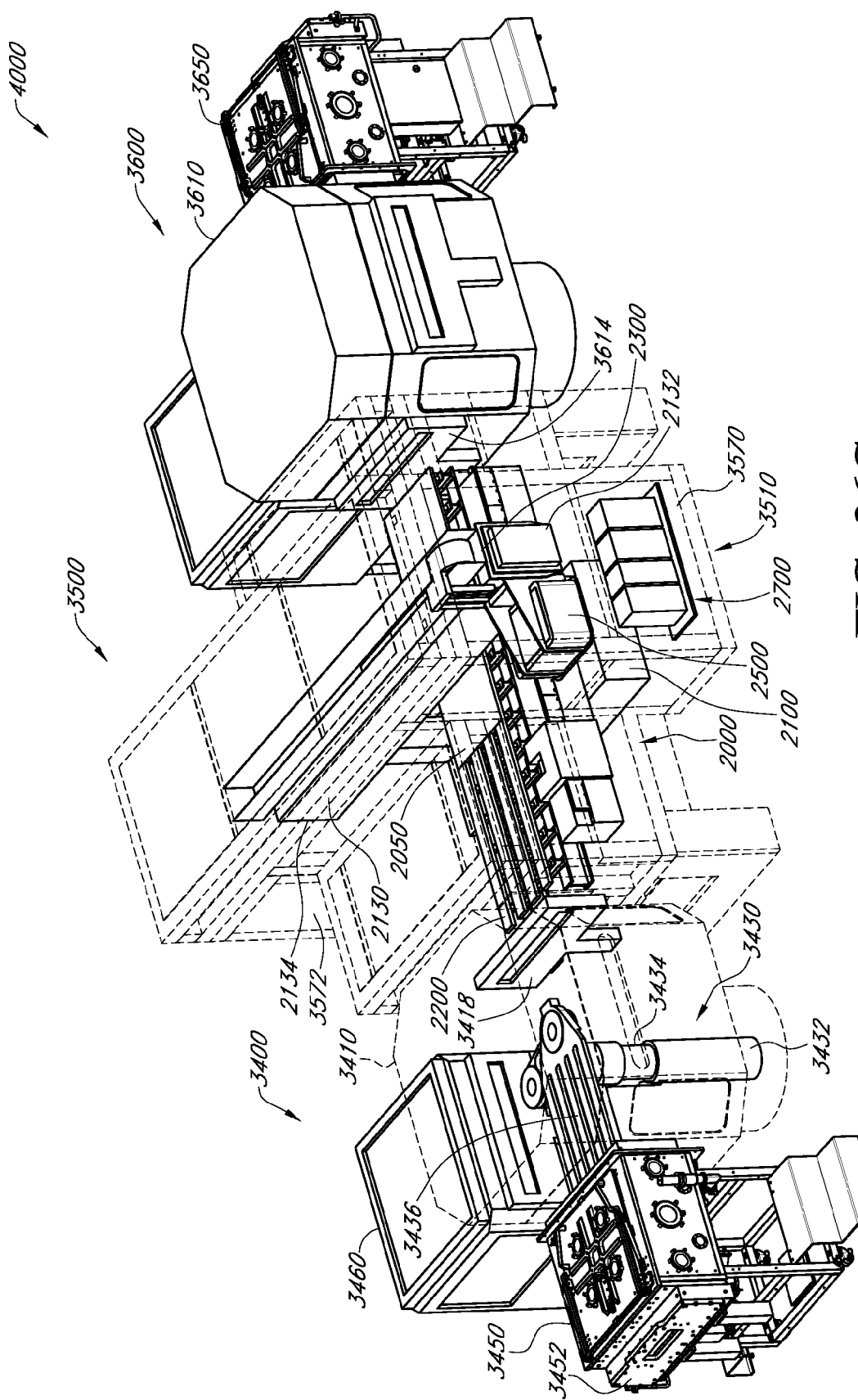
FIG. 26C is a second phantom perspective view of an OLED printing tool as shown in FIG. 26A, according to various embodiments of systems and methods of the present teachings.

FIG. 26C is a second phantom perspective view of OLED printing tool 4000 of FIG. 26A, which shows more detail of a handler and a printing system according to the present teachings. As previously discussed, OLED printing tool 4000 can include a first load lock chamber 3450, which can be sealably coupled to a first transfer chamber 3410. The first load lock chamber 3450 can be in fluid communication with transfer chamber 3410 by a port, which can be, for example, a gas-impermeable gate. When such a gas-impermeable gate is opened, an interior of first load lock chamber 3450 can be accessed by a handler, such as handler 3430, depicted in FIG. 26C in first transfer chamber 3410. Handler 3430, shown in FIG. 26C can have base 3432, arm assembly 3434, and end effector 3436. Handler 3430, which is proximal to first transfer module printing system gate 3418, can position a substrate on the input end of floatation table 2200, which can be supported by printing system base 2100. Given the position of handler 3430 within first module 3400, handler 3430 can be proximal to any chamber of first module 3400, and can, for example, position a substrate into any chamber. In that regard, handler 3430 can position a substrate into buffer 3460 via first module buffer gate 3416 as workflow may demand. Handler 3430 can be a robotic assembly having various degrees of freedom in order to manipulate a substrate, such as substrate 2050, which are shown in FIG. 26C to be supported on floatation table 2200 of printing system 2000. Handler 3430 can manipulate a substrate using an end effector, such as end effector 3436. An end effector such as end effector 3436 can include a tray or frame configured to support a substrate by gravity, or an end effector can securely grasp or clamp a substrate to allow, for example, secure transfer from one position to a next position or for reorientation of the substrate from a face-up or face-down configuration to one or more other configurations. Various embodiments of an end effector configuration can be used, for example, a fork-type, a blade-type end effector, a clamp-type end effector, and a gripper-type end effector. Various embodiments of an end effector can include mechanical grasping and clamping, as well as pneumatic or vacuum-assisted assemblies to either actuate portions of the end effector or otherwise retain a substrate. Various embodiments of an end effector can include vacuum suction cups.

Regarding other features of OLED printing tool 4000 as depicted in FIG. 26C, as previously discussed for gas enclosure assembly 100 of FIG. 3 and gas enclosure assembly 1000 of FIG. 19, printing module 3500 of OLED printing tool 4000 can include gas enclosure assembly 3510. Gas enclosure assembly 3510 can have first panel assembly 3520, printing system enclosure assembly 3540, and second panel assembly 3560. Printing module 3500 can have an internal environment maintained as an inert gas environment, and as previously discussed, can be sealed from the surrounding environment (e.g., hermetically sealed). Additionally, first module 3400 and second module 3600 and all associated chambers can likewise have an internal environment that is maintained as an inert gas environment, so that OLED printing tool 4000 can be entirely sealed from the surrounding environment (e.g., hermetically sealed) and have an internal environment maintained as an inert gas environment. As will be discussed in more detail subsequently, a printhead management system, such as printhead management system 2701 FIG. 20B and FIG. 23 and printhead management system 2701A of FIG. 24A, can be positioned in printing system enclosure assembly area 3570 proximal to first bridge end 2132 and printhead assembly 2500. An enclosed system, such as printing tool 4000, including all of the various enclosed interior regions can be monitored and controlled to maintain specified levels of one or more of gas purity, contaminants, or particulates. Recalling, an inert gas environment can be maintained using a gas, such as nitrogen, any of the noble gases, and any combination thereof. An inert gas environment within a gas enclosure system can have levels of each of a reactive species, such as water vapor, oxygen, as well as organic solvent vapors, maintained at 100 ppm or lower, for example, at 10 ppm or lower, at 1.0 ppm or lower, or at 0.1 ppm or lower for various embodiments of a gas enclosure system of the present teachings.

For various embodiments of OLED printing tool 4000 of FIG. 26C, first processing module 3400 can include buffer or holding module 3460 configured to provide respective environmentally-controlled regions to accommodate respective substrates being fabricated. Various environmentally-controlled regions can be offset from each other along a specified (e.g., vertical) axis of a buffer or holding module to provide a "stack buffer" configuration. In this manner, one or more substrates can be buffered or stored within an inert environment of the OLED printing tool 4000, such as queued for further processing in one or more other modules. The respective substrates can be conveyed to the respective environmentally-controlled regions using handler 3430, which can have end effector 3436, which as a depicted in FIG. 26C can be a fork-type end effector, for robotic operation. Recalling, various OLED substrates can be from Gen 3.5 to Gen 8.5 and above, so that substrate dimensions can vary from about 60 cm×72 cm to about 220 cm×250 cm and greater. In order to further secure a substrate through various manipulations, such fork-type end effectors can be equipped with mechanical gripping and clamping assemblies, or can be designed to use mechanical or vacuum suction.

As previously described for gas enclosure system 500 of FIG. 1, first load lock chamber 3450 of FIG. 26C can receive a substrate through gate 3452. When a substrate is received in load lock chamber 3450, the chamber can be isolated and can be purged with an inert gas, such as nitrogen, any of the noble gases, and any combination thereof, until reactive atmospheric gases are at a low of level of 100 ppm or lower, for example, at 10 ppm or lower, at 1.0 ppm or lower, or at 0.1 ppm or lower. The transport of a substrate from load lock chamber 3450 to first transfer module 3400 can be performed by handler 3430, which can place a substrate, such as substrate 2050 on floatation table 2200 in printing module 3500. Floatation table 2200 can be supported by printing system base 2100, as depicted in FIG. 26C. Substrate 2050 can remain supported on a substrate floatation table during the printing process, and can be moved by a Y-axis positioning system relative to printhead assembly 2500, which can be mounted to X-axis carriage assembly 2300. Printing system 2000 of printing module 3500 can be used to controllably deposit one or more film layers on a substrate during OLED device fabrication. Printing module 3500 can also be coupled to an output enclosure region, such as second module 3600 of FIG. 26C. Second module 3600 can have second transfer module output gate 3614, and can have a handler positioned in second transfer module 3610, as depicted for handler 3430 of first module 3400. Floatation table 2200 and a Y-axis positioning system can extend along the travel of a substrate in printing module 3500, so that a substrate can travel to a position proximal to second transfer module printing system gate 3614, and can be readily accessed by a handler positioned in second transfer module 3610 for transfer into second module 3600. As described for handler 3430 positioned in first transfer module 3410, a handler can be located in second module 3600 to readily position a substrate into any chamber of second module 3600. In that regard, a handler positioned in second transfer chamber 3610 can position a substrate into buffer 3660 as workflow may demand.

Within first module 3400, printing module 3500, and second module 3600, a substrate can be repositioned as desired for various processes, or during a single deposition operation. In various embodiments of an OLED printing tool, the inert environments within first module 3400, printing module 3500, and second module 3600 can be maintained by commonly-shared environmental control systems. For various embodiments of an OLED printing tool, the inert environments within first module 3400, printing module 3500, and second module 3600 can be maintained by separate environmental control systems. Second load lock chamber 3650 can be used to transfer substrates out of second module 3600 using a handler in second transfer module 3610, such as after one or more deposition operations involving printing module 3500, or after other processing.

Printing system 2000 can include at least one printhead assembly having one or more printhead devices that can have at least one printhead, for example, for nozzle printing, thermal-jet, nozzle-jet or ink-jet type. The at least one printhead assembly can be mounted to an overhead carriage, such as configured to deposit one or more film layers on a substrate in a "face up" configuration. The one or more film layers that can be deposited by one or more printheads can include one or more of an electron injection or transport layer, a hole injection or transport layer, a blocking layer, or an emission layer, for example. Such materials can provide one or more electrically functional layers. Other materials can be deposited using printing techniques, such as a monomer or polymer material, as described in other examples described herein, such as for providing one or more encapsulation layers for a substrate 4000 being fabricated.

Figure 27:
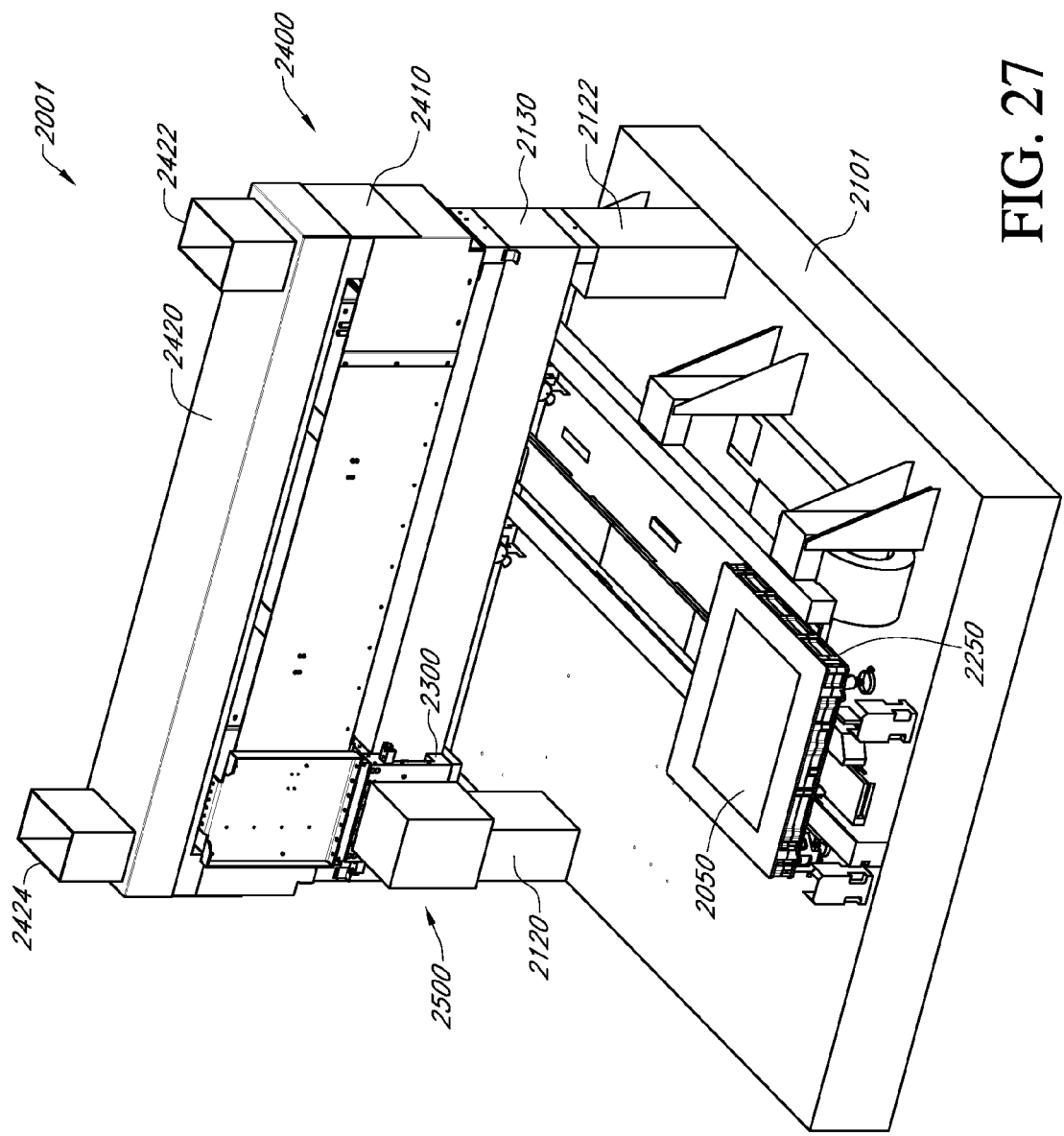
FIG. 27 is an iso perspective view of a printing system according to various embodiments of a printing system of the present teachings.

Though various embodiments of OLED printing tool 4000 can utilize printing system 2000 of FIG. 20B, other embodiments of a printing system can be readily utilized in OLED printing tool 4000, such as exemplary printing system 2001 of FIG. 27. FIG. 27 is a front perspective view of printing system 2001, which is shown with cable tray assembly exhaust system 2400 mounted on top of bridge 2130 for containing and exhausting particulate matter formed by the continual movement of a bundle of cables. Various embodiments of printing system 2001 can have many features as previously described for printing system 2000 of FIG. 20B and printing system 2001 of FIG. 27. For example, printing system 2001 can be supported by printing system base 2101. Mounted upon printing system base 2101 can be first riser 2120 and second riser 2122, upon which bridge 2130 can be mounted. For various embodiments of inkjet printing system 2001, bridge 2130 can support a at least one X,Z-axis carriage assembly 2300 which can move in an X-axis direction relative to substrate support apparatus 2250 through cable carrier run 2401. In various embodiments of printing system 2001, a second X,Z-axis carriage assembly can be mounted on bridge 2130. For embodiments of printing system 2001 having two X,Z-axis carriage assemblies, either a printhead assembly can be mounted on each X,Z-axis carriage, or various devices, such as, a camera, a UV lamp, and a heat source as described for printing system 2000 of FIG. 20B can be mounted on the at least one of the two X,Z-axis carriage assemblies of printing system 2001. According to various embodiments of printing system 2001, substrate support apparatus 2250 for supporting substrate 2050 can be a floatation table, similar to substrate floatation table 2200 of printing system 2000 of FIG. 20B, or it can be a chuck, as previously described for printing system 2000 of FIG. 20B. Printing system 2001 of FIG. 27 can have an intrinsically low-particle generating X-axis motion system, in which X,Z carriage assembly 2300 can be mounted and positioned on bridge 2130 using an air bearing linear slider assembly. Various embodiments of an air bearing linear slider assembly can wrap around the entirety of bridge 2130, allowing frictionless movement of X,Z carriage assembly 2300 on bridge 2130, as well providing three point mounting that can preserve accuracy of travel for X,Z carriage assembly 2300, as well as resisting skew.

The figure sequence from FIG. 28A through FIG. 30C depict various embodiments of systems and methods for printhead management in a fully automated or remote operator-assisted mode with little or no interruption of an ongoing process, while maintaining an inert, substantially particle-free process environment. Recalling, a printhead assembly can include between about 1 to about 60 printhead devices, where each printhead device can have between about 1 to about 30 printheads in each printhead device. Therefore, various embodiments of a printing system of the present teachings can have between about 1 to about 1800 printheads. Moreover, a printhead, for example, an industrial inkjet head, can have between about 16 to about 2048 nozzles, which can expel a droplet volume of between about 0.1 pL to about 200 pL. The sheer number of printheads can require ongoing measurement and maintenance procedures be performed on a periodic basis as required. According to various systems and methods of the present teachings, various process steps related to the ongoing management of various components of a printing system, such as various process steps related to ongoing measurement and maintenance procedures, can be performed using a printhead management system, such as printhead management system 2701 of FIG. 20B and FIG. 23 and printhead management system 2701A of FIG. 24A. Various embodiments of a printhead management system can include various subsystems or modules, such as a printhead replacement module, a drop measurement module, a printhead purge basin module and a blotter module.

Each subsystem or module can have various parts that are consumable by nature, and require replacement, such as replacing blotter paper, ink, and waste reservoirs. Various consumable parts can be packaged for ready insertion, for example, in a fully automated mode using a handler. As a non-limiting example, blotter paper can be packaged in a cartridge format, which can be readily inserted for use into a blotting module. By way of another non-limiting example ink can be packaged in a replaceable reservoir, as well as a cartridge format for use in a printing system. Various embodiments of a waste reservoir can be packaged in a cartridge format, which can be readily inserted for use into a purge basin module. Additionally, parts of various components of a printing system subject to on-going use can require periodic replacement. During a printing process, expedient management of a printhead assembly, for example, but not limited by, an exchange of a printhead device or printhead, can be desirable. A printhead replacement module can have parts, such as a printhead device or printhead, which can be readily inserted for use into a printhead assembly. A drop measurement module used for checking for nozzle firing, as well as the measurement based on optical detection of drop volume, velocity and trajectory from every nozzle can have a source and a detector, which can require periodic replacement after use. Various consumable and high-usage parts can be packaged for ready insertion, for example, in a fully automated mode using a handler.

For various embodiments of systems and methods of the present teachings, for example, by way of a non-limiting example, those represented by FIG. 28A through FIG. 30C, a printing system enclosure can be isolated from various embodiments of an auxiliary enclosure. As such, the utilization of an auxiliary enclosure for the automated or end-user mitigated exchange of parts of a printing system can ensure that a printing process can continue with minimal or no interruption. Various embodiments of a gas enclosure can have a sealable opening or passageway allowing access between a printing system enclosure and an auxiliary enclosure, as well as an opening allowing access between an auxiliary enclosure and the exterior of a gas enclosure. Accordingly, various embodiments of an auxiliary enclosure can be isolated from a printing system enclosure of a gas enclosure system, so that each volume is a separately-functioning section. Furthermore, while a printing system enclosure is isolated from an auxiliary enclosure, an opening between an auxiliary enclosure and the exterior of a gas enclosure can be opened to ambient or non-inert air without contaminating a printing system enclosure.

Various embodiments of a gas enclosure system, an auxiliary enclosure can be isolated from a printing system enclosure of a gas enclosure system using a structural closure for an opening, such as an enclosure panel opening or passageway, door or window. For various embodiments of systems and methods of the present teachings, a structural closure can include a variety of sealable coverings for an opening or passageway; such opening or passageway including non-limiting examples of an enclosure panel opening or passageway, a door or a window. According to systems and methods of the present teachings, a gate can be any structural closure that can be used to reversibly cover or reversibly sealably close any opening or passageway using pneumatic, hydraulic, electrical, or manual actuation. Various embodiments of an auxiliary enclosure can be isolated from a printing system enclosure of a gas enclosure system using a dynamic closure, such as a pressure difference or a gas curtain, between a working volume of a gas enclosure system and an auxiliary enclosure, and combinations of various embodiments of a dynamic closure and a structural closure. Additionally, each of a working volume of a gas enclosure and an auxiliary enclosure can have separately controlled environments, providing the capability of independent regulation of, for example, but not limited by, temperature, lighting, particle control, and gas purification. As such, the specification for the thermal control, lighting control, particle control and inert gas environment control for an auxiliary enclosure volume and a working volume of a gas enclosure can be set to be the same or to be different for each volume.

Figure 28A:
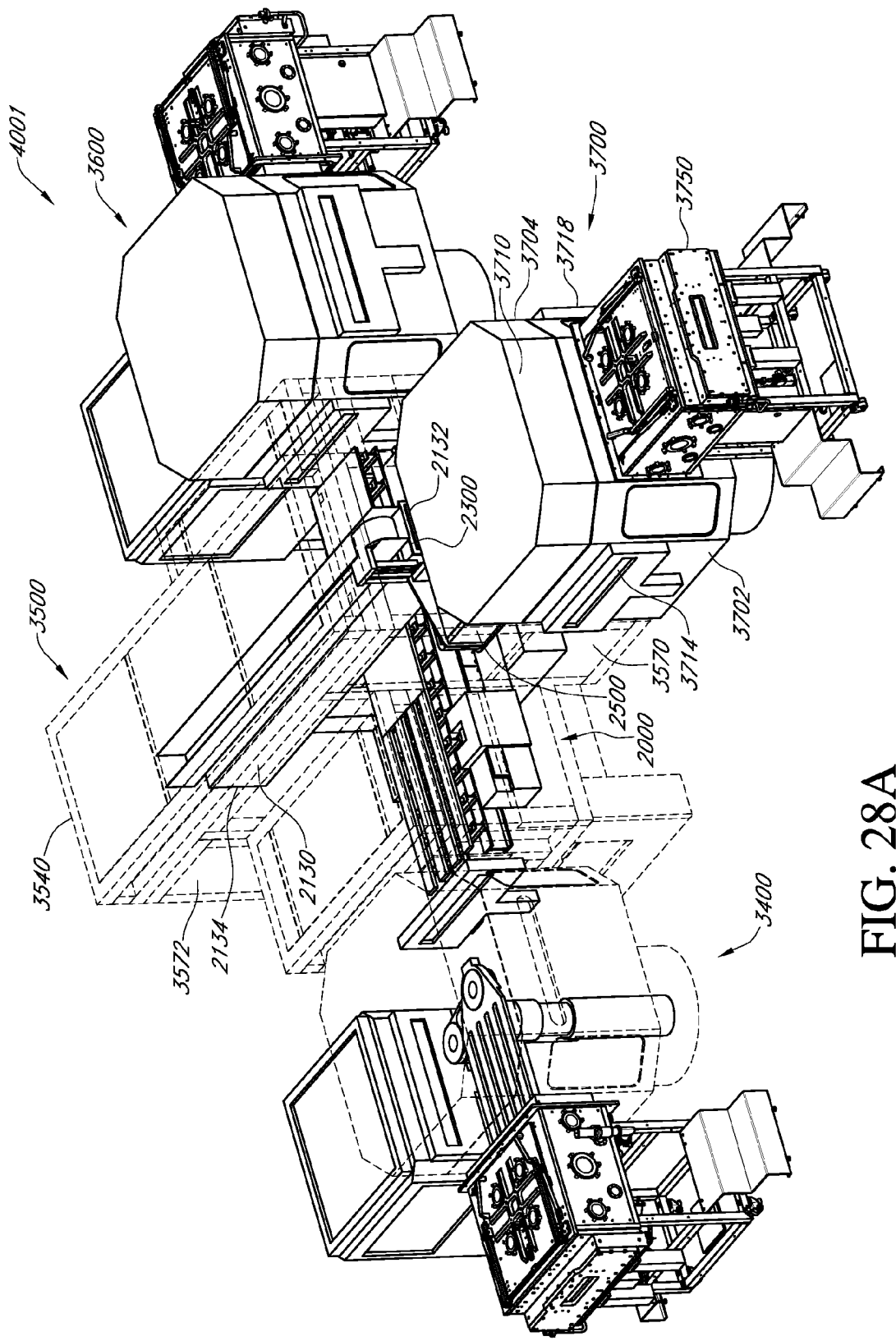
FIG. 28A is a front perspective view of an OLED printing tool, according to various embodiments of systems and methods of the present teachings.
Figure 28B:
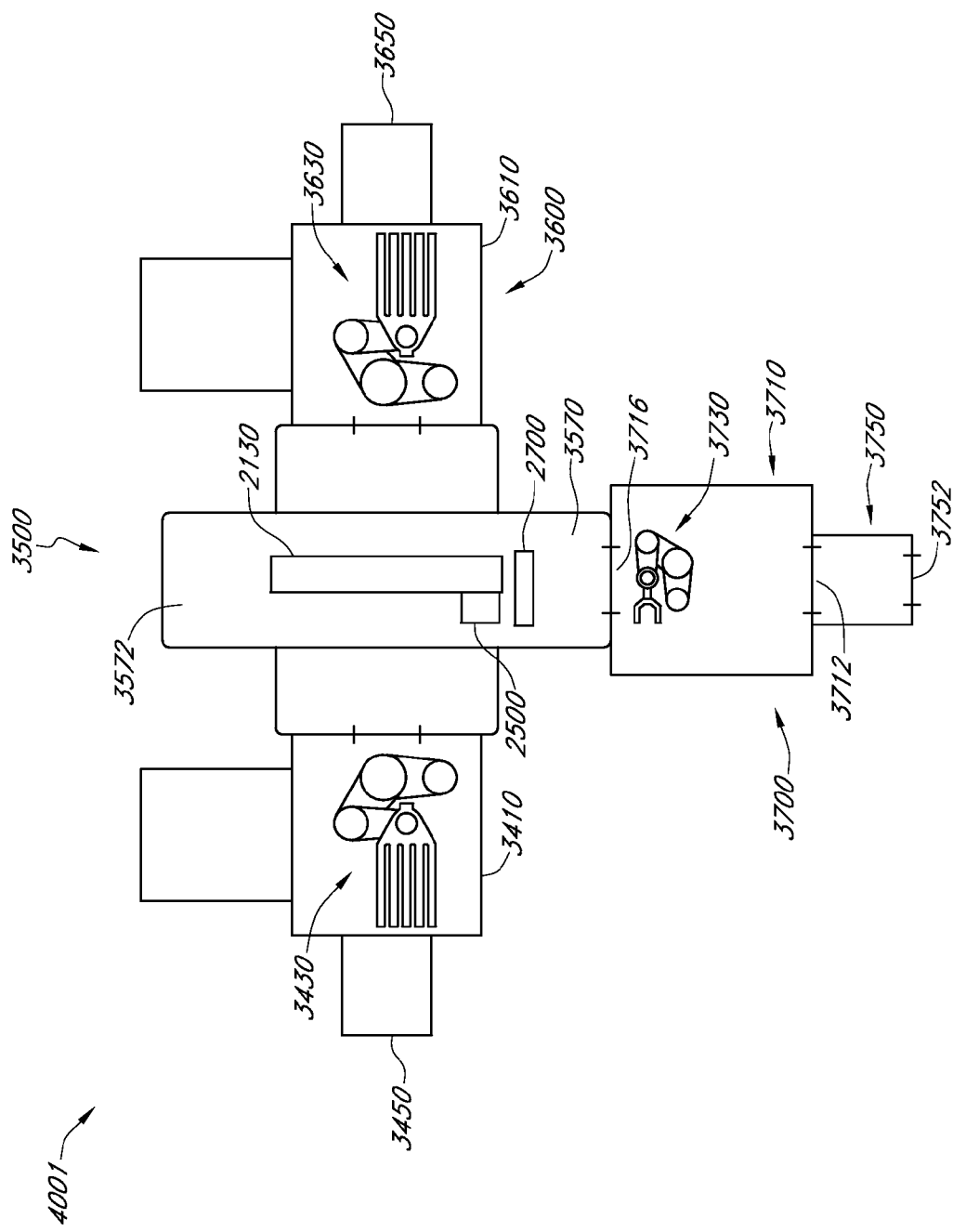
FIG. 28B is a schematic plan view of an OLED printing tool, according to various embodiments of systems and methods of the present teachings as depicted in FIG. 28A.
Figure 28C:
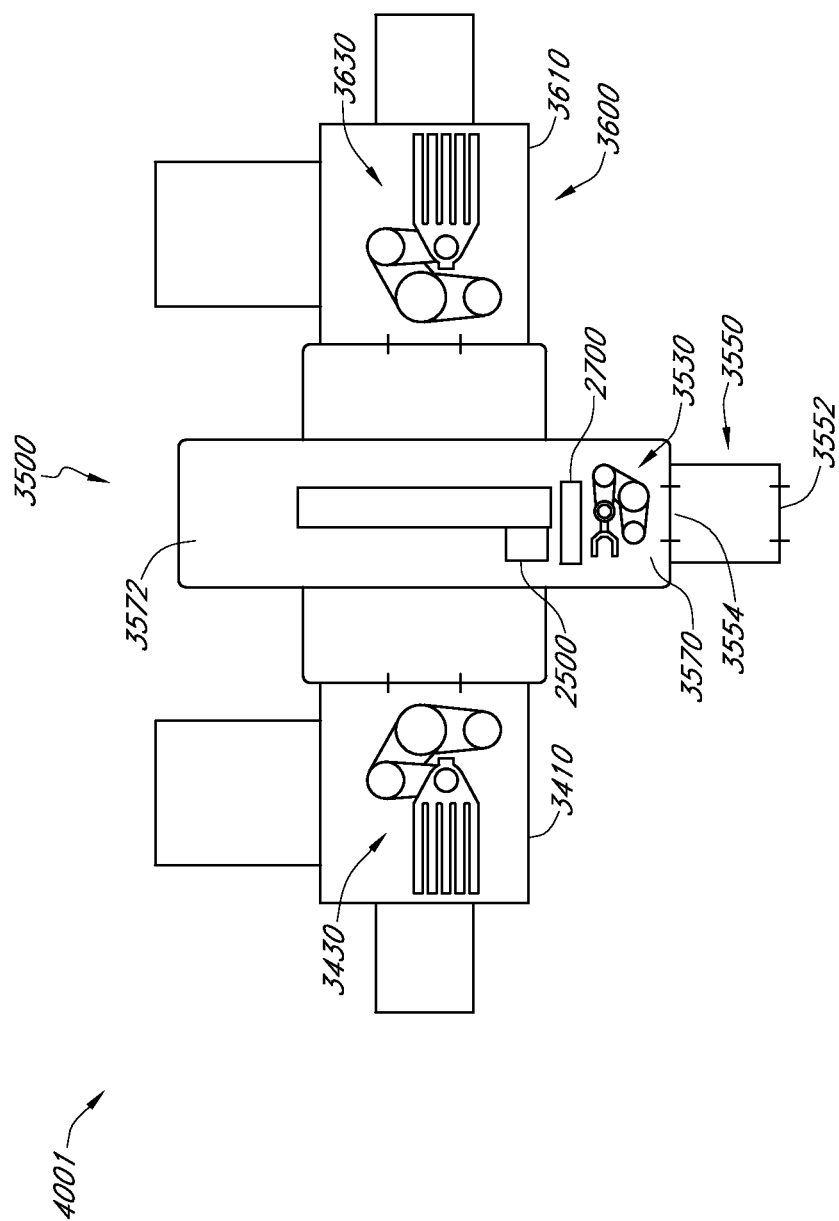
FIG. 28C is a schematic plan view of an OLED printing tool, according to various embodiments of systems and methods related to FIG. 28A, according to the present teachings.

FIG. 28A through FIG. 28C depict various embodiments of printing systems and methods for printhead management in a fully automated or remote operator-assisted mode with little or no interruption of an ongoing process, while maintaining an inert, substantially particle-free process environment in OLED printing tool 4001. In comparison to OLED printing system 4000 of FIG. 26A through FIG. 26C, various embodiments of OLED printing tool 4001 of FIG. 28A through FIG. 28C can include an auxiliary enclosure, such as, for example, but not limited by, a transfer chamber, a load lock chamber and an adaptable controlled-environment enclosure. For embodiments of systems and methods of the present teachings OLED printing tool 4001 can have an auxiliary enclosure that can be maintained at specifications for a controlled environment that are the same as the specifications for the controlled environment of printing module 3500. In various embodiments of systems and methods of the present teachings, OLED printing tool 4001 can have an auxiliary enclosure that can be maintained at specifications for a controlled environment that are different from the specifications for the controlled environment of printing module 3500, while not compromising the integrity of the environment of OLED printing tool 4001.

As depicted in FIG. 28A, printing system module 3500 of OLED printing tool 4001 can have third module 3700 coupled to printing system enclosure assembly 3540. Third module 3700 can be positioned proximal to first bridge end 2132 of bridge 2130, where printhead assembly 2500, mounted on X-axis carriage assembly 2300, can be positioned proximal to third module 3700. Third module 3700 of FIG. 28A can have third transfer chamber 3710, which can be an auxiliary enclosure for OLED printing tool 4001 useful for carrying out various printhead maintenance procedures. Third module 3700 of FIG. 28A can have third load lock chamber 3750, which can be coupled to third transfer chamber 3710. In various embodiments of systems and methods of the present teachings, third chamber 3700 can be located proximal to second bridge end 2134. For various embodiments of systems and methods of the present teachings, printing system module 3500 can have a module, such as third module 3700 of FIG. 28A, proximal to both first bridge end 2132 and second bridge end 2134. Further, while a single carriage is shown for printing system 2000 of OLED printing tool 4001 shown in FIG. 28A, a printing system, such as printing system of FIG. 20B, can have an additional carriage, which can have various devices, such as a printhead assembly, a camera, a UV lamp, and a heat source mounted in the second carriage, as previously described for printing system 2000 of FIG. 20B and printing system 2001 of FIG. 27.

In FIG. 28A, though no additional chambers are shown associated with third module 3700, a chamber can be coupled to third transfer chamber 3710 on first side 3702, and can be accessible to third transfer chamber 3710 via gate 3714. Similarly, a chamber can be coupled third transfer chamber 3710 on second side 3704, and can be accessible to third transfer chamber 3710 via gate 3718. Various additional chambers coupled to third transfer chamber 3710 may be useful for various printhead maintenance procedures. For various embodiments of OLED printing tool 4001, third transfer chamber 3710 of third module 3700 can be used to house a handler, while additional chambers associated with third transfer module 3710 can be used to store and transfer various parts for subsystems and modules of various embodiments of a printhead management system of the present teachings. In various embodiments of OLED printing tool 4001, printing system enclosure assembly 3540 can have a volume or area, such as first printing system enclosure assembly area 3570 proximal to first bridge end 2132 and second printing system enclosure assembly area 3572 proximal to second bridge end 2134. According to various embodiments of an OLED printing tool of the present teachings, either or both first printing system enclosure assembly area 3570 and second printing system enclosure assembly area 3572 can be used to house a printhead management system, such as printhead management system 2701 FIG. 20B and FIG. 23 and printhead management system 2701A of FIG. 24A (see also FIG. 26C). In that regard, for example, a handler located in third transfer module 3710 can move parts between various chambers associated with third transfer module 3710, such as, but not limited by, load lock chamber 3750, and a printhead maintenance system located in printing system module 3500.

FIG. 28B is a plan view of OLED printing tool 4001 shown in FIG. 28A, according to various embodiments of the present teachings, in which third transfer chamber 3710 is an auxiliary enclosure. Third transfer chamber 3710, can have gate 3412, which can provide access to load lock chamber 3750, and can have gate 3416, which can provide access to printing module 3500. Third load lock chamber 3750 can have gate 3752, which can provide access to third load lock chamber 3750 from the exterior of OLED printing tool 4001. As previously discussed, handler 3430 and handler 3630 can have features selected for the task of substrate handling. According to the present teachings, handler 3730 of FIG. 28B can have features selected for handling various parts associated with a printhead management system, such as printhead management system 2700. Printhead management system 2700 can be, for example, but not limited by, a printhead management system such as printhead management system 2701 FIG. 20B and FIG. 23 and printhead management system 2701A of FIG. 24A. As previously mentioned in reference to the teachings for FIG. 28A, a printhead management system can be located in a volume or area such as 3570 or 3752 of printing module 3500. As depicted in FIG. 28B, handler 3730 housed within an auxiliary enclosure defined third transfer chamber 3710 can be positioned so that it can access printing system enclosure assembly area 3570, which is proximal to X-axis carriage assembly 2300. Carriage assembly 2300, mounted to bridge 2130, can support printhead assembly 2500, which can include a plurality of printhead devices. Various embodiments of handler 3730 can have various end effector configurations, for example, a fork-type, a blade-type end effector, a clamp-type end effector, and a gripper-type end effector that can be selected for manipulation of various parts of a printhead management system. According to the present teachings, an end effector can include mechanical grasping and clamping, as well as pneumatic or vacuum-assisted assemblies to either actuate portions of the end effector or otherwise retain various parts of a printhead management system, such as for example, but not limited by, a blotter paper cartridge, an ink cartridge, a waste reservoir, a printhead and a printhead device.

With respect to printhead replacement, according to various embodiments of the present teachings, handler 3730 of FIG. 28B can, for example, retrieve a part from printhead assembly 2500 mounted on X-axis carriage assembly 2300, such as a printhead or a printhead device, requiring replacement. In a subsequent step, handler 3730 can retrieve a replacement part from printhead, for example, from management system 2700. Once a replacement part has been retrieved, handler 3730 can then insert a replacement part, such as a printhead device or a printhead, into printhead assembly 2500 to complete a printhead replacement procedure. Moreover, for various embodiments of OLED printing tool 4001 of FIG. 28B, third transfer chamber 3710 of third module 3700 can be used to house a handler, while load lock chamber 3750 can be used to store and transfer various parts for subsystems and modules of various embodiments of a printhead management system of the present teachings. Various replacement parts for printhead management system 2700 that are stored in load lock chamber 3750, for example, but not limited by, a blotter paper cartridge, an ink cartridge, a waste reservoir, a printhead and a printhead device, can be accessed by handler 3730 and moved to printhead management system 2700. Conversely, parts needing replacement, for example, but not limited by, a blotter paper cartridge, an ink cartridge, a waste reservoir, a printhead and a printhead device, can be removed from printhead management system 2700 by handler 3730 and placed in load lock chamber 3750. In various embodiments of printhead management procedures, a part, such as a printhead device or a printhead, can be removed from load lock chamber 3750 by handler 3730 and inserted into printhead assembly 2500. Gate 3752 of load lock chamber 3750 can be opened, while gate 3712 and gate 3716 are closed, so that retrieval or removed parts from load lock chamber 3750, as well as transfer of replacement parts to load lock chamber 3750 can be done by a handler or end-user located in ambient air at the exterior of OLED printing tool 4001.

After a procedure for the retrieval of parts, the replacement of parts or both has been completed, gate 3752 of load lock chamber 3750 can be closed, and load lock chamber 3750 can go through a recovery procedure to restore the gas environment of the chamber to a target specification. Given the substantially small volume of load lock chamber 3750 in comparison to the volume of OLED printing tool 4001, the recovery time is substantially shorter than the recovery time for OLED printing tool 4001. All steps associated with a printhead management procedure can be done to eliminate or minimize the exposure of a printing system enclosure to contamination, such as air and water vapor and various organic vapors, as well as particulate contamination. According to various systems and methods of the present teachings, a printing system enclosure may be introduced to a level of contamination that is sufficiently low that a purification system can remove the contamination before it can affect a printing process. In that regard, various embodiments of OLED printing tool 4001 can provide for fully automated replacement of a part in a printhead management system while maintaining an inert, particle-free environment and with little or no interruption of a printing process. While various printhead management procedures can be conducted in a fully-automated mode, where a certain degree of end-user intervention may be indicated during various procedures related to the management of a printhead assembly, end-user access can be done externally through, for example, the use of gloveports.

Various embodiments of an OLED printing tool, such as OLED printing tool 4002, depicted in the plan view in FIG. 28C, can have auxiliary enclosure 3550, which can be a load lock chamber or an adaptable controlled-environment enclosure. Auxiliary enclosure 3550 can have first gate 3552 and second gate 3554. Printing system enclosure 3500 can have a volume or area, such as first and second printing system enclosure assembly area 3570 and 3572, respectively (see also FIG. 26C). For various embodiments of OLED printing tool 4002, volume or area 3570 and 3572 of printing system enclosure 3500 of FIG. 28C, can be used to house, for example, a printhead management system, such as printhead management system 2701 FIG. 20B and FIG. 23 and printhead management system 2701A of FIG. 24A. As depicted in FIG. 28C, for various embodiments of OLED printing tool 4002, volume or area 3570 can be used to house printhead management system 2700, as well as handler 3530. For various embodiments of FIG. 28C, printhead management system 2700 and handler 3530 can be positioned, for example, in printing system enclosure assembly area 3570, proximal to X-axis carriage assembly 2300. Printhead assembly 2500 can be mounted on X-axis carriage assembly 2300 (see also FIG. 26C), which is supported on bridge 2130. Printhead assembly 2500 can include a plurality of printhead devices. Various embodiments of handler 3530 can have various end effector configurations, for example, a fork-type, a blade-type end effector, a clamp-type end effector, and a gripper-type end effector that can be selected for manipulation of various parts of a printhead management system, such as for example, but not limited by, a blotter paper cartridge, an ink cartridge, a waste reservoir, a printhead and a printhead device.

With respect to printhead replacement, for various embodiments of OLED printing tool 4002, handler 3530 can, for example, retrieve a part, for example printhead or a printhead device, requiring replacement from printhead assembly 2500 mounted on X-axis carriage assembly 2300. In a subsequent step, handler 3530 can retrieve a replacement part, for example, from printhead management system 2700. Once a replacement part has been retrieved, handler 3530 can then insert a replacement part, such as a printhead device or a printhead, into printhead assembly 2500 to complete a printhead replacement procedure. Moreover, for various embodiments of OLED printing tool 4002 of FIG. 28C, auxiliary enclosure 3550 can be used to store and transfer various parts for subsystems and modules of various embodiments of a printhead management system of the present teachings. Various replacement parts for printhead management system 2700 that are stored in, auxiliary enclosure 3550, for example, but not limited by, a blotter paper cartridge, an ink cartridge, a waste reservoir, a printhead and a printhead device, can be accessed by handler 3530 and moved to printhead management system 2700. Conversely, parts needing replacement, for example, but not limited by, a blotter paper cartridge, an ink cartridge, a waste reservoir, a printhead and a printhead device, can be removed from printhead management system 2700 by handler 3730 and placed in auxiliary enclosure 3550. In various embodiments of printhead management procedures, a part, such as a printhead device or a printhead, can be removed from auxiliary enclosure 3550 by handler 3530 and inserted into printhead assembly 2500. Gate 3552 of, auxiliary enclosure 3550 can be opened, while gate 3554 is closed, so that retrieval or removed parts from auxiliary enclosure 3550, as well as transfer of replacement parts to auxiliary enclosure 3550 can be done by a handler or end-user located in ambient air at the exterior of OLED printing tool 4002.

After a procedure for the retrieval of parts, the replacement of parts or both has been completed, gate 3552 of auxiliary enclosure 3550 can be closed, and auxiliary enclosure 3550 can go through a recovery procedure to restore the gas environment of the auxiliary enclosure to a target specification. Given the substantially small volume of auxiliary enclosure 3550 in comparison to the volume of OLED printing tool 4002, the recovery time is substantially shorter than the recovery time for OLED printing tool 4002. All steps associated with a printhead management procedure can be done to eliminate or minimize the exposure of a printing system enclosure to contamination, such as air and water vapor and various organic vapors, as well as particulate contamination. According to various systems and methods of the present teachings, a printing system enclosure may be introduced to a level of contamination that is sufficiently low that a purification system can remove the contamination before it can affect a printing process. In that regard, various embodiments of OLED printing tool 4002 can provide for fully automated replacement of a part in a printhead management system while maintaining an inert, particle-free environment and with little or no interruption of a printing process. While various printhead management procedures can be conducted in a fully-automated mode, where a certain degree of end-user intervention may be indicated during various procedures related to the management of a printhead assembly, end-user access can be done externally through, for example, the use of gloveports.

Figure 29B:
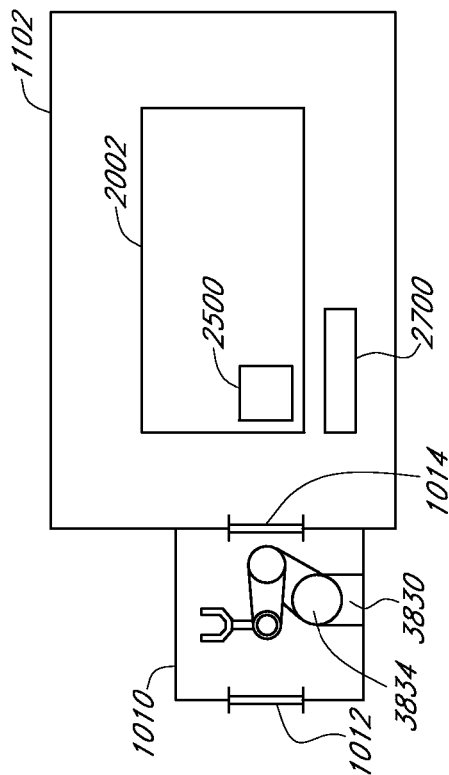
FIG. 29A, FIG. 29B, and FIG. 29C are schematic plan views of various embodiments of a gas enclosure system of the present teachings with an auxiliary enclosure.
Figure 29A:
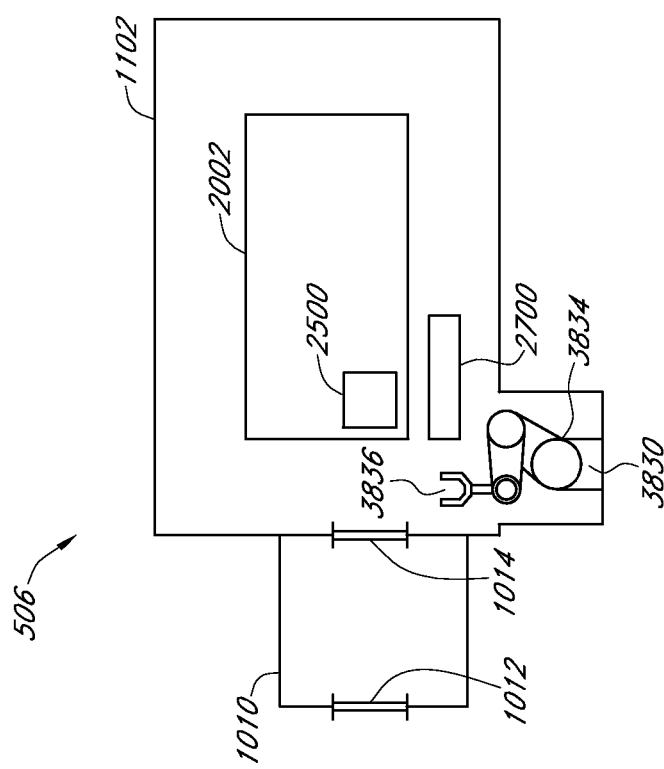
Figure 29C:
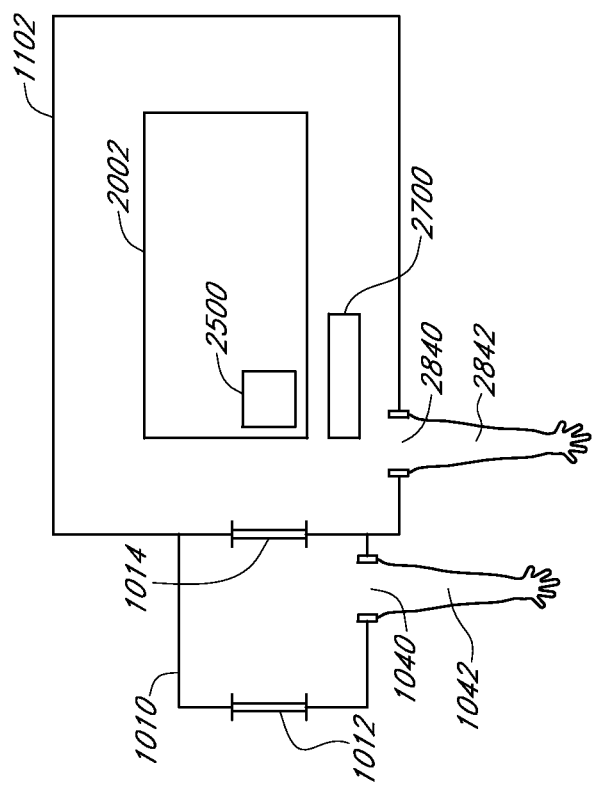

FIG. 29 through FIG. 29C depict various embodiments of printing systems and methods for printhead management in a fully automated or remote operator-assisted mode with little or no interruption of an ongoing process, while maintaining an inert, substantially particle-free process environment in printing system enclosure 1102. For various printhead management procedures that can be performed in gas enclosure system 506 of FIG. 29A through 29C, auxiliary enclosure 1010 can be maintained at specifications for a controlled environment that are the same as a controlled environment as printing system enclosure 1102. Various embodiments of gas enclosure system 506 of FIG. 29A through 29C can be incorporated into an OLED printing tool, such as OLED printing tool 4000 of FIG. 26A and as OLED printing tool 4001 of FIG. 28A.

FIG. 29A through FIG. 29C depict gas enclosure system 506 that can include printing system enclosure 1102 and printing system 2002, which can have printhead assembly 2500. Printing system enclosure 1102 can be any gas enclosure in which printing system 2002 can be housed and maintained in a targeted controlled environment. Printing system enclosure 1102 can have a controlled environment that can include a target specification for reactive species, such as water vapor and oxygen, as well as for a target specification for particulate matter. Printing system enclosure 1102 can be, for example, but not limited by, any of a gas enclosure assembly as described for FIG. 1, FIG. 3, FIG. 15, FIG. 18 and FIG. 19. Printing system 2002 can be any printing system, for example, but not limited by, as previously described, including non-limiting examples of FIG. 20B and FIG. 27. Printhead assembly 2500 can have at least one printhead. Printhead management system 2700 can any printhead management system, for example, but not limited by, as previously described, including non-limiting examples of printhead management system 2701 FIG. 20B and FIG. 23 and printhead management system 2701A of FIG. 24A.

Auxiliary enclosure 1010 of FIG. 29A through FIG. 29C can have first gate 1012 and second gate 1014, which can remained closed during normal operation. For various embodiments of gas enclosure system 506, auxiliary enclosure 1010 depicted in FIG. 29A through FIG. 29C can be a load lock chamber. In various embodiments of gas enclosure system 506, auxiliary enclosure 1010 depicted in FIG. 29A through FIG. 29C can be a hard wall adaptable controlled-environment enclosure. In still other embodiments of gas enclosure system 506, auxiliary enclosure 1010 depicted in FIG. 29A through FIG. 29C can be a transfer chamber. For various embodiments of gas enclosure assembly 506, a controlled environment for an auxiliary enclosure may include a target specification for reactive species, such as water vapor and oxygen and various organic vapors, as well as for a target specification for particulate matter. In various embodiments of gas enclosure 506 of FIG. 29A through FIG. 29C, auxiliary enclosure 1010 can be maintained to the same environmental specifications that printing system enclosure 1102 is maintained. For various embodiments of gas enclosure 506 of FIG. 29A through FIG. 29C, auxiliary enclosure 1010 and printing system enclosure 1102 can be maintained to different environmental specifications. Gas enclosure system 506 of FIGS. 29A and 29B can have handler 3830 positioned for the carrying out tasks associated with a printhead management procedure. Handler 3830 can have end effector 3836 mounted to arm 3834. Various embodiments of an end effector configuration can be used, for example, a blade-type end effector, a clamp-type end effector, and a gripper-type end effector. Various embodiments of an end effector can include mechanical grasping and clamping, as well as pneumatic or vacuum-assisted assemblies to either actuate portions of the end effector or otherwise retain various parts of a printhead management system, such as for example, but not limited by, a blotter paper cartridge, an ink cartridge, a waste reservoir, a printhead and a printhead device.

With respect to printhead replacement, handler 3830 of FIG. 29A can be positioned proximal to printhead assembly 2500 and printhead management system 2700 of printing system 2002. During a procedure for printhead replacement, handler 3830 can remove a target part; either a printhead or printhead device having at least one printhead, from printhead assembly 2500. In various procedures for printhead replacement for gas enclosure system 506 of FIG. 29A, the removed part can be placed in printhead management system 2700 for later retrieval. For removing a removed part from printing system enclosure 1102, second gate 1024 can be opened while first gate 1012 remains closed, so that handler 3830 can place the part that has been removed into auxiliary enclosure 1010. In a subsequent step, handler 3830 can retrieve a replacement part from printhead management system 2700. Alternatively, handler 3830 can retrieve a replacement part from auxiliary enclosure 1010. Once a replacement part has been retrieved, handler 3830 can then insert a replacement part, such as a printhead device or a printhead, into printhead assembly to complete a printhead replacement procedure. After the movement of parts between printing system enclosure 1102 and auxiliary enclosure 1010 is complete, gate 1014 can be closed, so that printing system enclosure 1102 can be isolated from auxiliary enclosure 1010. Gate 1012 can be opened and the removed part placed in auxiliary enclosure 1010, can be retrieved by a source, either a handler or an end-user, and an additional functional part, either a replacement printhead or a replacement printhead device, can be placed into auxiliary enclosure 1010 for a subsequent printhead exchange procedure. Finally, after gate 1012 is closed, auxiliary enclosure 1010 can go through a recovery procedure in order to be brought to a target specification for reactive species, such as water vapor and oxygen, as well as to a target specification for particulate matter, so that a subsequent printhead replacement procedure can be initiated when desired. In various embodiments of gas enclosure system 506, auxiliary enclosure 1010 can have the same specifications for a controlled environment as printing system enclosure 1102. For various embodiments of gas enclosure system 506 of FIG. 29A, auxiliary enclosure 1010 can have different specifications from printing system enclosure 1102 for a controlled environment.

For gas enclosure system 506 of FIG. 29B, handler 3830 can be positioned in auxiliary enclosure 1010 so that end effector 3836 of handler 3830 can readily reach printhead assembly 2500, as well as printhead management system 2700 of printing system.

With respect to a procedure for printhead replacement for gas enclosure system 506 of FIG. 29B, second gate 1014 can be opened while gate 1012 remains closed so that handler 3830 can remove a target part; either printhead or printhead device having at least one printhead, from printhead assembly 2500 of printing system 2002. In various procedure for printhead replacement of gas enclosure system 506 of FIG.

29B, the removed part can be placed in printhead management system 2700 for later retrieval. For removing a removed part from printing system enclosure 1102, second gate 1014 can be opened while gate 1012 remains closed, so that handler 3830 can place the part that has been removed into auxiliary enclosure 1010. In a subsequent step, handler 3830 can retrieve a replacement part from printhead management system 2700. Alternatively, handler 3830 can retrieve a replacement part from auxiliary enclosure 1010. Once a replacement part has been retrieved, handler 3830 can then insert a replacement part, such as a printhead device or a printhead, into printhead assembly to complete a printhead replacement procedure. After the removed part is in auxiliary enclosure 1010, the replacement part has been inserted into printhead assembly 2500 of printing system enclosure 1102 and handler 3830 is within auxiliary enclosure 1010, gate 1014 can be closed, so that printing system enclosure 1102 is isolated from auxiliary enclosure 1010. At any time after the replacement part has been inserted into a printhead assembly and gate 1014 has been closed, gate 1012 can be opened, and handler 3830 can place the removed part to a location exterior to auxiliary enclosure 1010 and an additional functional part, either a replacement printhead or a replacement printhead device, can be placed into auxiliary enclosure 1010 for a subsequent printhead exchange procedure. Finally, auxiliary enclosure 1010 can go through a recovery procedure in order to be brought to a target specification for reactive species, such as water vapor and oxygen, as well as to a target specification for particulate matter, so that a subsequent printhead replacement procedure can be initiated when desired. In various embodiments of gas enclosure system 506, auxiliary enclosure 1010 can have the same specifications for a controlled environment as printing system enclosure 1102. For various embodiments of gas enclosure system 506 of FIG. 29B, auxiliary enclosure 1010 can have different specifications from printing system enclosure 1102 for a controlled environment.

Moreover, for various embodiments of gas enclosure system 506 of FIG. 29A and FIG. 29B, auxiliary enclosure 1010 can be used to store and transfer various parts for subsystems and modules of various embodiments of a printhead management system of the present teachings. Various replacement parts for printhead management system 2700, for example, but not limited by, a blotter paper cartridge, an ink cartridge, a waste reservoir, a printhead and a printhead device, that are stored in auxiliary enclosure 1010 can be accessed by handler 3830 and moved to printhead management system 2700 through gate 1014 while gate 1012 is closed to maintain gas enclosure system 506 in an inert environment. Conversely, parts needing replacement can be removed from printhead management system 2700 by handler 3830 through gate 1014 while gate 1012 is closed and placed in auxiliary enclosure 1010. In a subsequent step, gate 1012 of auxiliary enclosure 1010 can be opened, while gate 1014 is closed, so that retrieval or removed parts from, auxiliary enclosure 3550, as well as transfer of replacement parts to auxiliary enclosure 3550 can be done by a handler or end-user located in ambient air at the exterior of gas enclosure system 506 of FIG. 29A and FIG. 29B.

After a procedure for the retrieval of parts, the replacement of parts or both has been completed, gate 1012 of auxiliary enclosure 1010 can be closed, and auxiliary enclosure 1010 can go through a recovery procedure to restore the gas environment of the auxiliary enclosure to a target specification. Given the substantially small volume of auxiliary enclosure 1010 in comparison to the volume of gas enclosure system 506 of FIG. 29A and FIG. 29B, the recovery time is substantially shorter than the recovery time for gas enclosure system 506 of FIG. 29A and FIG. 29B. All steps associated with a printhead management procedure can be done to eliminate or minimize the exposure of a printing system enclosure to contamination, such as air and water vapor and various organic vapors, as well as particulate contamination. According to various systems and methods of the present teachings, a printing system enclosure may be introduced to a level of contamination that is sufficiently low that a purification system can remove the contamination before it can affect a printing process. In that regard, various embodiments of gas enclosure system 506 of FIG. 29A and FIG. 29B can provide for fully automated replacement of a part in a printhead management system while maintaining an inert, particle-free environment and with little or no interruption of a printing process.

Variations of a printhead replacement procedure for various embodiments of FIG. 29A and FIG. 29B can be made without departing from the spirit of an automated process for maintaining a printhead array. For example, in various embodiments, while gate 1012 of auxiliary enclosure 1010 is closed and gate 1014 of auxiliary enclosure 1010 is opened, handler 3830 of FIG. 29A and FIG. 29B can remove a printhead part, either printhead or printhead device with at least one printhead, from printhead assembly 2500 and place it in auxiliary enclosure 1010. In a next step, while gate 1014 of auxiliary enclosure 1010 is closed, gate 1012 can be opened allowing for retrieval of the removed part from auxiliary enclosure 1010 and placement of a replacement part into auxiliary enclosure 1010 as previously described for FIG. 29A and FIG. 29B. Once the removed part has been retrieved and the replacement part is within auxiliary enclosure 1010, gate 1012 can be closed and auxiliary enclosure 1010 can go through a recovery procedure in order to be brought to a target specification for reactive species, such as water vapor and oxygen, as well as to a target specification for particulate matter. Once auxiliary enclosure 1010 is brought into appropriate controlled environmental specifications, gate 1014 can be opened and the replacement part can be inserted into a printhead assembly. When the replacement part has been inserted into a printhead assembly, gate 1014 can be closed, so that printing system enclosure 1102 can be isolated from auxiliary enclosure 1010.

In FIG. 29C, for various embodiments of a printhead replacement procedure as described for FIG. 29A and FIG. 29B, an end-user can remotely perform through the manipulations recited as being performed by a handler remotely through various gloveports. Though two gloveport are shown in FIG. 29C, it can be appreciated that gloveports can be placed in several places for the purpose of providing remote access to various locations, for example, as previously shown in FIG. 1 for gas enclosure assembly 100 and as shown in FIG. 24B.

Figure 30A:
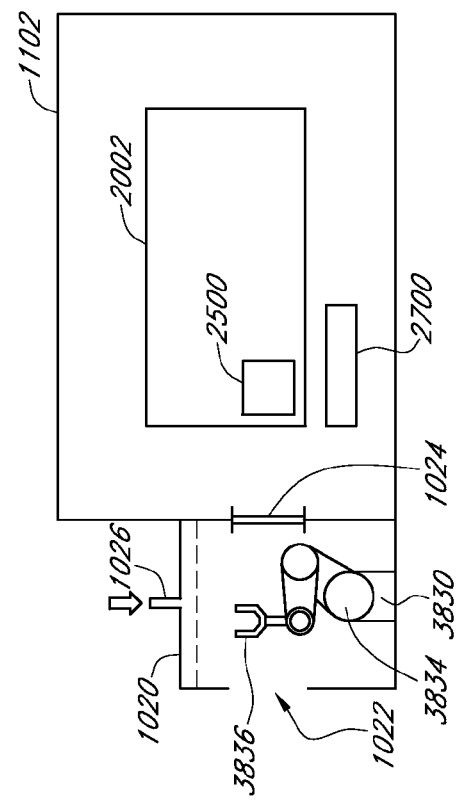
FIG. 30A, FIG. 30B, and FIG. 30C are schematic plan views of various embodiments of a gas enclosure system of the present teachings with an auxiliary enclosure.
Figure 30B:
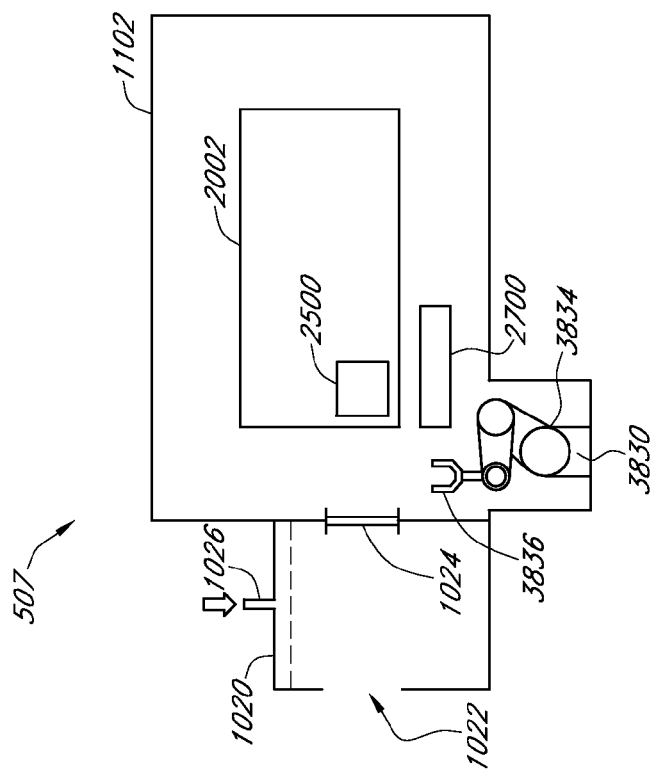
Figure 30C:
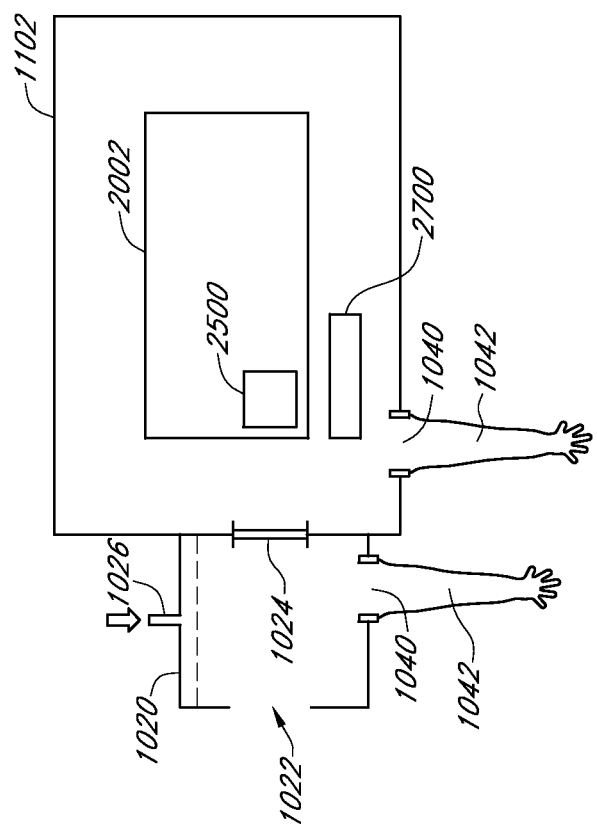

FIG. 30A through FIG. 30C depict various embodiments of printing systems and methods for printhead management in a fully automated or remote operator-assisted mode with little or no interruption of an ongoing process, while maintaining an inert, substantially particle-free process environment in printing system enclosure 1102. For various printhead management procedures that can be performed in gas enclosure system 507 of FIG. 30A through 30C, auxiliary enclosure 1020 can be maintained at specifications for a controlled environment that are different from a controlled environment as printing system enclosure 1102, while not compromising the integrity of the environment of printing system enclosure 1102. Various embodiments of gas enclosure system 506 of FIG. 29A through 29C can be incorporated into an OLED printing tool, such as OLED printing tool 4000 of FIG. 26A and as OLED printing tool 4001 of FIG. 28A.

FIG. 30A through FIG. 30C depict gas enclosure system 507 that can include printing system enclosure 1102 and printing system 2002, which can have printhead assembly 2500. Printing system enclosure 1102 can be any gas enclosure in which printing system 2002 can be housed and maintained in a targeted controlled environment. Printing system enclosure 1102 can have a controlled environment that can include a target specification for reactive species, such as water vapor and oxygen, as well as for a target specification for particulate matter. Printing system enclosure 1102 can be, for example, but not limited by, any of a gas enclosure assembly as depicted in FIG. 1, FIG. 3, FIG. 15, FIG. 18 and FIG. 19. Printing system 2002 can be any printing system, for example, but not limited by, as previously described herein, including non-limiting examples of FIG. 20B and FIG. 27. Printhead assembly 2500 can have at least one printhead. Printhead management system 2700 can any printhead management system, for example, but not limited by, as previously described, including non-limiting examples of printhead management system 2701 FIG. 20B and FIG. 23 and printhead management system 2701A of FIG. 24A.

Auxiliary enclosure 1020 of FIG. 30A through FIG. 30C can have opening 1022 and gate 1024, as well as conduit 1026, which can be in fluid communication with an inert gas source. Gate 1024 of auxiliary enclosure 1020 can be maintained in a closed position during normal operation. For various embodiments of gas enclosure system 507, auxiliary enclosure 1020 depicted in FIG. 30A through FIG. 30C can be an adaptable controlled-environment enclosure of soft wall construction. Various embodiments of gas enclosure system 507, auxiliary enclosure 1020 depicted in FIG. 30A through FIG. 30C can be an adaptable controlled-environment enclosure of hard wall construction. In still other embodiments of gas enclosure system 507, auxiliary enclosure 1020 depicted in FIG. 30A through FIG. 30C can be an adaptable controlled-environment enclosure of a combination of hard and soft wall construction.

For various embodiments of gas enclosure system 507, opening 1022 can be a passageway, for example, but not limited by, a window or door of solid material. In various embodiments in gas enclosure system 507, opening 1022 can be a flexible doorway that can be covered, for example, by a curtain of strips of a flexible polymeric sheet material, thereby providing ready passage into and out of auxiliary enclosure 1020. According to various embodiments of gas enclosure system 507 of FIG. 30A through FIG. 30C, various embodiments of a dynamic closure as previously discussed can be used for effectively sealing opening 1022. For various embodiments of auxiliary enclosure, opening 1022 can be a window, which can be covered by a flexible polymeric material thereby providing ready passage of materials into and out of auxiliary enclosure 1020. In various embodiments of auxiliary enclosure, opening 1022 can be a passageway, for example, but not limited by, a window or door, which in addition to being covered by a flexible polymeric material can have a gas curtain for isolating auxiliary enclosure from the exterior of gas enclosure system 507. In various embodiments of auxiliary enclosure, opening 1022 can be a passageway, for example, but not limited by, a window or door, which can have a gas curtain for isolating auxiliary enclosure from the exterior of gas enclosure system 507. As will be discussed in more detail subsequently, in addition to a gas curtain, pressure differences between auxiliary enclosure 1020 and printing system enclosure 1102 can be utilized for isolating auxiliary enclosure 1020 having opening 1022. Gas enclosure system 507 of FIGS. 30A and 30B can have handler 3830 positioned for the carrying out tasks associated with a printhead management procedure. Handler 3830 can have end effector 3836 mounted to arm 3834. Various embodiments of an end effector configuration can be used, for example, a blade-type end effector, a clamp-type end effector, and a gripper-type end effector. Various embodiments of an end effector can include mechanical grasping and clamping, as well as pneumatic or vacuum-assisted assemblies to either actuate portions of the end effector or otherwise retain a printhead device or a printhead from a printhead device.

As indicated in FIG. 30A through FIG. 30C, conduit 1026 of auxiliary enclosure 1020 can be in fluid communication with an inert gas source, which for various embodiments of gas enclosure system 507 of FIG. 30A can maintain auxiliary enclosure 1020 to a target specification for reactive species, such as oxygen and water vapor, as well as organic solvent vapors that is the same as that of printing system enclosure 1102. In various embodiments of gas enclosure system 507 of FIG. 30A, the gas environment of auxiliary enclosure 1020 can be maintained at a target specification for reactive species, such as oxygen and water vapor, as well as organic solvent vapors that is different from printing system enclosure 1102. According to various embodiments of gas enclosure system 507, the inert gas source can be filtered for particulate matter. Recalling, a gas enclosure assembly can be maintained at a pressure above atmospheric. It is contemplated that the pressure of auxiliary enclosure 1020 can be held at a value above atmospheric and below that of printing system enclosure 1102 to retard or prevent diffusion of gas from auxiliary enclosure 1020 to printing system enclosure 1102, for example, during various process steps of various printhead management procedures. In that regard, for various embodiments of gas enclosure system 507 of FIG. 30A through FIG. 30C, a target specification for reactive species, such as water vapor and oxygen, as well as for a target specification for particulate matter for auxiliary enclosure 1020 may not be as stringent as those for printing system enclosure 1102.

With respect to printhead replacement, handler 3830 of FIG. 30A can be positioned proximal to printhead assembly 2500 and printhead management system 2700 of printing system 2002. During a procedure for exchanging a printhead, handler 3830 can remove a target part; either a printhead or printhead device having at least one printhead, from printhead assembly 2500. In various procedure for printhead replacement of gas enclosure system 576 of FIG. 30A, the removed part can be placed in printhead management system 2700 for later retrieval. For removing a removed part from printing system enclosure 1102, gate 1024 can be opened, so that handler 3830 can place the part that has been removed into auxiliary enclosure 1020. While gate 1024 is opened, opening 1022 can be sealed using various embodiments of a dynamic closure as previously described. In a subsequent step, handler 3830 can retrieve a replacement part from printhead management system 2700. Alternatively, handler 3830 can retrieve a replacement part from auxiliary enclosure 1020. Once a replacement part has been retrieved, handler 3830 can then insert a replacement part, such as a printhead device or a printhead, into printhead assembly to complete a printhead replacement procedure After the movement of parts between printing system enclosure 1102 and auxiliary enclosure 1010 is complete, gate 1024 can be closed, so that printing system enclosure 1102 is isolated from auxiliary enclosure 1020. For various embodiments of gas enclosure system 507, the transit time for the handler moving parts between printing system enclosure 1102 and auxiliary enclosure 1010 can be minimized, so that, in conjunction with the positive pressure maintained in printing system enclosure 1102 relative to the pressure of the inert gas environment of auxiliary enclosure 1020, any reactive species and particulate matter that may diffuse into printing system enclosure 1102 during a printhead replacement procedure can be readily removed by a gas purification system and a gas circulation and filtration system. Additionally, as previously discussed, a gas curtain can be used in conjunction with opening 1020 to isolate auxiliary enclosure from the exterior of gas enclosure system 506. The removed part placed in auxiliary enclosure 1020, can be retrieved by a source; either a handler or an end-user, externally located to auxiliary enclosure 1020, and an additional functional part, either a replacement printhead or a replacement printhead device, can be placed into auxiliary enclosure 1020 for a subsequent printhead exchange procedure.

For gas enclosure system 507 of FIG. 30B, handler 3500 can be positioned in auxiliary enclosure 1020 so that end effector 3836 of handler 3830 can readily reach printhead assembly 2500, as well as printhead management system 2700 of printing system.

With respect to a procedure for printhead replacement gas enclosure system 507 of FIG. 30B, gate 1024 can be opened so that handler 3830 can remove a target part; either printhead or printhead device having at least one printhead, from printhead assembly 2500 of printing system 2002. and place the removed part into auxiliary enclosure 1020. As previously discussed, opening 1024 can be closed using various embodiments of a structural closure or effectively sealed using various embodiments of a dynamic closure. Handler 3830 can retrieve a replacement part from auxiliary enclosure 1020, and insert it into printhead assembly 2500 of printing system 2002 to complete the replacement process. As soon as the replacement part has been inserted into printhead assembly 2500 and handler 3830 is within auxiliary enclosure 1020, gate 1024 can be closed, so that printing system enclosure 1102 is isolated from auxiliary enclosure 1020. At any time after the replacement procedure has been completed, handler 3830 can position the removed part to a location exterior to auxiliary enclosure 1010 through opening 1022 and an additional functional part, either a replacement printhead or a replacement printhead device, can be placed into auxiliary enclosure 1020 for a subsequent printhead exchange procedure.

Moreover, for various embodiments of gas enclosure system 506 of FIG. 30A and FIG. 30B, auxiliary enclosure 1010 can be used to store and transfer various parts for subsystems and modules of various embodiments of a printhead management system of the present teachings. Various replacement parts for printhead management system 2700, for example, but not limited by, a blotter paper cartridge, an ink cartridge, a waste reservoir, a printhead and a printhead device, that are stored in auxiliary enclosure 1020 can be accessed by handler 3830 and moved to printhead management system 2700 through gate 1024 while opening 1022 can be closed using various embodiments of a structural enclosure or effectively sealed using various embodiments of a dynamic closure to maintain gas enclosure system 507 in an inert environment. Conversely, parts needing replacement can be removed from printhead management system 2700 by handler 3830 through gate 1024 while opening 1022 is closed using various embodiments of a structural enclosure or effectively sealed using various embodiments of a dynamic closure and placed in auxiliary enclosure 1020. In a subsequent step, while gate 1024 is closed, retrieval or removed parts from auxiliary enclosure 3550 as well as transfer of replacement parts to auxiliary enclosure 3550 can be done by a handler or end-user located in ambient air at the exterior of gas enclosure system 506 of FIG. 30A and FIG. 30B. All steps associated with a printhead management procedure can be done to eliminate or minimize the exposure of a printing system enclosure to contamination, such as air and water vapor and various organic vapors, as well as particulate contamination. According to various systems and methods of the present teachings, a printing system enclosure may be introduced to a level of contamination that is sufficiently low that a purification system can remove the contamination before it can affect a printing process. In that regard, various embodiments of gas enclosure system 507 of FIG. 30A and FIG. 30B can provide for fully automated replacement of a part in a printhead management system while maintaining an inert, particle-free environment and with little or no interruption of a printing process.

In FIG. 30C, for various embodiments of a printhead replacement procedure as described for FIG. 30A and FIG. 30B, an end-user can remotely perform through the manipulations recited as being performed by a handler remotely through various gloveports. Though two gloveport are shown in FIG. 30C, it can be appreciated that gloveports can be placed in several places for the purpose of providing remote access to various locations, for example, as previously shown in FIG. 1 for gas enclosure assembly 100 and as shown in FIG. 24B.

All publications, patents, and patent applications mentioned in this specification are herein incorporated by reference to the same extent as if each individual publication, patent, or patent application was specifically and individually indicated to be incorporated by reference.

While embodiments of the present disclosure have been shown and described herein, it will be obvious to those skilled in the art that such embodiments are provided by way of example only. Numerous variations, changes, and substitutions will now occur to those skilled in the art without departing from the disclosure. It should be understood that various alternatives to the embodiments of the disclosure described herein may be employed in practicing the disclosure. It is intended that the following claims define the scope of the disclosure and that methods and structures within the scope of these claims and their equivalents be covered thereby.

What is claimed is:
1. A gas enclosure system comprising:
   a gas enclosure comprising:
      a printing system enclosure defining a first volume, the printing system enclosure being operably coupled to an environmental control system, the environment control system being configured to provide a controlled processing environment for the first volume;
      an auxiliary enclosure defining a second volume, the auxiliary enclosure being operably coupled to the environmental control system, the environmental control system being configured to provide a controlled processing environment for the second volume;
      wherein the gas enclosure has a first sealable opening allowing access between the printing system enclosure and the auxiliary enclosure and a second seal- able opening allowing access to the auxiliary enclosure from the exterior of the gas enclosure;
an industrial printing system housed within the printing system enclosure comprising:
a printhead assembly comprising at least one printhead device;
a substrate support apparatus for supporting a substrate; and
a motion system for the relative positioning of the printhead assembly with respect to the substrate; and
a handler located in the gas enclosure, wherein the location of the handler is proximal the first opening to enable the handler to perform operations requiring movement between the printing system enclosure and the auxiliary enclosure; and
a printhead management system housed within the auxiliary enclosure.

2. The gas enclosure system of claim 1, wherein the controlled processing environment of the first volume of the printing system comprises a gas environment maintained as an inert gas environment.

3. The gas enclosure system of claim 2, wherein the inert gas environment of the first volume is maintained using gases selected from nitrogen, any of the noble gases, and combinations thereof.

4. The gas enclosure system of claim 2, wherein the inert gas environment contained in the interior of the printing system enclosure comprises water and oxygen each at levels of 100 ppm or less.

5. The gas enclosure system of claim 2, wherein the inert gas environment contained in the interior of the printing system enclosure comprises water and oxygen each at levels of 1 ppm or less.

6. The gas enclosure system of claim 1, wherein the second volume of the auxiliary enclosure is between about 1% to about 10% of the total volume of the gas enclosure.

7. The gas enclosure system of claim 1, wherein the handler has an end effector.

8. The gas enclosure system of claim 7, wherein the end effector is selected from a blade-type end effector, a gripper-type end effector and a clamp-type effector.

9. The gas enclosure system of claim 1, wherein the handler is located in the printing system enclosure defining the first volume.

10. The gas enclosure system of claim 1, wherein the handler is located in the auxiliary enclosure defining a second volume.

11. The gas enclosure system of claim 1, wherein the auxiliary enclosure defining a second volume is constructed as a section of the gas enclosure.

12. The gas enclosure system of 1, wherein the auxiliary enclosure defining a second volume is an adaptable controlled-environment enclosure.

13. The gas enclosure system of claim 12, wherein the adaptable controlled-environment enclosure is readily movable.

14. The gas enclosure system of claim 1, wherein the auxiliary enclosure defining a second volume is a transfer chamber.

15. The gas enclosure system of claim 1, wherein the auxiliary enclosure is a load lock chamber.

16. The gas enclosure system of claim 1, wherein the substrate support apparatus can support a substrate having a size of between about generation 3.5 to about generation 10.

17. The gas enclosure system of claim 1, wherein the substrate support apparatus can support a substrate having a size of between about generation 5 to about generation 8.5.

18. The gas enclosure system of claim 1, wherein the substrate support apparatus is a floatation table.

19. The gas enclosure system of claim 1, wherein the environmental control system is configured to provide a controlled processing environment of the second volume that differs from an environment exterior to the gas enclosure system.

20. The gas enclosure system of claim 1, wherein the environmental control system is configured to provide a different controlled processing environment for the second volume of the auxiliary enclosure than the controlled processing environment of the first volume of the printing system enclosure.

21. The gas enclosure system of claim 1, wherein the environmental control system is configured to provide the same controlled processing environment for the second volume of the auxiliary enclosure as provided for the controlled processing environment of the first volume of the printing system enclosure.

* * * * *